US010310348B2

(12) United States Patent
Yamazaki et al.

(10) Patent No.: US 10,310,348 B2
(45) Date of Patent: *Jun. 4, 2019

(54) LIQUID CRYSTAL DISPLAY DEVICE AND ELECTRONIC APPARATUS HAVING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP); Hiroyuki Miyake, Kanagawa (JP); Masashi Tsubuku, Kanagawa (JP); Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,886

(22) Filed: Aug. 23, 2018

(65) Prior Publication Data

US 2018/0364510 A1    Dec. 20, 2018

Related U.S. Application Data

(63) Continuation of application No. 12/904,634, filed on Oct. 14, 2010, now Pat. No. 10,061,172.

(30) Foreign Application Priority Data

Oct. 16, 2009    (JP) .................................. 2009-238916
Dec. 1, 2009    (JP) .................................. 2009-273913
Dec. 8, 2009    (JP) .................................. 2009-278999

(51) Int. Cl.
*G09G 3/36* (2006.01)
*G02F 1/1368* (2006.01)
(Continued)

(52) U.S. Cl.
CPC ......... *G02F 1/1368* (2013.01); *G09G 3/3611* (2013.01); *G09G 3/3674* (2013.01);
(Continued)

(58) Field of Classification Search
CPC .. G02F 1/1368; G09G 3/3611; G09G 3/3677; G09G 3/3674; G09G 2310/0286;
(Continued)

(56) References Cited

U.S. PATENT DOCUMENTS 5,091,334 A    2/1992 Yamazaki et al.
5,107,354 A    4/1992 Yamazaki et al.
(Continued)

FOREIGN PATENT DOCUMENTS

CN    001901168 A    1/2007
CN    101309863 A    11/2008
(Continued)

OTHER PUBLICATIONS

Tsuda.K et al., "Ultra Low Power Consumption Technologies for Mobile TFT-LCDs ", IDW '02 : Proceedings of the 9th International Display Workshops, Dec. 4, 2002, pp. 295-298.
(Continued)

*Primary Examiner* — Jonathan A Boyd
(74) *Attorney, Agent, or Firm* — Fish & Richardson P.C.

(57) ABSTRACT

A liquid crystal display device includes: a driver circuit portion; a pixel portion; a signal generation circuit for generating a control signal for driving the driver circuit portion and an image signal which is supplied to the pixel portion; a memory circuit; a comparison circuit for detecting a difference of image signals for a series of frame periods among image signals stored for respective frame periods in the memory circuit; a selection circuit which selects and outputs the image signals for the series of frame periods when the difference is detected in the comparison circuit;
(Continued)

and a display control circuit which supplies the control signal and the image signals output from the selection circuit, to the driver circuit portion when the difference is detected in the comparison circuit, and stops supplying the control signal to the driver circuit portion when the difference is not detected in the comparison circuit.

8 Claims, 34 Drawing Sheets

(51) Int. Cl.
    *H01L 27/12*     (2006.01)
    *H01L 29/786*     (2006.01)
    *G09G 5/18*     (2006.01)

(52) U.S. Cl.
    CPC ....... *G09G 3/3677* (2013.01); *H01L 27/1225* (2013.01); *H01L 29/7869* (2013.01); *G09G 3/3648* (2013.01); *G09G 5/18* (2013.01); *G09G 2310/0286* (2013.01); *G09G 2320/103* (2013.01); *G09G 2330/021* (2013.01); *G09G 2330/022* (2013.01); *G09G 2330/027* (2013.01)

(58) Field of Classification Search
    CPC .. G09G 3/3648; G09G 5/18; G09G 2330/027; G09G 2320/103; G09G 2330/021; G09G 2330/022; H01L 27/1225; H01L 29/7869
    See application file for complete search history.

(56) References Cited

U.S. PATENT DOCUMENTS

| | | |
|---|---|---|
| 5,181,131 A | 1/1993 | Yamazaki et al. |
| 5,262,350 A | 11/1993 | Yamazaki et al. |
| 5,262,654 A | 11/1993 | Yamazaki |
| 5,289,030 A | 2/1994 | Yamazaki et al. |
| 5,453,858 A | 9/1995 | Yamazaki |
| 5,534,884 A | 7/1996 | Mase et al. |
| 5,591,987 A | 1/1997 | Yamazaki et al. |
| 5,731,856 A | 3/1998 | Kim et al. |
| 5,744,864 A | 4/1998 | Cillessen et al. |
| 5,764,225 A | 6/1998 | Koshobu |
| 5,767,832 A | 6/1998 | Koyama et al. |
| 5,849,601 A | 12/1998 | Yamazaki |
| 5,859,443 A | 1/1999 | Yamazaki et al. |
| 5,889,291 A | 3/1999 | Koyama et al. |
| 5,949,397 A | 9/1999 | Koyama et al. |
| 5,977,940 A | 11/1999 | Akiyama et al. |
| 5,982,471 A | 11/1999 | Hirakata et al. |
| 6,169,532 B1 | 1/2001 | Sumi et al. |
| 6,252,572 B1 | 6/2001 | Kurumisawa et al. |
| 6,288,487 B1 | 9/2001 | Arai |
| 6,294,274 B1 | 9/2001 | Kawazoe et al. |
| 6,295,047 B1 | 9/2001 | Koyama et al. |
| 6,310,600 B1 | 10/2001 | Koyama et al. |
| 6,355,941 B1 | 3/2002 | Yamazaki et al. |
| 6,417,830 B1 | 7/2002 | Byeon, II |
| 6,476,791 B2 | 11/2002 | Koyama et al. |
| 6,480,181 B2 | 11/2002 | Ishii |
| 6,563,174 B2 | 5/2003 | Kawasaki et al. |
| 6,580,423 B1 | 6/2003 | Murade |
| 6,614,418 B2 | 9/2003 | Koyama et al. |
| 6,727,522 B1 | 4/2004 | Kawasaki et al. |
| 6,747,627 B1 | 6/2004 | Koyama et al. |
| 6,774,419 B2 | 8/2004 | Kimura |
| 6,795,066 B2 | 9/2004 | Tanaka et al. |
| 6,943,766 B2 | 9/2005 | Nakamura et al. |
| 6,953,951 B2 | 10/2005 | Yamazaki et al. |
| 7,049,190 B2 | 5/2006 | Takeda et al. |
| 7,053,874 B2 | 5/2006 | Koyama |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,109,961 B2 | 9/2006 | Osame |
| 7,126,595 B2 | 10/2006 | Yanagi et al. |
| 7,148,886 B2 | 12/2006 | Nakajima |
| 7,190,338 B2 | 3/2007 | Kubota et al. |
| 7,205,989 B2 | 4/2007 | Nakajima |
| 7,211,825 B2 | 5/2007 | Shih et al. |
| 7,282,782 B2 | 10/2007 | Hoffman et al. |
| 7,286,108 B2 | 10/2007 | Tsuda et al. |
| 7,291,967 B2 | 11/2007 | Sakata et al. |
| 7,297,977 B2 | 11/2007 | Hoffman et al. |
| 7,321,353 B2 | 1/2008 | Tsuda et al. |
| 7,323,356 B2 | 1/2008 | Hosono et al. |
| 7,336,273 B2 | 2/2008 | Nakajima |
| 7,339,570 B2 | 3/2008 | Kubota et al. |
| 7,362,295 B2 | 4/2008 | Park et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,477,216 B2 | 1/2009 | Koyama et al. |
| 7,501,293 B2 | 3/2009 | Ito et al. |
| 7,511,709 B2 | 3/2009 | Koyama et al. |
| 7,528,828 B2 | 5/2009 | Nakajima |
| 7,537,976 B2 | 5/2009 | Hirose |
| 7,616,179 B2 | 11/2009 | Nakagawa et al. |
| 7,674,650 B2 | 3/2010 | Akimoto et al. |
| 7,732,819 B2 | 6/2010 | Akimoto et al. |
| 7,737,438 B2 | 6/2010 | Endo et al. |
| 7,749,825 B2 | 7/2010 | Honda |
| 7,791,072 B2 | 9/2010 | Kumomi et al. |
| 7,791,074 B2 | 9/2010 | Iwasaki |
| 7,807,515 B2 | 10/2010 | Kato et al. |
| 7,906,777 B2 | 3/2011 | Yano et al. |
| 7,910,490 B2 | 3/2011 | Akimoto et al. |
| 7,923,723 B2 | 4/2011 | Hayashi et al. |
| 7,924,276 B2 | 4/2011 | Tsuda et al. |
| 7,932,521 B2 | 4/2011 | Akimoto et al. |
| 7,977,169 B2 | 7/2011 | Hirao et al. |
| 7,978,277 B2 | 7/2011 | Kimura |
| 7,998,372 B2 | 8/2011 | Yano et al. |
| 8,003,981 B2 | 8/2011 | Iwasaki et al. |
| 8,008,658 B2 | 8/2011 | Park et al. |
| 8,084,331 B2 | 12/2011 | Ofuji et al. |
| 8,120,721 B2 | 2/2012 | Kimura |
| 8,129,714 B2 | 3/2012 | Yano et al. |
| 8,143,115 B2 | 3/2012 | Omura et al. |
| 8,148,721 B2 | 4/2012 | Hayashi et al. |
| 8,164,256 B2 | 4/2012 | Sano et al. |
| 8,178,926 B2 | 5/2012 | Nakayama |
| 8,202,365 B2 | 6/2012 | Umeda et al. |
| 8,217,877 B2 | 7/2012 | Fukutome |
| 8,222,098 B2 | 7/2012 | Honda |
| 8,247,266 B2 | 8/2012 | Park et al. |
| 8,253,911 B2 | 8/2012 | Kimura |
| 8,274,077 B2 | 9/2012 | Akimoto et al. |
| 8,274,078 B2 | 9/2012 | Itagaki et al. |
| 8,309,961 B2 | 11/2012 | Yamazaki et al. |
| 8,384,076 B2 | 2/2013 | Park et al. |
| 8,395,718 B2 | 3/2013 | Kimura |
| 8,466,463 B2 | 6/2013 | Akimoto et al. |
| 8,530,246 B2 | 9/2013 | Ofuji et al. |
| 8,541,944 B2 | 9/2013 | Sano et al. |
| 8,610,652 B2 | 12/2013 | Lee et al. |
| 8,629,069 B2 | 1/2014 | Akimoto et al. |
| 8,669,550 B2 | 3/2014 | Akimoto et al. |
| 8,711,314 B2 | 4/2014 | Kimura |
| 8,767,159 B2 | 7/2014 | Kimura |
| 8,785,240 B2 | 7/2014 | Watanabe |
| 8,785,990 B2 | 7/2014 | Honda |
| 8,790,959 B2 | 7/2014 | Akimoto et al. |
| 8,796,069 B2 | 8/2014 | Akimoto et al. |
| 8,900,916 B2 | 12/2014 | Yamazaki et al. |
| 9,099,562 B2 | 8/2015 | Akimoto et al. |
| 9,312,393 B2 | 4/2016 | Honda |
| 9,323,124 B2 | 4/2016 | Lee et al. |

(56) References Cited

U.S. PATENT DOCUMENTS

| | | |
|---|---|---|
| 9,341,908 B2 | 5/2016 | Kimura |
| 9,406,808 B2 | 8/2016 | Yamazaki et al. |
| 9,857,624 B2 | 1/2018 | Zhang et al. |
| 2001/0046027 A1 | 11/2001 | Tai et al. |
| 2002/0056838 A1 | 5/2002 | Ogawa |
| 2002/0093473 A1 | 7/2002 | Tanaka et al. |
| 2002/0132454 A1 | 9/2002 | Ohtsu et al. |
| 2003/0063078 A1 | 4/2003 | Hanari et al. |
| 2003/0098860 A1 | 5/2003 | Nakamura et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0127380 A1 | 6/2005 | Kawasaki et al. |
| 2005/0140632 A1 | 6/2005 | Tsuda et al. |
| 2005/0199959 A1 | 9/2005 | Chiang et al. |
| 2005/0231456 A1 | 10/2005 | Nakamura et al. |
| 2006/0035452 A1 | 2/2006 | Carcia et al. |
| 2006/0043377 A1 | 3/2006 | Hoffman et al. |
| 2006/0043380 A1 | 3/2006 | Kawazoe et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267889 A1 | 11/2006 | Kimura |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0141789 A1 | 6/2007 | Kiesel et al. |
| 2007/0146354 A1 | 6/2007 | Kubota et al. |
| 2007/0152217 A1 | 7/2007 | Lai et al. |
| 2007/0172591 A1 | 7/2007 | Seo et al. |
| 2007/0182700 A1 | 8/2007 | Baba et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0259466 A1 | 11/2007 | Sakata et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0055218 A1 | 3/2008 | Tsuda et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0198107 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284929 A1 | 11/2008 | Kimura |
| 2008/0284970 A1 | 11/2008 | Ishitani |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1 | 2/2009 | Iwasaki |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0121998 A1 | 5/2009 | Ohkawa et al. |
| 2009/0134389 A1 | 5/2009 | Matsunaga |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0194766 A1 | 8/2009 | Park et al. |
| 2009/0219295 A1 | 9/2009 | Reijnaerts |
| 2009/0239335 A1 | 9/2009 | Akimoto et al. |
| 2009/0261325 A1 | 10/2009 | Kawamura et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0045179 A1 | 2/2010 | Sano et al. |
| 2010/0065844 A1 | 3/2010 | Tokunaga |
| 2010/0066724 A1 | 3/2010 | Huh et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0244185 A1 | 9/2010 | Takafuji et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0063262 A1 | 3/2011 | Umezaki et al. |
| 2011/0090183 A1 | 4/2011 | Yamazaki et al. |
| 2011/0102696 A1 | 5/2011 | Yamazaki et al. |
| 2011/0104851 A1 | 5/2011 | Akimoto et al. |
| 2011/0115839 A1 | 5/2011 | Takahashi et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2012/0168750 A1 | 7/2012 | Hayashi et al. |
| 2015/0072470 A1 | 3/2015 | Yamazaki et al. |
| 2015/0084048 A1 | 3/2015 | Hayashi et al. |
| 2015/0340513 A1 | 11/2015 | Akimoto et al. |
| 2016/0336456 A1 | 11/2016 | Yamazaki et al. |
| 2016/0357045 A1 | 12/2016 | Kimura |
| 2017/0235197 A1 | 8/2017 | Kimura |
| 2018/0210251 A1 | 7/2018 | Kimura |

FOREIGN PATENT DOCUMENTS

| | | |
|---|---|---|
| CN | 101405869 A | 4/2009 |
| CN | 101582453 A | 11/2009 |
| CN | 104765184 A | 7/2015 |
| EP | 1296174 A | 3/2003 |
| EP | 1304791 A | 4/2003 |
| EP | 1737044 A | 12/2006 |
| EP | 1770788 A | 4/2007 |
| EP | 1816637 A | 8/2007 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2020686 A | 2/2009 |
| EP | 2120267 A | 11/2009 |

(56) References Cited

FOREIGN PATENT DOCUMENTS

| | | |
|---|---|---|
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-238073 A | 9/1989 |
| JP | 05-251705 A | 9/1993 |
| JP | 06-268220 A | 9/1994 |
| JP | 07-297406 A | 11/1995 |
| JP | 08-264794 A | 10/1996 |
| JP | 10-010489 A | 1/1998 |
| JP | 11-052340 A | 2/1999 |
| JP | 11-505377 | 5/1999 |
| JP | 2000-044236 A | 2/2000 |
| JP | 2000-150900 A | 5/2000 |
| JP | 2001-312253 A | 11/2001 |
| JP | 2002-014320 A | 1/2002 |
| JP | 2002-032048 A | 1/2002 |
| JP | 2002-076356 A | 3/2002 |
| JP | 2002-140036 A | 5/2002 |
| JP | 2002-140052 A | 5/2002 |
| JP | 2002-175049 A | 6/2002 |
| JP | 2002-182619 A | 6/2002 |
| JP | 2002-207462 A | 7/2002 |
| JP | 2002-278523 A | 9/2002 |
| JP | 2002-289859 A | 10/2002 |
| JP | 2003-086000 A | 3/2003 |
| JP | 2003-086808 A | 3/2003 |
| JP | 2003-208111 A | 7/2003 |
| JP | 2003-249656 A | 9/2003 |
| JP | 2003-344823 A | 12/2003 |
| JP | 2004-103957 A | 4/2004 |
| JP | 2004-272270 A | 9/2004 |
| JP | 2004-273614 A | 9/2004 |
| JP | 2004-273732 A | 9/2004 |
| JP | 2005-167164 A | 6/2005 |
| JP | 2005-190797 A | 7/2005 |
| JP | 2006-024610 A | 1/2006 |
| JP | 2006-084758 A | 3/2006 |
| JP | 3766926 | 4/2006 |
| JP | 2006-165528 A | 6/2006 |
| JP | 2006-352087 A | 12/2006 |
| JP | 2007-103918 A | 4/2007 |
| JP | 2007-123861 A | 5/2007 |
| JP | 2007-134687 A | 5/2007 |
| JP | 2007-142195 A | 6/2007 |
| JP | 2007-206651 A | 8/2007 |
| JP | 2007-271971 A | 10/2007 |
| JP | 2008-033066 A | 2/2008 |
| JP | 2008-065225 A | 3/2008 |
| JP | 2008-141119 A | 6/2008 |
| JP | 2008-533693 | 8/2008 |
| JP | 2008-216529 A | 9/2008 |
| JP | 2008-281988 A | 11/2008 |
| JP | 2008-287032 A | 11/2008 |
| JP | 2008-287115 A | 11/2008 |
| JP | 2009-021612 A | 1/2009 |
| JP | 2009-031595 A | 2/2009 |
| JP | 2009-116324 A | 5/2009 |
| JP | 2009-175704 A | 8/2009 |
| JP | 2009-212497 A | 9/2009 |
| JP | 2009-224479 A | 10/2009 |
| JP | 2009-229217 A | 10/2009 |
| JP | 2010-177431 A | 8/2010 |
| JP | 2011-100997 A | 5/2011 |
| JP | 6118940 | 4/2017 |
| JP | 6379259 | 8/2018 |
| KR | 2003-0043774 A | 6/2003 |
| KR | 2009-0085738 A | 8/2009 |
| TW | 558707 | 10/2003 |
| WO | WO-2004/114391 | 12/2004 |
| WO | WO-2007/029844 | 3/2007 |
| WO | WO-2007/043493 | 4/2007 |
| WO | WO-2007/094501 | 8/2007 |
| WO | WO-2007/108293 | 9/2007 |
| WO | WO-2007/139009 | 12/2007 |
| WO | WO-2008/069056 | 6/2008 |
| WO | WO-2008/069255 | 6/2008 |
| WO | WO-2008/069286 | 6/2008 |
| WO | WO-2008/126879 | 10/2008 |
| WO | WO-2008/133345 | 11/2008 |
| WO | WO-2009/051050 | 4/2009 |
| WO | WO-2011/004724 | 1/2011 |
| WO | WO-2011/043203 | 4/2011 |

OTHER PUBLICATIONS

International Search Report (Application No. PCT/JP2010/067319) dated Dec. 21, 2010.

Written Opinion (Application No. PCT/JP2010/067319) dated Dec. 21, 2010.

European Search Report (Application No. 10823300.8) dated Jun. 18, 2013.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262016-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emissin AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physcis Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08: Proceedings of the 15th Internatioanl Display Workshops, Dec. 3, 2008, pp. 1637-1640.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakamura.M et al., "Syntheses and crystal structures of new homologous compounds, indium iron zinc oxides (InFeO3(ZnO)m) (m natural number) and releated compounds", Kotai Butsuri (Solid State Physics), 1993, vol. 28, No. 5, pp. 317-327.

Chinese Office Action (Application No. 201080046963.5) dated Jun. 12, 2014.

European Office Action (Application No. 10823300.8) dated Aug. 18, 2015.

Chinese Office Action (Application No. 201080046963.5) dated Aug. 4, 2015.

European Official Communication (Application No. 10823300.8) dated May 13, 2016.

Korean Office Action (Application No. 2012-7011035) dated Sep. 30, 2016.

Korean Office Action (Application No. 2012-7011035) dated May 30, 2017.

Hwang.C et al., "Effects of Active Thickness in Oxide Semiconductor TFTs", SID Digest '09: SID International Symposium Digest of Technical Papers, May 31, 2009, vol. 40, pp. 1107-1109.

European Search Report (Application No. 17173363.7) dated Sep. 29, 2017.

Godo.H et al., "Temperature Dependence of Transistor Characteristics and Electronic Structure for Amorphous In—Ga—Zn-Oxide Thin Film Tansistor", Jpn. J. Appl. Phys. (Japanese Journal of Applied Physics), Mar. 1, 2010, vol. 49, No. 3, pp. 03CB04-1-03CB04-6.

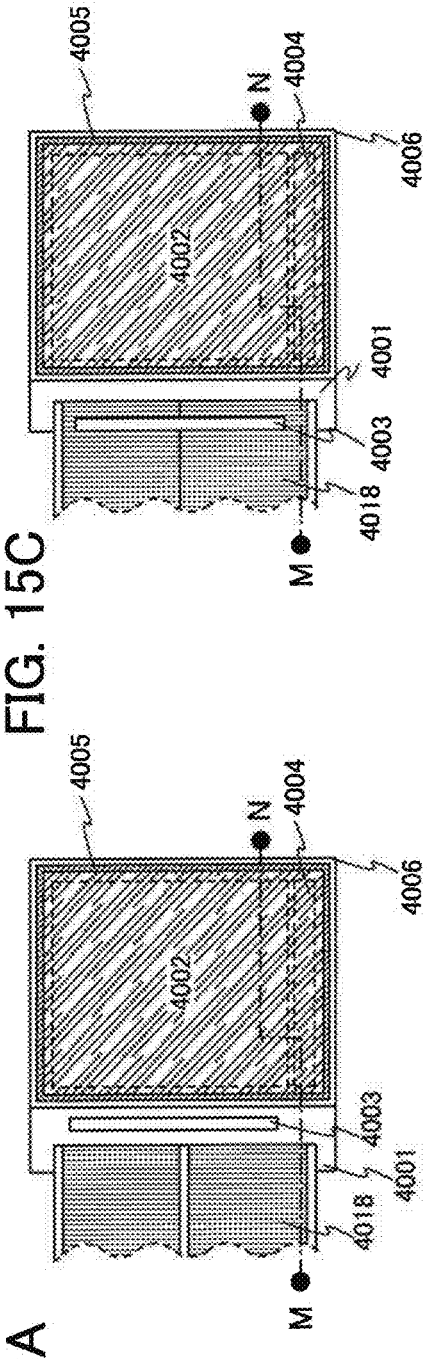
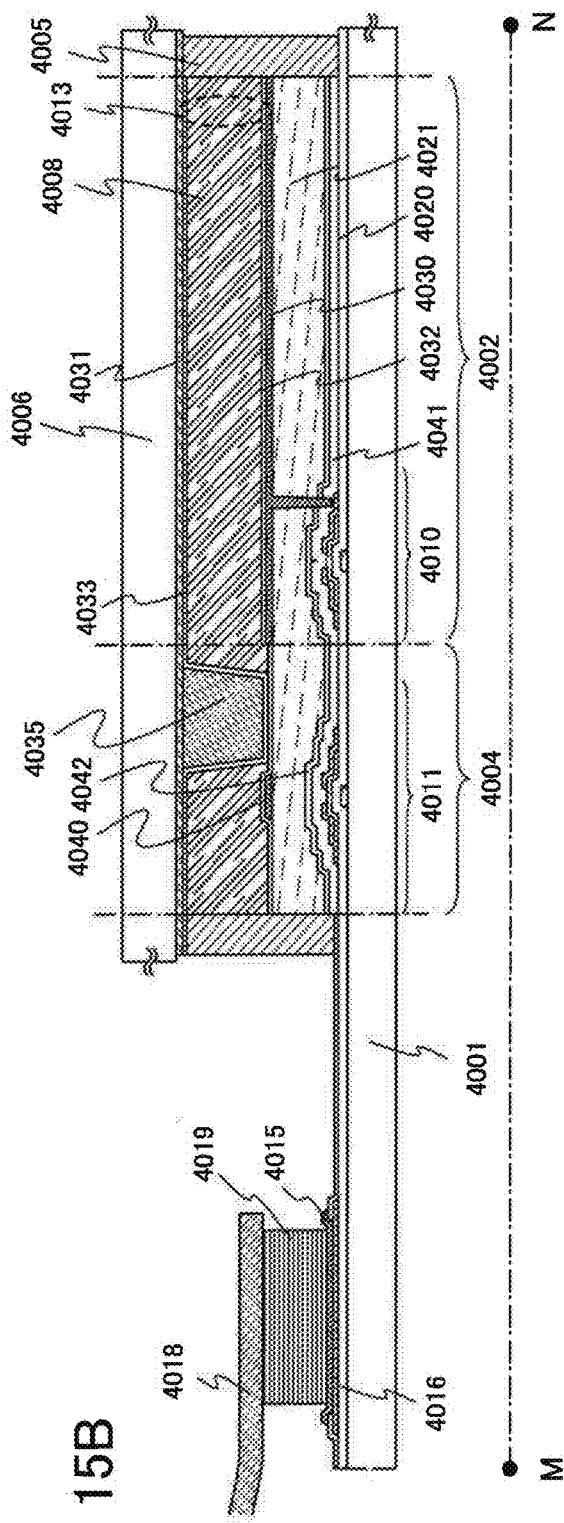

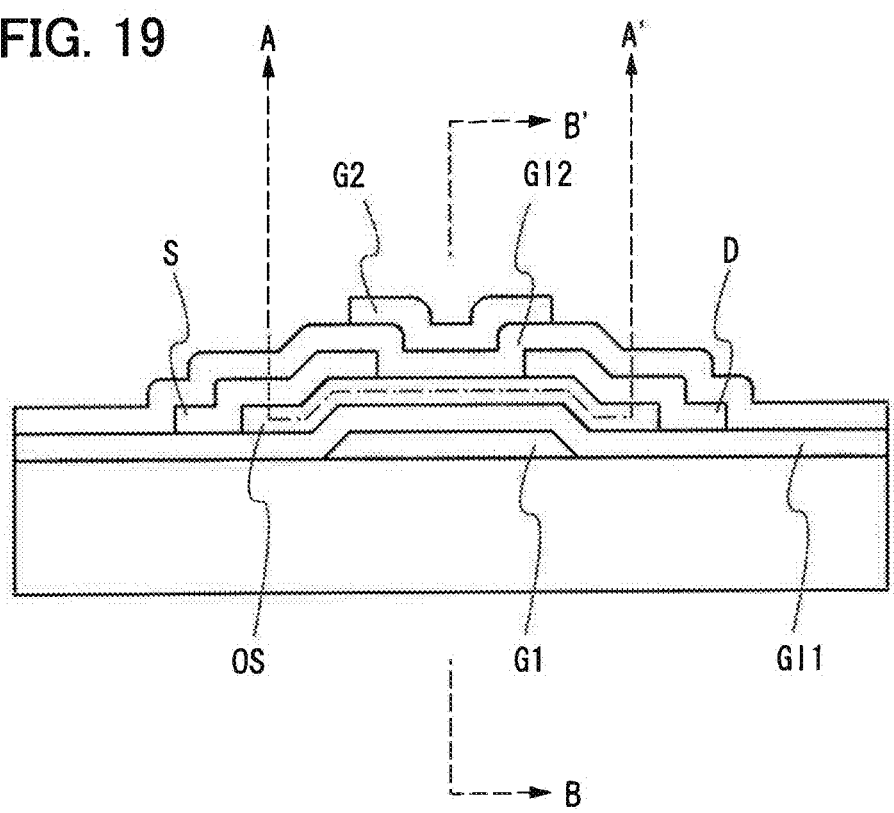

LIQUID CRYSTAL DISPLAY DEVICE AND ELECTRONIC APPARATUS HAVING THE SAME

CROSS-REFERENCE TO RELATED APPLICATIONS

This application is a continuation of U.S. application Ser. No. 12/904,634, filed Oct. 14, 2010, now allowed, which claims the benefit of foreign priority applications filed in Japan as Serial No. 2009-238916 on Oct. 16, 2009, Serial No. 2009-273913 on Dec. 1, 2009, and Serial No. 2009-278999 on Dec. 8, 2009, all of which are incorporated by reference.

TECHNICAL FIELD

The present invention relates to liquid crystal display devices. The present invention relates to electronic apparatuses having the liquid crystal display devices.

BACKGROUND ART

Thin film transistors formed over a flat plate such as a glass substrate have been manufactured using amorphous silicon, polycrystalline silicon, or the like, as typically seen in liquid crystal display devices. Thin film transistors manufactured using amorphous silicon have low field effect mobility but can be formed over a large glass substrate. On the other hand, thin film transistors manufactured using crystalline silicon have high field effect mobility, but due to a crystallization step such as laser annealing, such a transistor is not necessarily suitable for being formed over a large glass substrate.

In view of the foregoing, attention has been drawn to a technique by which a thin film transistor is manufactured using an oxide semiconductor, and such a transistor is applied to an electronic device or an optical device. For example, Patent Document 1 discloses a technique by which a thin film transistor is manufactured using zinc oxide or an In—Ga—Zn-0-based oxide semiconductor as an oxide semiconductor film, and such a transistor is used as, for example, a switching element of a liquid crystal display device.

REFERENCE

Patent Document 1: Japanese Published Patent Application No. 2006-165528

DISCLOSURE OF INVENTION

It is said that a thin film transistor in which an oxide semiconductor is used to form a channel region achieves higher field effect mobility than a thin film transistor in which amorphous silicon is used to form a channel region. A pixel including such a thin film transistor using an oxide semiconductor is expected to be applied to a display device such as a liquid crystal display device.

Each pixel included in a liquid crystal display device is provided with a storage capacitor in which a voltage for controlling the orientation of a liquid crystal element is held. Off-leakage current (hereinafter referred to as off-state current) of a thin film transistor is one factor by which the amount of the holding capacitance is determined. Reduction of the off-state current which leads to increase of the period for holding a voltage in the storage capacitor is important for reduction of power consumption when a still image or the like is displayed.

Further, it is important for the enhancement of the added value of a display device to manufacture the display device such that a moving image can be displayed in addition to low power consumption when a still image or the like is displayed. Therefore, it is important that whether an image is a still image or a moving image is determined and display is performed by switching between a still image and a moving image so that power consumption is further reduced by reducing the power consumption when a still image is displayed.

Note that in this specification, off-state current is current which flows between a source and a drain when a thin film transistor is in an off state (also called a non-conductive state). In the case of an n-channel thin film transistor (for example, with a threshold voltage of about 0 V to 2 V), the off-state current means a current which flows between a source and a drain when a negative voltage is applied between a gate and the source.

Further, in a liquid crystal display device with higher value added, such as a 3D display or a 4k2k display, the area per pixel is expected to be small and the aperture ratio needs to be improved. It is important to reduce the area of the storage capacitor in order to improve the aperture ratio. Accordingly, the off-state current of a thin film transistor needs to be decreased.

In view of the foregoing, it is an object of one embodiment of the present invention to provide a liquid crystal display device with power consumption reduced in which an off-state current of a thin film transistor using an oxide semiconductor is reduced in a pixel.

An embodiment of the present invention is a liquid crystal display device including: a display panel including a driver circuit portion and a pixel portion in which a transistor including a semiconductor layer using an oxide semiconductor is provided in each pixel; a signal generation circuit for generating a control signal for driving the driver circuit portion and an image signal which is supplied to the pixel portion; a memory circuit for storing the image signal for each frame period; a comparison circuit for detecting a difference of image signals for a series of frame periods among the image signals stored for respective frame periods in the memory circuit; a selection circuit which selects and outputs the image signals for the series of frame periods when the difference is detected in the comparison circuit; and a display control circuit which supplies the control signal and the image signals output from the selection circuit, to the driver circuit portion when the difference is detected in the comparison circuit, and stops supplying the control signal to the driver circuit portion when the difference is not detected in the comparison circuit.

The control signal in the liquid crystal display device may be any of a high power supply potential, a low power supply potential, a clock signal, a start pulse signal, and a reset signal.

The oxide semiconductor in the liquid crystal display device may have a hydrogen concentration of $1 \times 10^{16}/cm^3$ or less which is detected by secondary ion mass spectrometry.

The oxide semiconductor in the liquid crystal display device may have a carrier density which is less than $1 \times 10^{14}/cm^3$.

In accordance with the present invention, in a pixel including a thin film transistor using an oxide semiconductor, the off-state current can be reduced. Therefore, the period for holding voltage in a storage capacitor can be extended, so that a liquid crystal display device in which the power consumption when a still image or the like is displayed can be decreased can be provided. Further, the aperture ratio can be improved, so that a liquid crystal display device including a high-definition display portion can be provided.

Further, a display device which displays not only a still image but also a moving image can be provided, so that the added value of the display device can be enhanced. Whether an image is a still image or a moving image is determined, and display is performed by switching between a still image and a moving image, so that the power consumption when a still image is displayed can be reduced.

BRIEF DESCRIPTION OF DRAWINGS

FIGS. 15A to 15C illustrate a liquid crystal panel.

FIG. 19 is a diagram for describing Embodiment 13.

BEST MODE FOR CARRYING OUT THE INVENTION

Figure 1:
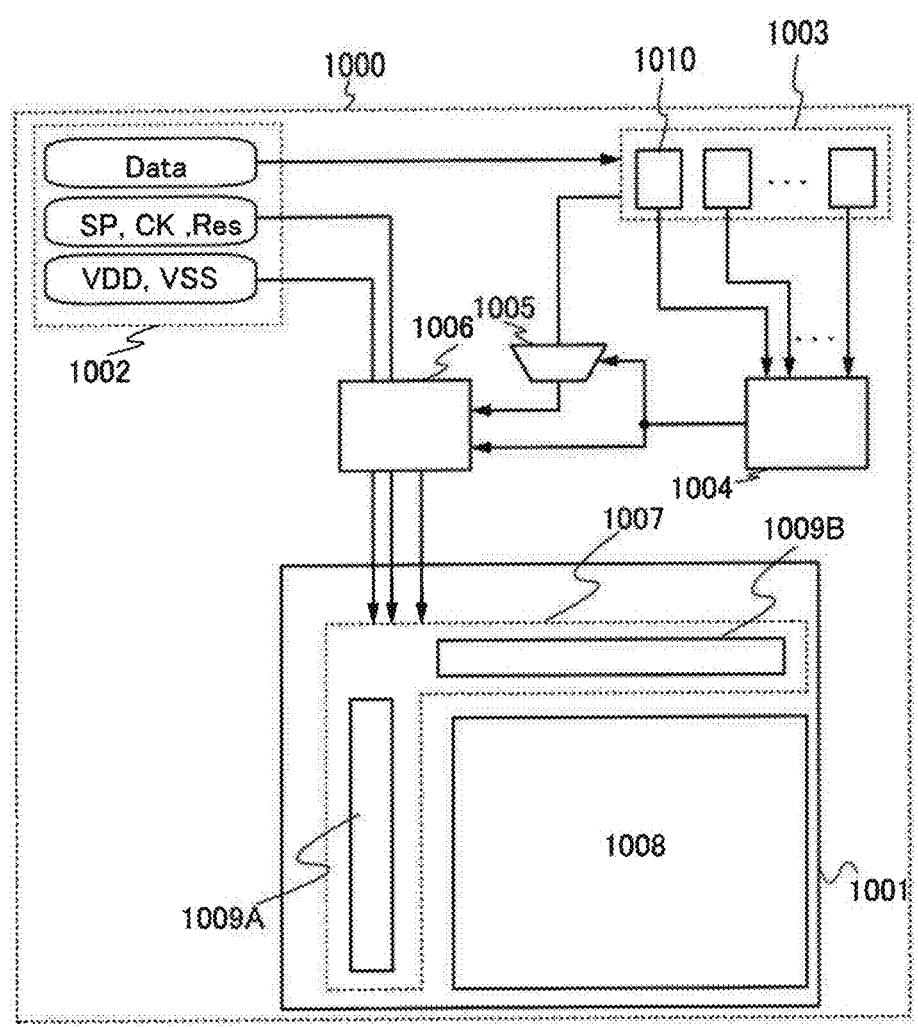
FIG. 1 is a diagram showing one example of a block diagram of a liquid crystal display device.

Hereinafter, embodiments and examples of the present invention will be described with reference to the accompanying drawings. However, it is easily understood by those skilled in the art that modes and details disclosed herein can be modified in various ways without departing from the spirit and scope of the present invention. Therefore, the present invention is not construed as being limited to description of the embodiments and examples. Note that in the structures of the present invention described below, the same portions are denoted by the same reference numerals throughout the drawings.

Note that the size, the thickness of a layer, or a region of each structure illustrated in the drawings or the like in the embodiments is exaggerated for simplicity in some cases. Therefore, embodiments of the present invention are not limited to such a scale.

In this specification, ordinal numbers such as "first", "second", and "third" are used in order to avoid confusion among components, and the terms do not limit the components numerically.

Embodiment 1

In this embodiment, a block diagram of a display device and a stop sequence and a start sequence of an operation in a driver circuit are described. First, a block diagram of a display device is described using FIG. 1.

A liquid crystal display device 1000 described in Embodiment 1 includes a display panel 1001, a signal generation circuit 1002, a memory circuit 1003, a comparison circuit 1004, a selection circuit 1005, and a display control circuit 1006.

The display panel 1001 includes, for example, a driver circuit portion 1007 and a pixel portion 1008. A gate line driver circuit 1009A and a signal line driver circuit 1009B are included, which are driver circuits for driving the pixel portion 1008 including a plurality of pixels. The gate line driver circuit 1009A, the signal line driver circuit 1009B, and the pixel portion 1008 may be formed using transistors formed over one substrate.

The gate line driver circuit 1009A, the signal line driver circuit 1009B, and the pixel portion 1008 can be formed using n-channel transistors in each of which a semiconductor layer is formed using an oxide semiconductor. The gate line driver circuit 1009A and/or the signal line driver circuit 1009B may be formed over the same substrate as the pixel portion or a different substrate.

As a display method in the pixel portion 1008, a progressive method, an interlace method or the like can be employed. Color components controlled in the pixel at the time of color display are not limited to three colors of R, G, and B (R, G, and B correspond to red, green, and blue, respectively); for example, R, G, B, and W (W corresponds to white), or R, G, B, and one or more of yellow, cyan, magenta, and the like can be employed. Further, the size of a display region may be different depending on respective dots of the color components. The present invention is not limited to the application to a display device for color display but can also be applied to a display device for monochrome display.

Next, an oxide semiconductor layer used as the semiconductor layer of the transistor included in any of the gate line driver circuit 1009A, the signal line driver circuit 1009B, and the pixel portion 1008 is described.

As for the oxide semiconductor used in this embodiment, hydrogen is contained at $1\times10^{16}/cm^3$ or less in the oxide semiconductor, and hydrogen or an contained in the oxide semiconductor is removed. An oxide semiconductor film has a carrier density which is less than $1\times10^{14}/cm^3$, preferably equal to or less than $1\times10^{12}/cm^3$, and is used to form a channel region of a thin film transistor. In this specification, an oxide semiconductor having a carrier density which is less than $1\times10^{12}/cm^3$ is called an intrinsic (I-type) oxide semiconductor, and an oxide semiconductor having a carrier density equal to or greater than $1\times10^{12}/cm^3$ but equal to or less than $1\times10^{14}/cm^3$ is called a substantially-intrinsic oxide semiconductor. In this specification, the concentration of hydrogen in the oxide semiconductor layer is measured by secondary ion mass spectrometry (SIMS).

The number of carriers caused by thermal excitation is negligible in the case where the bandgap of an oxide semiconductor is 2 eV or more, preferably 2.5 eV or more, far preferably 3 eV or more. Therefore, impurities such as hydrogen which may serve as a donor are reduced as much as possible so that the carrier density is less than $1\times10^{14}/cm^3$, preferably equal to or less than $1\times10^{12}/cm^3$. That is, the carrier density of the oxide semiconductor layer is reduced as much as possible to be extremely close to zero.

Such an oxide semiconductor which is highly purified by removing hydrogen from the oxide semiconductor as much as possible is used for the channel formation region of the thin film transistor, whereby the drain current is equal to or less than $1\times10^{-13}$ A at a drain voltage in the range of 1 V to 10 V and a gate voltage in the range of −5 V to −20 V even when the channel width is 10 mm.

In the case where a display device is manufactured using such a thin film transistor the off-state current of which is extremely small, the leakage current is reduced, so that a period for holding display data can be extended.

Specifically, in a transistor including the above-described oxide semiconductor layer with a channel width of 10 μm, the off-state current per micrometer of the channel width can be equal to or less than 10 aA/μm ($1\times10^{-17}$ A/μm), and further can be equal to or less than 1 aA/μm ($1\times10^{-18}$ A/μm). Such a transistor, whose off-state current is extremely small, is used as a transistor included in any of the gate line driver circuit 1009A, the signal line driver circuit 1009B, and the pixel portion 1008, whereby a holding time of an electrical signal such as a video signal can be increased. Since the holding time can be increased, for example, the holding time after the writing of a video signal is set to 10 seconds or more, preferably 30 seconds or more, far preferably one minute or more and less than ten minutes. By increasing the holding time, the interval between writing timings can be increased, so that power consumption can be further suppressed.

The resistance to flow of off-state current in a transistor can be referred to as the off-state resistivity. The off-state resistivity is the resistivity of a channel formation region when the transistor is off, which can be calculated from the off-state current.

Specifically, the resistance when the transistor is off (off-state resistance R) can be calculated using Ohm's law from the off-state current and the drain voltage, which leads to the off-state resistivity ρ which can be calculated using Formula, ρ=RA/L (R is the off-state resistance), from the cross-sectional area A of the channel formation region and the length L of the channel formation region (which corresponds to the distance between a source electrode and a drain electrode).

The cross-sectional area A can be calculated from A=dW where the thickness of the channel formation region is d and the channel width is W The length L of the channel formation region is the channel length L. In this manner, the off-state resistivity can be calculated from the off-state current.

The off-state resistivity of the transistor including the oxide semiconductor layer in this embodiment is preferably $1\times10^9$ Ω·m or more, far preferably $1\times10^{10}$ Ω·m or more.

On the other hand, for example, in the case of a transistor using low-temperature polysilicon, design or the like is performed assuming that the off-state current is about $1\times10^{-12}$ A/μm. Therefore, in the transistor including the oxide semiconductor, the holding period of the voltage can be extended to a period about $10^5$ times as long as that of the transistor using low-temperature poly silicon when the holding capacitances are equal to each other (about 0.1 pF). Further, in the case of a transistor using amorphous silicon, the off-state current per micrometer of the channel width is $1\times10^{-13}$ A/μm or more. Therefore, in the transistor including an oxide semiconductor with high purity, the holding period of the voltage can be extended to a period $10^4$ times or more as long as that of the transistor using amorphous silicon when the holding capacitances are equal to each other (about 0.1 pF).

For example, in the case of a pixel using the transistor using low-temperature polysilicon, image display is generally performed at 60 frames per second (for 16 msec per frame). The same can be applied to the case of still-image display, and this is because if the rate is decreased (the interval between writing timings is increased), the voltage of the pixel is decreased, which adversely affects the image display. On the other hand, in the case of using the above-described transistor including the oxide semiconductor layer, the holding period per signal writing can be extended to 1600 seconds which is about $10^5$ times as long as that of the transistor using low-temperature polysilicon since the off-state current is small.

In this manner, still image display can be performed on a display portion even by less frequent writing of image signals. Since the holding period can be extended, the frequency of performing writing of signals can be decreased particularly when a still image is displayed. For example, the number of times of signal writing in a display period of one still image can be one or n (n is greater than or equal to 2 and less than or equal to $10^3$). Thus, low power consumption of a display device can be achieved.

Generally, each pixel is provided with a storage capacitor formed by a pair of electrodes and an insulating layer provided as a dielectric between the pair of electrodes. The size of the storage capacitor can be set considering the off-state current of a transistor provided in each pixel, or the like. In this embodiment, since the transistor including a high-purity oxide semiconductor layer is used as the transistor provided in each pixel, a storage capacitor having capacitance which is less than or equal to ⅓, preferably less than or equal to ⅕ with respect to the liquid crystal capacitance of each pixel is sufficient to be provided.

Since the holding period can be long in the above-described transistor including the high-purity oxide semiconductor layer, the frequency of signal writing can be extremely decreased particularly when a still image is displayed. Therefore, the number of times of signal writing to pixels can be reduced in displaying, for example, a still image which involves less frequent switching of display, so that low power consumption can be achieved.

In displaying a still image, refresh operation can be performed as appropriate considering the holding rate of the voltage applied to a liquid crystal element during the holding period. For example, the refresh operation can be performed at the time when the voltage in the storage capacitor reaches a predetermined level with respect to a value (initial value) of a voltage which is just after the signal writing into a pixel electrode of the liquid crystal element. It is preferable to set the predetermined level of the voltage such that flicker is not sensed with respect to the initial value. Specifically, it is preferable to perform the refresh operation (rewriting) every time the voltage reaches a voltage which is less than the initial value by 10%, far preferably 3%.

In the holding period in displaying a still image, a counter electrode (also called a common electrode) can be made in the floating state. Specifically, a switch may be provided between a power source which supplies a common potential to the counter electrode and the counter electrode, the switch is turned on to supply the common potential from the power source to the counter electrode in a writing period, and then, the switch is turned off to make the counter electrode in the floating state in the holding period. It is preferable to use the transistor including the above-described high-purity oxide semiconductor layer as the switch.

The signal generation circuit 1002 is a circuit for generating a signal for driving the gate line driver circuit 1009A and a signal for driving the signal line driver circuit 1009B. The signal generation circuit 1002 is also a circuit for outputting a signal for driving the driver circuit portion 1007 through a wiring, and is a circuit for outputting an image signal (also called a video voltage, a video signal, or video data) to the memory circuit 1003 through a wiring. In other words, the signal generation circuit 1002 is a circuit for generating and outputting a control signal for controlling the driver circuit portion 1007 and an image signal to be supplied to the pixel portion 1008.

Specifically, the signal generation circuit 1002 supplies, as control signals, a high power supply potential VDD and a low power supply potential VSS to the gate line driver circuit 1009A and the signal line driver circuit 1009B, a start pulse SP and a clock pulse CK for the gate line driver circuit 1009A, and a start pulse SP and a clock pulse CK for the signal line driver circuit 1009B. Further, the signal generation circuit 1002 supplies an image signal Data for displaying a moving image or a still image to the memory circuit 1003.

The moving image refers to an image which is recognized as a moving image with human eyes by rapid switch of a plurality of images which are time-divided into a plurality of frames. Specifically, the moving image refers to a series of image signals which are recognized as a moving image with less flicker with human eyes by switching images at least 60 times (60 frames) per second. The still image refers to image signals which do not change in a series of frame periods, for example, in the n-th frame and (n+1)-th frame, unlike the moving image, though a plurality of images which are time-divided into a plurality of frame periods are switched rapidly.

The signal generation circuit 1002 may further generates another signal such as an image signal or a latch signal. The signal generation circuit 1002 may output a reset signal Res for stopping the output of the pulse signal of each driver circuit, to the gate line driver circuit 1009A and/or the signal line driver circuit 1009B. Each signal may include a plurality of signals such as a first clock signal and a second clock signal.

The high power supply potential VDD refers to a potential which is higher than a reference potential, and the low power supply potential VSS refers to a potential which is lower than or equal to the reference potential. It is preferable that the high power supply potential and the low power supply potential are potentials as high as potentials high enough for the transistor to operate.

The voltage refers to a potential difference between a given potential and a reference potential (e.g., a ground potential) in many cases. Accordingly, the voltage, the potential, and the potential difference can also be referred to as a potential, a voltage, and a voltage difference, respectively.

In the case where the image signal which is output from the signal generation circuit 1002 to the memory circuit 1003 is an analog signal, the analog signal may be converted into a digital signal through an A/D converter or the like to be output to the memory circuit 1003.

The memory circuit 1003 includes a plurality of frame memories 1010 for storing image signals for a plurality of frames. The frame memory may be formed using a memory element such as Dynamic Random Access Memory (DRAM) or Static Random Access Memory (SRAM).

The number of frame memories 1010 is not particularly limited as long as an image signal can be stored for each frame period. The image signals of the frame memories 1010 are selectively read out by the comparison circuit 1004 and the selection circuit 1005.

The comparison circuit 1004 is a circuit which selectively reads out image signals in a series of frame periods stored in the memory circuit 1003, compares the image signals, and detects a difference thereof. An image of the series of frame periods is determined as a moving image in the case where the difference is detected by the comparison of the image signals in the comparison circuit 1004, and is determined as a still image in the case where the difference is not detected by the comparison of the image signals in the comparison circuit 1004. That is, whether image signals in a series of frame periods are image signals for displaying a moving image or image signals for displaying a still image is determined by the detection of the difference in the comparison circuit 1004. The difference obtained by the comparison may be set so as to be determined as a difference to be detected when it is over a predetermined level.

The selection circuit 1005 includes a plurality of switches such as thin film transistors, and is a circuit which selects, when image signals for displaying a moving image are determined by the difference detection in the comparison circuit 1004, the image signals from the frame memories 1010 in which the image signals are stored, and outputs to the display control circuit 1006. When the difference of image signals between a series of frames compared in the comparison circuit 1004 is not detected, an image displayed in the series of frames is a still image, and in that case, the selection circuit 1005 may output no signal of the image signal of the latter frame to the display control circuit 1006.

The display control circuit 1006 is a circuit which switches supplying and stop of supplying of the image signal and the control signal such as the high power supply potential VDD, the low power supply potential VSS, the start pulse SP, the clock pulse CK, and the reset signal Res to the driver circuit portion 1007. Specifically, when an image is determined to be a moving image by the comparison circuit 1004, that is, a difference of image signals in a series of frames is detected, the image signals are supplied from the selection circuit 1005 to the driver circuit portion 1007 through the display control circuit 1006, and the control signals are supplied to the driver circuit portion 1007 through the display control circuit 1006. On the other hand, when an image is determined to be a still image by the comparison circuit 1004, that is, a difference of image signals in a series of frames is not detected, the image signal of the latter frame is not supplied from the selection circuit 1005, so that the image signal is not supplied to the driver circuit portion 1007 through the display control circuit 1006, and the display control circuit 1006 stops supplying the control signals to the driver circuit portion 1007.

Note that in the case where the still image is determined, when the period during which an image is assumed to be a still image is short, stop of supplying of the high power supply potential VDD and the low power supply potential VSS among the control signals is not necessarily performed. This is because an increase of the power consumption due to frequent stop and start of supplying of the high power supply potential VDD and the low power supply potential VSS can be reduced, which is preferable.

It is preferable that the stop of supplying of the image signals and the control signals is performed entirely in the period for holding an image signal in each pixel in the pixel portion 1008, and the image signals and the control signals which the display control circuit 1006 supplies before are supplied again, such that the image signal is supplied again after the holding period of each pixel.

The supplying of any signal refers to supplying a predetermined potential to a wiring. The stop of supplying of any signal refers to stop of supplying of the predetermined potential to the wiring, and connection to a wiring to which a predetermined fixed potential is supplied, for example, a wiring to which the low power supply potential VSS is supplied. The stop of supplying of any signal also refers to cut of an electrical connection to a wiring to which a predetermined potential is supplied, to make a floating state.

As described above, in the thin film transistor including the oxide semiconductor layer, the off-state current can be reduced to less than or equal to $1 \times 10^{-12}$ A/µm, so that the holding period can be extended. Accordingly, a synergistic effect is expected to be generated in reduction of power consumption when a still image is displayed in this embodiment.

In this manner, image signals are compared to determine whether an image thereof is a moving image or a still image, and supplying or stop of supplying of control signals such as a clock signal or a start pulse is selectively performed, whereby power consumption can be reduced.

Figure 2A:
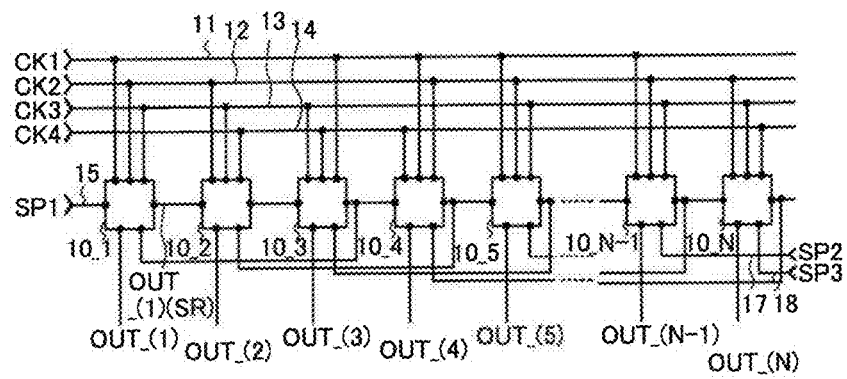
FIGS. 2A to 2C are diagrams showing one example of a driver circuit.
Figure 2B:
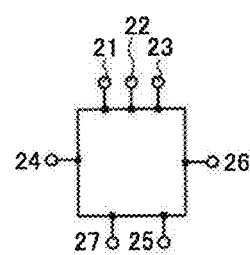
Figure 2C:
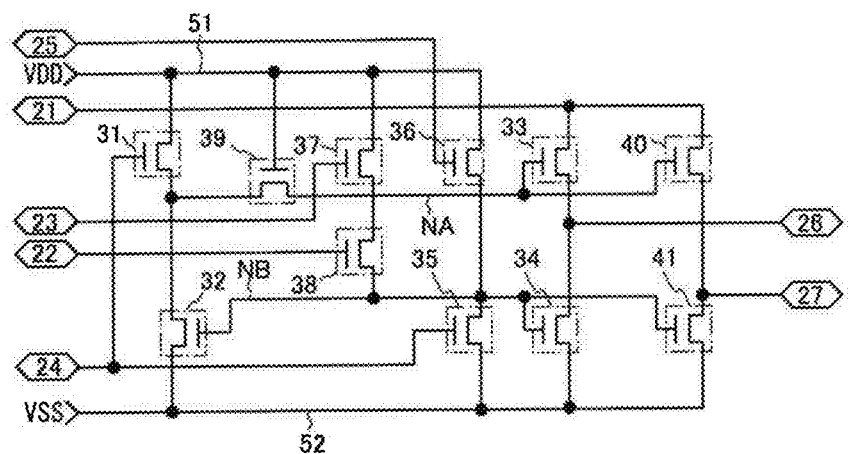

Next, an example of a structure of a shift register included in each of the gate line driver circuit 1009A and the signal line driver circuit 1009B of the driver circuit portion 1007 is described using FIGS. 2A to 2C.

The shift register shown in FIG. 2A includes first to N-th pulse output circuits 10_1 to 10_N (N is a natural number of 3 or more). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to the N-th pulse output circuits 10_1 to 10_N of the shift register shown in FIG. 2A. A start pulse SP1 (a first start pulse) from a fifth wiring 15 is input to the first pulse output circuit 10_1. A signal from the pulse output circuit in the previous stage (the signal called a previous stage signal OUT(n−1)) (n is a natural number of more than or equal to 2 and lower than or equal to/V) is input to the N-th pulse output circuit 10_N in the second or later stage. A signal from the third pulse output circuit 10_3 in the stage two stages after the first pulse output circuit 10_1 is input to the first pulse output circuit 10_1; similarly, a signal from the (N+2)-th pulse output circuit 10_(n+2) in the stage two stages after the N-th pulse output circuit 10_N (the signal called a subsequent-stage signal OUT(n+2)) is input to the N-th pulse output circuit. In this manner, a first output signal (corresponding one of OUT(N)(SR) to OUT(N)(SR)) to be input to the pulse output circuit of the next stage and/or the two-stage-previous stage and a second output signal (corresponding one of OUT(1) to OUT(N)) which is input to another circuit or the like are output from each of the pulse output circuits. Note that as shown in FIG. 2A, the subsequent-stage signal OUT(n+2) is not input to the last two stages of the shift register; therefore, as an example, a second start pulse SP2 may be input to one of the last two stages of the shift register and a third start pulse SP3 may be input to the other of the same. Alternatively, signals may be generated inside to be input thereto. For example, a (N+1)-th pulse output circuit 10_(N+1) and a (N+2)-th pulse output circuit 10_(N+2) which do not contribute to output of pulses to the display portion (such circuits are also referred to as dummy stages) may be provided, and signals corresponding to the second start pulse (SP2) and the third start pulse (SP3) may be generated in the dummy stages.

Note that the first to the fourth clock signals (CK1) to (CK4) each are a signal which oscillates between an H-level signal and an L-level signal at a constant cycle. The first to the fourth clock signals (CK1) to (CK4) are delayed by ¼ period sequentially. In this embodiment, by using the first to fourth clock signals (CK1) to (CK4), control of driving of the pulse output circuit or the like is performed. Note that the clock signal is also called GCK or SCK depending on a driver circuit to which the clock signal is input; however, description is made in this embodiment by using CK as the clock signal.

Note that when it is explicitly described that "A and B are connected," the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, other connection relations are included without being limited to a predetermined connection relation, for example, the connection relation shown in the drawings and the texts.

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 2B).

The first input terminal 21, the second input terminal 22, and the third input terminal 23 are electrically connected to any of the first to fourth wirings 11 to 14. For example, in FIGS. 2A and 2B, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

In FIGS. 2A and 2B, in the first pulse output circuit 10_1, the first start pulse SP1 is input to the fourth input terminal 24, a subsequent-stage signal OUT(3) is input to the fifth input terminal 25, the first output signal OUT(1)(SR) is output from the first output terminal 26, and the second output signal OUT(1) is output from the second output terminal 27.

Next, an example of a specific circuit structure of the pulse output circuit is described with reference to FIG. 2C.

In FIG. 2C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 52, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 52, and a second terminal of the fourth transistor 34 is electrically connected to the first output terminal 26. A first terminal of the fifth transistor 35 is electrically connected to the power supply line 52, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 51, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 51, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and the gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 52, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 2C, a connection point of the gate electrode of the third transistor 33, the gate electrode of the tenth transistor 40, and the second terminal of the ninth transistor 39 is referred to as a node NA. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node NB.

In the case where the pulse output circuit in FIG. 2C is the first pulse output circuit 10_1, the first clock signal CK1 is input to the first input terminal 21, the second clock signal CK2 is input to the second input terminal 22, the third clock signal CK3 is input to the third input terminal 23, the start pulse SP is input to the fourth input terminal 24, a subsequent-stage signal OUT(3) is input to the fifth input terminal 25, the first output signal OUT(1)(SR) is output from the first output terminal 26, and the second output signal OUT (1) is output from the second output terminal 27.

Figure 3:
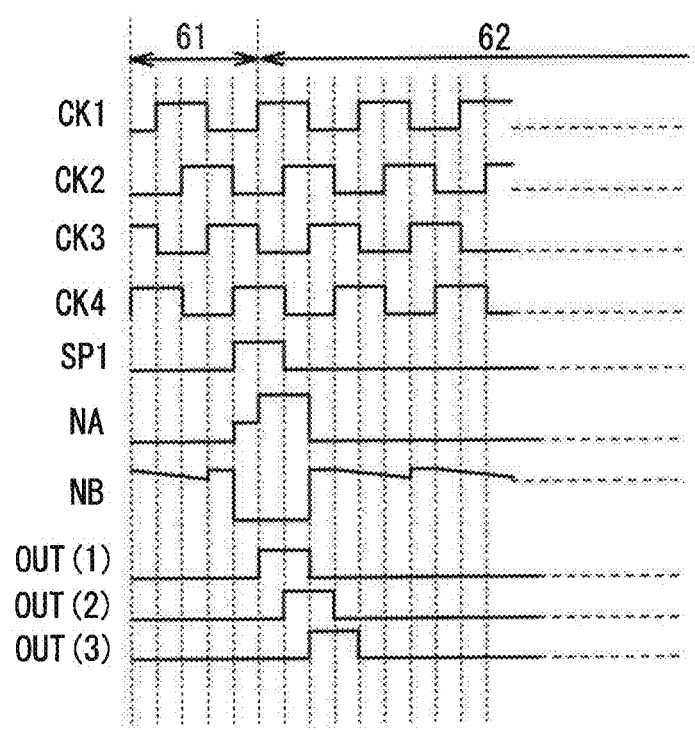
FIG. 3 is a timing chart of a driver circuit.

FIG. 3 shows a timing chart of a shift register including the plurality of pulse output circuits shown in FIG. 2C. In the case where the shift register is a scan line driver circuit, a period 61 in FIG. 3 is a vertical retrace period and a period 62 is a gate selection period.

The order of supplying or stop of supplying of potentials of wirings in the driver circuit including a plurality of n-channel transistors described as an example in FIGS. 2A to 2C and FIG. 3 in the case where a still image and a moving image are displayed is described below.

Figure 26A:
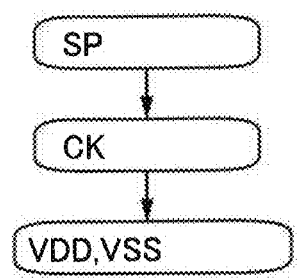
FIGS. 26A to 26D are diagrams for describing Embodiment 1.
Figure 26B:
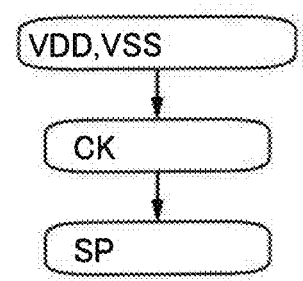

First, in the case where operation of the driver circuit portion 1007 is stopped, supplying of the start pulse SP is stopped by the display control circuit 1006. Next, after the supplying of the start pulse SP is stopped, supplying of each clock signal CK is stopped after pulse output reaches the last stage of the shift register. Then, supplying of the high power supply potential VDD and the low power supply potential VSS of the power supply voltage is stopped (see FIG. 26A). In the case where the operation of the driver circuit portion 1007 is started, first, the display control circuit 1006 supplies the high power supply potential VDD and the low power supply potential VSS of the power supply voltage to the driver circuit portion 1007. Then, each clock signal CK is supplied, and then, supplying of the start pulse SP is started (see FIG. 26B).

In the description of FIGS. 2A to 2C and FIG. 3, the reset signal Res is not supplied to the driver circuit. A structure to which the reset signal Res is supplied is shown and described in FIGS. 4A to 4C.

Figure 4A:
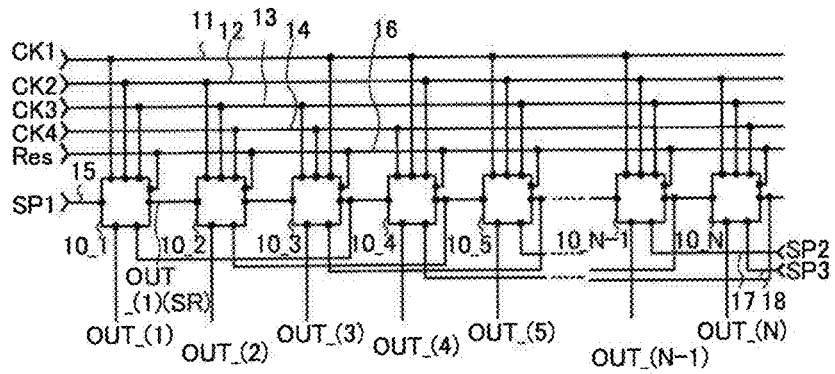
FIGS. 4A to 4C are diagrams showing one example of a driver circuit.

A shift register shown in FIG. 4A includes first to N-th pulse output circuits 10_1 to 10_N (N is a natural number of 3 or more). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to the N-th pulse output circuits 10_1 to 10_N of the shift register shown in FIG. 4A. A start pulse SP1 (a first start pulse) from a fifth wiring 15 is input to the first pulse output circuit 10_1. A signal from the pulse output circuit in the previous stage (the signal called a previous stage signal OUT(n−1)) (n is a natural number of more than or equal to 2 and less than or equal to/V) is input to the N-th pulse output circuit 10_N in the second or later stage. A signal from the third pulse output circuit 10_3 in the stage two stages after the first pulse output circuit 10_1 is input to the first pulse output circuit 10_1; similarly, a signal from the (N+2)-th pulse output circuit 10_(N+2) in the stage two stages after the N-th pulse output circuit 10_N (the signal called a subsequent-stage signal OUT(n+2)) is input to the N-th pulse output circuit. In this manner, a first output signal (corresponding one of OUT(1)(SR) to OUT(N)(SR)) to be input to the pulse output circuit of the next stage and/or the two-stage-previous stage and a second output signal (corresponding one of OUT(1) to OUT(N)) which is input to another circuit or the like are output from each of the pulse output circuits. To the pulse output circuit in each stage, a reset signal Res is supplied from a sixth wiring 16.

Figure 4B:
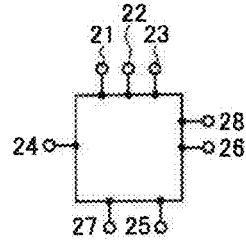
Figure 4C:
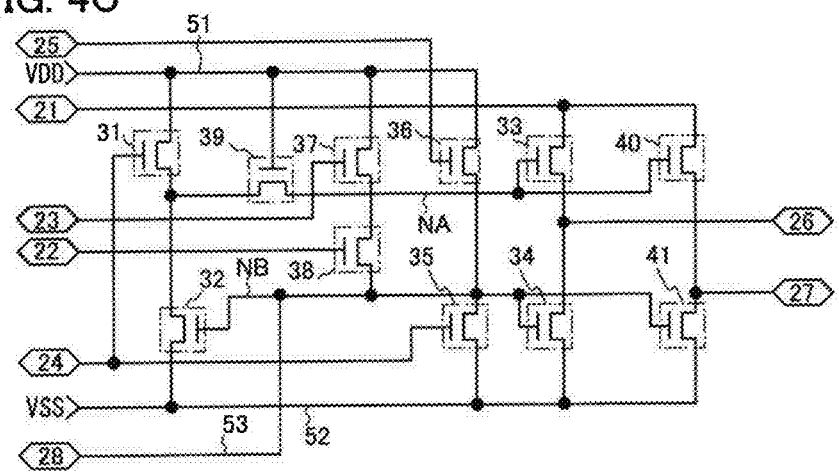

The pulse output circuit shown in FIGS. 4A to 4C is different from the pulse output circuit shown in FIGS. 2A to 2C in that the sixth wiring 16 for supplying the reset signal Res is provided; the other portions is as described in FIGS. 2A to 2C.

Each of the first to N-th pulse output circuits 10_1 to 10_N includes a first input terminal 21, a second input terminal 22, a third input terminal 23, a fourth input terminal 24, a fifth input terminal 25, a first output terminal 26, a second output terminal 27, and a sixth input terminal 28 (see FIG. 4B).

The first input terminal 21, the second input terminal 22, and the third input terminal 23 are electrically connected to any of the first to fourth wirings 11 to 14. For example, in FIGS. 4A and 4B, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

In FIGS. 4A and 4B, in the first pulse output circuit 10_1, the first start pulse SP1 is input to the fifth input terminal 24, the subsequent-stage signal OUT(3) is input to the fourth input terminal 25, the first output signal OUT(1)(SR) is output from the first output terminal 26, the second output signal OUT(1) is output from the second output terminal 27, and the reset signal Res is input from the sixth input terminal 28.

Next, an example of a specific circuit structure of the pulse output circuit is described with reference to FIG. 4C.

In FIG. 4C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 52, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 52, and a second terminal of the fourth transistor 34 is electrically connected to the first output terminal 26. A first terminal of the fifth transistor 35 is electrically connected to the power supply line 52, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 51, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 51, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and the gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 52, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. The gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are electrically connected to a wiring 53 for supplying the reset signal Res. The reset signal Res is a signal by which a signal with a high power supply potential level is supplied to the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 to reduce the output from the pulse output circuit to a signal with a low power supply potential level.

In FIG. 4C, a connection point of the gate electrode of the third transistor 33, the gate electrode of the tenth transistor 40, and the second terminal of the ninth transistor 39 is referred to as a node NA. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node NB.

In the case where the pulse output circuit in FIG. 4C is the first pulse output circuit 10_1, the first clock signal CK1 is input to the first input terminal 21, the second clock signal CK2 is input to the second input terminal 22, the third clock signal CK3 is input to the third input terminal 23, the start pulse SP is input to the fourth input terminal 24, a subsequent-stage signal OUT(3) is input to the fifth input terminal 25, the first output signal OUT(1)(SR) is output from the first output terminal 26, the second output signal OUT(1) is output from the second output terminal 27, and the reset signal Res is input from the sixth input terminal 28.

The timing chart of the shift register including a plurality of pulse output circuits shown in FIG. 4C is similar to that of FIG. 2C, shown in FIG. 3.

The order of supplying or stop of supplying of potentials of wirings in the driver circuit including a plurality of n-channel transistors described as an example in FIGS. 4A to 4C in the case where a still image or a moving image is displayed are described below.

Figure 26C:
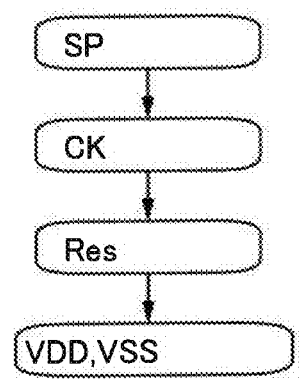
Figure 26D:
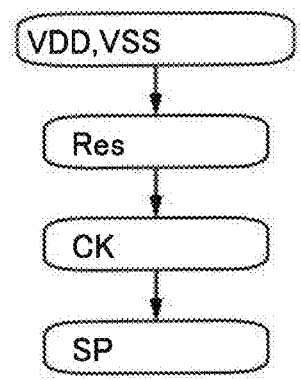

First, in the case where operation of the driver circuit portion 1007 is stopped, supplying of the start pulse SP is stopped by the display control circuit 1006. Next, after the supplying of the start pulse SP is stopped, supplying of each clock signal CK is stopped after pulse output reaches the last stage of the shift register. Then, the reset signal Res is supplied. Next, supplying of the high power supply potential VDD and the low power supply potential VSS of the power supply voltage is stopped (see FIG. 26C). In the case where the operation of the driver circuit portion 1007 is started, first, the display control circuit 1006 supplies the high power supply potential VDD and the low power supply potential VSS of the power supply voltage to the driver circuit portion 1007. Then, the reset signal Res is supplied. Next, each clock signal CK is supplied, and then, supplying of the start pulse SP is started (see FIG. 26D).

The structure as described in FIGS. 4A to 4C in which the reset signal is supplied in addition to the structure shown in FIGS. 2A to 2C and FIG. 3 is preferable because malfunction due to signal delay at the time of switching between a still image and a moving image or the like can be reduced.

In the case where a still image is displayed, a common potential electrode provided over the thin film transistor included in the driver circuit portion may be cut off from a common potential line to be made in the floating state. Then, after the still-image mode, in the case where operation of the driver circuit is started again, the common potential electrode is connected to the common potential line. Accordingly, malfunction of the thin film transistor in the driver circuit portion can be prevented.

Figure 18A:
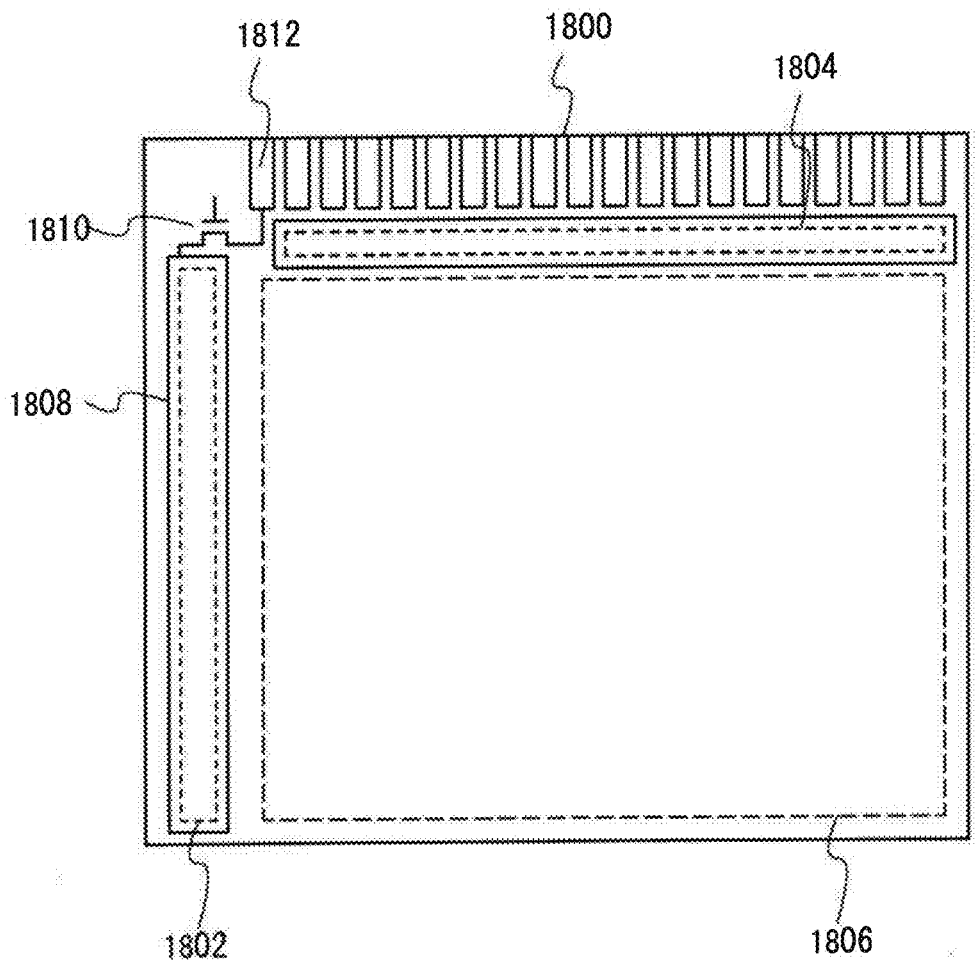
FIGS. 18A and 18B illustrate a display panel and a thin film transistor.
Figure 18B:
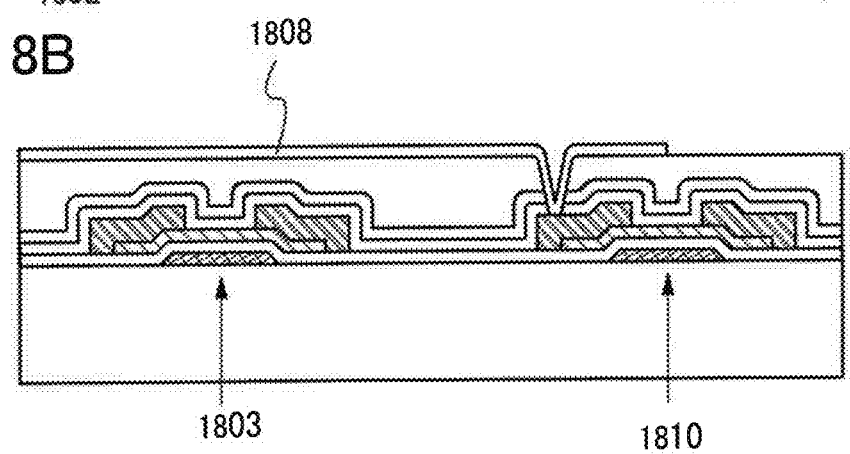

FIG. 18A illustrates a display panel 1800 having such a structure, and FIG. 18B is a view for describing the cross-sectional structure thereof. The display panel 1800 includes driver circuits 1802 and 1804 and a pixel portion 1806. A common potential electrode 1808 is provided so as to overlap the driver circuit 1802. A switch 1810 for controlling connection/non-connection between the common potential electrode 1808 and a common potential terminal 1812 is provided therebetween.

The common potential electrode 1808 is provided over a TFT 1803 of the driver circuit as shown in FIG. 18B, thereby shielding the TFT 1803 from static electricity, so that a change of the threshold voltage or generation of a parasitic channel is prevented.

The same structure as the TFT 1803 can be used as the switch 1810. Such an element in which the leakage current in the off-state is extremely small contributes to stabilization of operation of the display panel. That is, in the case where a still image is displayed, even when the switch 1803 is turned off to make the common potential electrode in the floating state, the potential can be kept constant.

In this manner, by using the TFT formed using an oxide semiconductor having wide bandgap and providing the common potential electrode to shield the external electric field, a still image can be displayed even in the state where the operation of the driver circuit is stopped. Further, by controlling the potential of the common potential electrode as appropriate in accordance with the operation of the driver circuit, the operation of the display panel can be stabilized.

As described above, by using a feature of less off-state current of the thin film transistor using an oxide semiconductor, for a liquid crystal display device, a period for holding voltage in a storage capacitor can be extended, and power consumption when a still image or the like is displayed can be decreased. Further, by stopping supplying a control signal in the case where a still image is displayed, power consumption can be further decreased. In addition, a still image and a moving image can be switched without malfunction.

Embodiment 1 can be implemented in appropriate combination with any of the structures described in the other embodiments.

Embodiment 2

A thin film transistor of this embodiment and an embodiment of a method for manufacturing the thin film transistor are described using FIGS. 5A and 5B and FIGS. 6A to 6E.

In Embodiment 2, an example of a thin film transistor which can be applied to a liquid crystal display device described in this specification will be described. A thin film transistor 410 described in Embodiment 2 can be used as a thin film transistor in each pixel of the pixel portion 1008 described in Embodiment 1.

Figure 5A:
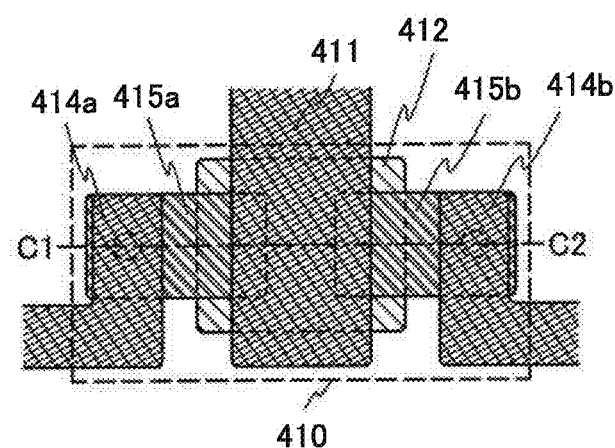
FIGS. 5A and 5B illustrate a thin film transistor.
Figure 5B:
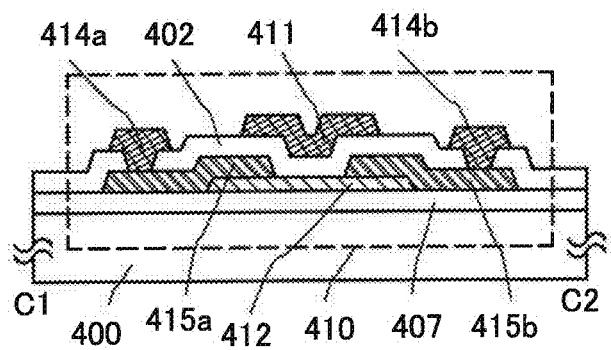

FIG. 5A illustrates an example of a planar structure of the thin film transistor, and FIG. 5B illustrates an example of a cross-sectional structure thereof. The thin film transistor 410 shown in FIGS. 5A and 5B is a top-gate thin film transistor.

FIG. 5A is a plane view of the top-gate thin film transistor 410 and FIG. 5B is a cross-sectional view along line C1-C2 in FIG. 5A.

The thin film transistor 410 includes over a substrate 400 having an insulating surface, an insulating layer 407, an oxide semiconductor layer 412, a source and drain electrode layers 415a and 415b, a gate insulating layer 402, and a gate electrode layer 411. Wiring layers 414a and 414b are provided in contact with the source and drain electrode layers 415a and 415b, respectively to be electrically connected thereto.

The thin film transistor 410 is described as a single-gate thin film transistor; a multi-gate thin film transistor including a plurality of channel formation regions can be formed when needed.

A process for manufacturing the thin film transistor 410 over the substrate 400 is described below with reference to FIGS. 6A to 6E.

There is no particular limitation on a substrate which can be used as the substrate 400 having an insulating surface as long as the substrate has enough heat resistance to a heat treatment to be performed later.

As the substrate 400, a glass substrate whose strain point is higher than or equal to 730° C. may be used when the temperature of the heat treatment performed later is high. As a material of the glass substrate, a glass material such as aluminosilicate glass, aluminoborosilicate glass, or barium borosilicate glass is used, for example. Note that by containing a larger amount of barium oxide (BaO) than boron oxide, a heat-resistant glass substrate which is of more practical use can be formed. Therefore, it is preferable that a glass substrate containing a larger amount of BaO than $B_2O_3$ be used.

Note that a substrate formed using an insulator such as a ceramic substrate, a quartz substrate, or a sapphire substrate may be used instead of the above-described glass substrate, as the substrate 400. Alternatively, a crystallized glass substrate or the like may be used. Further alternatively, a plastic substrate or the like may be used.

First, the insulating layer 407 which functions as a base film is formed over the substrate 400 having an insulating surface. It is preferable that an oxide insulating layer such as a silicon oxide layer, a silicon oxynitride layer, an aluminum oxide layer, or an aluminum oxynitride layer be used as the insulating layer 407 which is in contact with the oxide semiconductor layer. The insulating layer 407 can be formed by a plasma CVD method, a sputtering method, or the like. It is preferable to form the insulating layer 407 by a sputtering method in order not to contain hydrogen in the insulating layer 407.

In this embodiment, a silicon oxide layer is formed as the insulating layer 407 by a sputtering method. The substrate 400 is transferred into a chamber, a sputtering gas containing high-purity oxygen in which hydrogen and moisture are removed is introduced into the chamber, and a target is used, so that the silicon oxide layer is deposited on the substrate 400 as the insulating layer 407. The substrate 400 may be at room temperature or may be heated.

For example, a silicon oxide film is formed as follows: quartz (preferably quart) is used as the target; the substrate temperature is 108° C.; the distance between the target and the substrate (T-S distance) is 60 mm; the pressure is 0.4 Pa; the high-frequency power is 1.5 kW; the atmosphere is oxygen and argon (flow rate ratio of oxygen to argon is 25 sccm:25 sccm=1:1); and an RF sputtering method is used. The thickness of the silicon oxide film is 100 nm in this embodiment. A silicon target may be used instead of the quartz (preferably quart) to form the silicon oxide film. As a sputtering gas, oxygen or a mixed gas of oxygen and argon is used in this embodiment.

In that case, it is preferable to remove residual moisture in the chamber in the deposition of the insulating layer 407. This is in order to prevent the insulating layer 407 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cry opump, a hydrogen molecule, a compound including a hydrogen atom such as water ($H_2O$), or the like, for example, is exhausted. Accordingly, the concentration of impurities included in the insulating layer 407 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the insulating layer 407.

Examples of a sputtering method include an RF sputtering method in which a high-frequency power source is used as a sputtering power source, a DC sputtering method in which a DC power source is used, and a pulsed DC sputtering method in which a bias is applied in a pulsed manner. The RF sputtering method is mainly used in the case where an insulating film is formed, and the DC sputtering method is mainly used in the case where a metal film is formed.

A multi-target sputtering apparatus in which a plurality of targets which are formed of different materials from each other can be set may be used. With the multi-target sputtering apparatus, films of different materials can be stacked to be formed in the same chamber, or plural kinds of materials can be deposited by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge may be used.

Further, as the deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition may be used.

The insulating layer 407 may have a stacked-layer structure; for example, a stacked-layer structure in which a nitride insulating layer such as a silicon nitride layer, a silicon nitride oxide layer, an aluminum nitride layer, or an aluminum nitride oxide layer and the above-described oxide insulating layer are stacked in this order over the substrate 400 may be used.

For example, a silicon nitride layer is formed between the silicon oxide layer and the substrate 400 by introducing a sputtering gas containing high-purity nitrogen in which hydrogen and moisture are removed and using a silicon target. In that case also, it is preferable to remove residual moisture in the chamber in the formation of the silicon nitride layer as is the case of the deposition of the silicon oxide layer.

The substrate may be heated at the time of the film deposition of the silicon nitride layer.

In the case where the silicon nitride layer and the silicon oxide layer are stacked to form the insulating layer 407, the silicon nitride layer and the silicon oxide layer can be formed in the same chamber with the same silicon target. For example, first, a sputtering gas containing nitrogen is introduced and a silicon target placed inside the chamber is used to form the silicon nitride layer, and then, the sputtering gas is switched to a sputtering gas containing oxygen and the same silicon target is used to form the silicon oxide layer. Since the silicon nitride layer and the silicon oxide layer can be formed in succession without exposure to the air, an impurity such as hydrogen or moisture can be prevented from being adsorbed on a surface of the silicon nitride layer.

Next, an oxide semiconductor film is formed to a thickness of greater than or equal to 2 nm and less than or equal to 200 nm over the insulating layer 407.

In order for the oxide semiconductor film not to contain impurities such as hydrogen, a hydroxyl group, and moisture as much as possible, it is preferable to preheat the substrate 400 provided with the insulating layer 407 in a preheating chamber of the sputtering apparatus before the film formation so that an impurity such as hydrogen or moisture adsorbed on the substrate 400 is eliminated, and perform exhaustion. As an exhaustion unit provided in the preheating chamber, a cryopump is preferable. This preheating step is not necessarily performed.

Note that before the oxide semiconductor film is formed by a sputtering method, it is preferable to perform reverse sputtering in which an argon gas is introduced and plasma is generated so that dust on a surface of the insulating layer 407 is removed. The reverse sputtering is a method by which voltage is applied to a substrate side with a high-frequency power source in an argon atmosphere to generate plasma on the substrate side without applying voltage to a target side, so that a surface is modified. Instead of the argon atmosphere, a nitrogen atmosphere, a helium atmosphere, an oxygen atmosphere, or the like may be used.

The oxide semiconductor film is formed by the sputtering method. The oxide semiconductor film is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film is formed by a sputtering method using an In—Ga—Zn—O-based oxide semiconductor target. Specifically, a target having a composition ratio of $In_2O_3:Ga_2O_3:ZnO=1:1:1$ [mol %] (that is, In:Ga:Zn=1:1:0.5 [atom %]) is used. Alternatively, a target having a composition ratio of In:Ga:Zn=1:1:1 [atom %] or In:Ga:Zn=1:1:2 [atom %] can be used. In this embodiment, the filling rate of the oxide semiconductor target is equal to or greater than 90% and equal to or less than 100%, preferably equal to or greater than 95% and equal to or less than 99.9%. With use of the oxide semiconductor target having high filling rate, the deposited oxide semiconductor film has high density. The atmosphere in the sputtering may be an atmosphere of a rare gas (typically argon), an atmosphere of oxygen, or a mixed atmosphere of a rare gas and oxygen. The target may contain $SiO_2$ at 2 wt % or more and 10 wt % or less.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

The oxide semiconductor film is formed over the substrate 400 as follows: the substrate is held in the chamber with pressure reduced, residual moisture in the chamber is removed, a sputtering gas from which hydrogen and moisture are removed is introduced, and the above-described target is used. In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed using a cryopump, a hydrogen molecule, a compound including a hydrogen atom such as water ($H_2O$), a compound including a carbon atom, or the like is exhausted. Accordingly, the concentration of impurities included in the oxide semiconductor film formed in the chamber can be reduced. The substrate may be heated at the time of the film deposition of the oxide semiconductor film.

As an example of the film deposition condition, the following condition is employed: the temperature of the substrate is room temperature; the distance between the substrate and the target is 110 mm; the pressure is 0.4 Pa; the direct current (DC) power is 0.5 kW; and the atmosphere is oxygen and argon (the flow rate ratio of oxygen to argon is 15 sccm:30 sccm). It is preferable that a pulsed direct current (DC) power supply be used because powder substances (also referred to as particles or dust) generated in the film deposition can be reduced and the film thickness can be made uniform. The oxide semiconductor film has a thickness greater than or equal to 2 nm and less than or equal to 200 nm, preferably greater than or equal to 5 nm and less than or equal to 30 nm. Note that appropriate thickness of the oxide semiconductor film varies depending on a material thereof; therefore, the thickness may be determined as appropriate depending on the material.

Figure 6A:
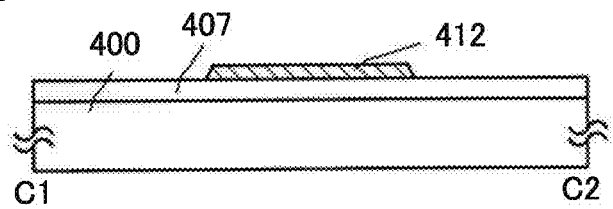
FIGS. 6A to 6E illustrate a method for manufacturing a thin film transistor.
Figure 6B:
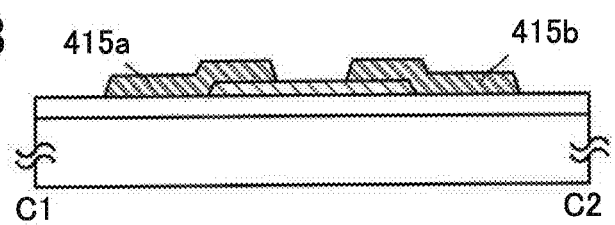

Next, the oxide semiconductor film is processed into the island-shaped oxide semiconductor layer 412 by a first photolithography step (see FIG. 6A). A resist mask for forming the island-shaped oxide semiconductor layer 412 may be formed using an ink jet method. Formation of the resist mask by an inkjet method needs no photomask; thus, manufacturing cost can be reduced.

For the etching of the oxide semiconductor film, either one or both of wet etching and dry etching may be employed.

As an etching gas for the dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel-plate RIE (reactive ion etching) method or an ICP (inductively coupled plasma) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, an ammonia hydrogen peroxide mixture (hydrogen peroxide:ammonia: water=5:2:2), an ammonium hydroxide/hydrogen peroxide mixture (a 31 wt % hydrogen peroxide solution: 28 wt % ammonia water:water=5:2:2), or the like can be used. ITO07N (produced by KANTO CHEMICAL CO., INC.) may be used.

After the wet etching, the etchant is removed by cleaning together with the material which is etched off. Waste liquid of the etchant containing the removed material may be purified and the material contained in the waste liquid may be reused. The resources can be efficiently used and the cost can be reduced by collecting and reusing a material such as indium included in the oxide semiconductor from the waste liquid after the etching.

The etching conditions (such as an etchant, etching time, or temperature) are appropriately adjusted depending on a material so that the material can be etched into a desired shape.

In this embodiment, the oxide semiconductor film is processed into the island-shaped oxide semiconductor layer 412 by a wet etching method using a solution obtained by mixing phosphoric acid, acetic acid, and nitric acid.

In this embodiment, a first heat treatment is performed on the oxide semiconductor layer 412. The temperature of the first heat treatment is higher than or equal to 400° C. and lower than or equal to 750° C., and higher than or equal to 400° C. and lower than the strain point of the substrate 400 when the strain point of the substrate 400 is lower than or equal to 750° C. In this embodiment, the substrate is put in an electric furnace which is a kind of heat treatment apparatus and heat treatment is performed on the oxide semiconductor layer at 450° C. for one hour in a nitrogen atmosphere, and then, the temperature is reduced to room temperature and water or hydrogen is prevented from entering the oxide semiconductor layer, without exposure to the air; thus, an oxide semiconductor layer is obtained. The oxide semiconductor layer 412 can be dehydrated or dehydrogenated by the first heat treatment.

The heat treatment apparatus is not limited to an electric furnace and may be provided with a device that heats an object to be processed by thermal conduction or thermal radiation from a heater such as a resistance heater or the like. For example, an RTA (rapid thermal annaling) apparatus such as a GRTA (gas rapid thermal annealing) apparatus or an LRTA (lamp rapid thermal annealing) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with the object to be processed, by heat treatment, such as nitrogen or a rare gas such as argon is used.

For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment for a short time.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, far preferably 7N (99.99999%) or more (that is, the concentration of impurities be 1 ppm or less, far preferably 0.1 ppm or less).

Further, depending on the condition of the first heat treatment or a material of the oxide semiconductor layer, the oxide semiconductor layer 412 might be crystallized to be a microcrystalline film or a polycrystalline film. For example, the oxide semiconductor layer may be crystallized to be a microcrystalline oxide semiconductor film in which the degree of crystallization is greater than or equal to 90% or greater than or equal to 80%. Further, depending on the condition of the first heat treatment or the material of the oxide semiconductor layer, the oxide semiconductor layer 412 may be an amorphous oxide semiconductor film which does not contain crystalline components. The oxide semiconductor layer may become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

The first heat treatment of the oxide semiconductor layer can also be performed on the oxide semiconductor film before being processed into the island-like oxide semiconductor layer 412. In that case, the substrate is taken out from the heat apparatus after the first heat treatment, and then a photolithography step is performed thereon.

The example in which the heat treatment for dehydration and/or dehydrogenation on the oxide semiconductor layer is performed just after the formation of the oxide semiconductor layer 412 is described above. However, the heat treatment for dehydration and/or dehydrogenation may be performed after a source electrode and a drain electrode are stacked on the oxide semiconductor layer or after a gate insulating layer is formed over a source electrode and a drain electrode as long as it is performed after the deposition of the oxide semiconductor layer.

A conductive film is formed over the insulating layer 407 and the oxide semiconductor layer 412. The conductive film may be formed by a sputtering method or a vacuum evaporation method. As a material of the conductive film, an element selected from Al, Cr, Cu, Ta, Ti, Mo, and W; an alloy containing any of these elements as a component; an alloy film containing any of these elements in combination; and the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used. In this embodiment, a titanium film with a thickness of 150 nm is formed as the conductive film by a sputtering method.

Next, a resist mask is formed over the conductive film by a second photolithography step. The resist mask may be formed using an ink jet method. Formation of the resist mask by an inkjet method needs no photomask; thus, manufacturing cost can be reduced. After that, etching is selectively performed thereon, so that the source and drain electrode layers 415a and 415b are formed, and then, the resist mask is removed (see FIG. 6B). It is preferable that an end portion of the each of the source and drain electrode layers have a tapered shape because coverage with a gate insulating layer stacked thereover is improved.

Note that each material and etching conditions are adjusted as appropriate so that the oxide semiconductor layer 412 is not removed by the etching of the conductive film and the insulating layer 407 under the oxide semiconductor layer 412 is not exposed.

In this embodiment, since the Ti film is used as the conductive film and the In—Ga—Zn—O-based oxide semiconductor is used as the oxide semiconductor layer 412, an ammonium hydroxide/hydrogen peroxide mixture (a 31 wt % hydrogen peroxide solution:28 wt % ammonia water: water=5:2:2) is used as an etchant.

In the second photolithography step, in some cases, part of the oxide semiconductor layer 412 is etched, whereby an oxide semiconductor layer having a groove (a depression portion) may be formed.

Light exposure at the time of the formation of the resist mask in the second photolithography step may be performed using ultraviolet light, KrF laser light, or ArF laser light. The channel length L of a thin film transistor to be formed is determined by a pitch between a lower end of the source electrode layer and a lower end of the drain electrode layer, which are adjacent to each other over the oxide semiconductor layer 412. In the case where light exposure is performed for a channel length L of less than 25 nm, the light exposure at the time of the formation of the resist mask in the second photolithography step is performed using extreme ultraviolet light having an extremely short wavelength of several nanometers to several tens of nanometers. In the light exposure by extreme ultraviolet light, the resolution is high and the focus depth is large. Accordingly, the channel length L of the thin film transistor can be made to be greater than or equal to 10 nm and less than or equal to 1000 nm, the operation rate of a circuit can be increased, and low power consumption can be achieved by extremely small off-state current.

Figure 6C:
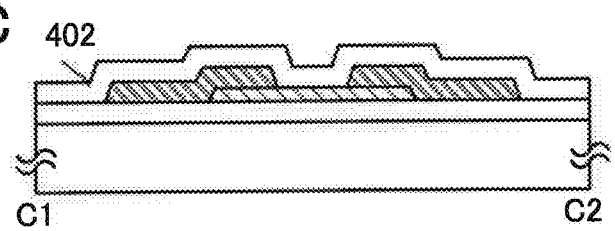

Next, the gate insulating layer 402 is formed over the insulating layer 407, the oxide semiconductor layer 412, and the source and drain electrode layers 415a and 415b (see FIG. 6C).

The gate insulating layer 402 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 402 from containing hydrogen as much as possible, it is preferable to form the gate insulating layer 402 by a sputtering method. In the case of forming a silicon oxide film by a sputtering method, a silicon target or a quartz target is used as a target, and oxygen or a mixed gas of oxygen and argon is used as a sputtering gas. In this embodiment, a 100-nm-thick silicon oxide layer is formed as follows: the pressure is 0.4 Pa; the high-frequency power is 1.5 kW; the atmosphere is oxygen and argon (flow rate ratio of oxygen to argon is 25 sccm:25 sccm=1:1); and an RF sputtering method is used.

The gate insulating layer 402 can have a structure in which a silicon oxide layer and a silicon nitride layer are stacked in this order. For example, a gate insulating layer with a thickness of greater than or equal to 70 nm and less than or equal to 400 nm, for example, a thickness of 100 nm is formed in such a manner that a silicon oxide layer ($SiO_x$ ($x>0$)) having a thickness of greater than or equal to 5 nm and less than or equal to 300 nm is formed by a sputtering method as a first gate insulating layer and then a silicon nitride layer ($SiN_y$ ($y>0$)) having a thickness of greater than or equal to 50 nm and less than or equal to 200 nm is stacked as a second gate insulating layer over the first gate insulating layer.

Figure 6D:
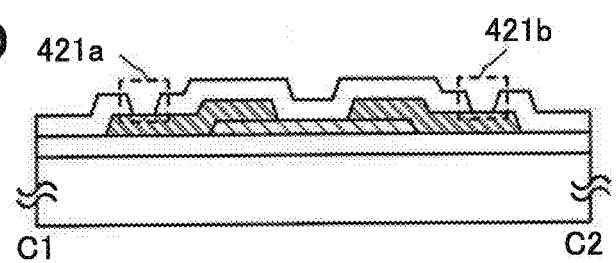

Next, a resist mask is formed by a third photolithography step, and etching is selectively performed to remove parts of the gate insulating layer 402, so that openings 421a and 421b reaching the source and drain electrode layers 415a and 415b are formed (see FIG. 6D).

Next, a conductive film is formed over the gate insulating layer 402 and the openings 421a and 421b. In this embodiment, a titanium film with a thickness of 150 nm is formed by a sputtering method. After that, a fourth photolithography step is performed thereon, so that the gate electrode layer 411 and the wiring layers 414a and 414b are formed. Note that a resist mask may be formed by an inkjet method. Formation of the resist mask by an inkjet method needs no photomask; thus, manufacturing cost can be reduced.

The gate electrode layer 411 and the wiring layers 414a and 414b can be formed each to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of each of the gate electrode layer 411 and the wiring layers 414a and 414b, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. The gate electrode layer can be formed using a light-transmitting conductive film. As an example of a material of the light-transmitting conductive film, a light-transmitting conductive oxide can be given.

Next, a second heat treatment (preferably at a temperature higher than or equal to 200° C. and lower than or equal to 400° C., for example, at a temperature higher than or equal to 250° C. and lower than or equal to 350° C.) is performed in an inert gas atmosphere or an oxygen gas atmosphere. In this embodiment, the second heat treatment is performed at 250° C. for one hour in a nitrogen atmosphere. The second heat treatment may be performed after a protective insulating layer or a planarization insulating layer is formed over the thin film transistor 410.

Furthermore, heat treatment may be performed at a temperature higher than or equal to 100° C. and lower than or equal to 200° C. for one hour to 30 hours both inclusive in an air atmosphere. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed before the formation of the oxide insulating layer under a reduced pressure. Under the reduced pressure, the heat treatment time can be shortened.

Figure 6E:
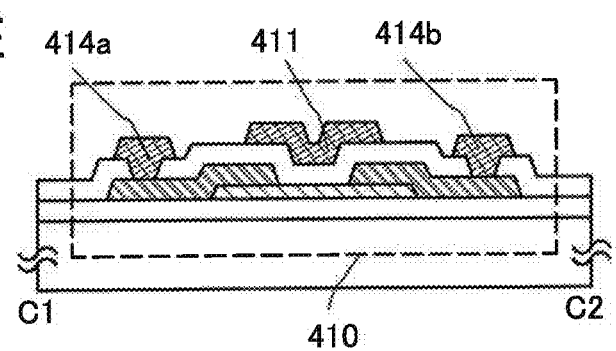

Through the above-described process, the thin film transistor 410 including the oxide semiconductor layer 412 in which the concentration of hydrogen, moisture, hydride, and hydroxide is reduced can be formed (see FIG. 6E). The thin film transistor 410 can be used as the thin film transistor described in Embodiment 1.

A protective insulating layer or a planarization insulating layer for planarization may be provided over the thin film transistor 410. For example, the protective insulating layer can be formed with a single-layer structure or a stacked-layer structure using one or more of a silicon oxide layer, a silicon nitride layer, a silicon oxynitride layer, a silicon nitride oxide layer, and an aluminum oxide layer.

The planarization insulating layer can be formed using a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. The planarization insulating layer may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the planarization insulating layer. The planarization insulating layer can be formed, depending on a material thereof, by a method such as a sputtering method, an SOG method, a spin coating method, a dipping method, a spray coating method, or a droplet discharge method (e.g., an inkjet method, screen printing, or offset printing), or with the use of a tool such as a doctor knife, a roll coater, a curtain coater, or a knife coater.

By removing residual moisture in the reaction atmosphere at the time of the film deposition of the oxide semiconductor film as described above, the concentration of hydrogen and hydride in the oxide semiconductor film can be reduced. Accordingly, the oxide semiconductor film can be stabilized.

By using the thin film transistor manufactured as described above in each of a plurality of pixels of a display portion of a liquid crystal display device, the leakage current from the pixel can be suppressed. Accordingly, a period for holding voltage in a storage capacitor can be increased, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction.

Embodiment 2 can be implemented in appropriate combination with any of the structures described in the other embodiments.

Embodiment 3

In Embodiment 3, another example of a thin film transistor which can be applied to a liquid crystal display device disclosed in this specification will be described. Note that Embodiment 2 can be applied to the same portions and the portions and steps having similar functions as/to Embodiment 2, and description thereof is not repeated. Further, a specific description for the same portions is omitted. A thin film transistor 460 described in this embodiment can be used as a thin film transistor in each pixel of the pixel portion 1008 described in Embodiment 1.

A thin film transistor of this embodiment and an embodiment of a method for manufacturing the thin film transistor are described using FIGS. 7A and 7B and FIGS. 8A to 8E.

Figure 7A:
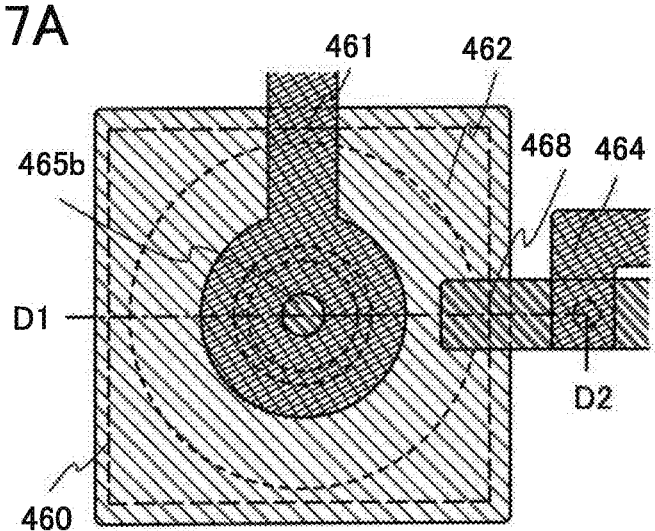
FIGS. 7A and 7B illustrate a thin film transistor.
Figure 7B:
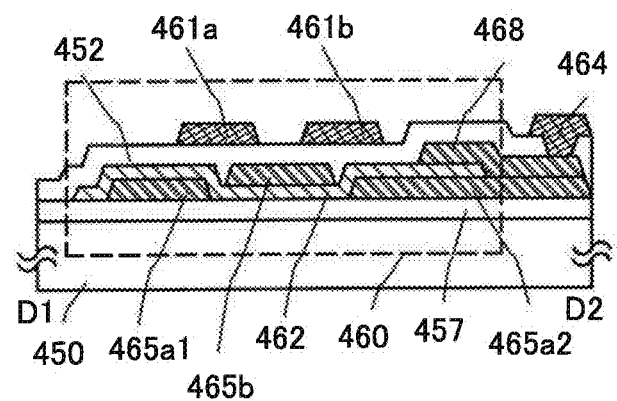

FIG. 7A illustrates an example of a planar structure of the thin film transistor, and FIG. 7B illustrates an example of a cross-sectional structure thereof. The thin film transistor 460 shown in FIGS. 7A and 7B is a top-gate thin film transistor.

FIG. 7A is a plane view of the top-gate thin film transistor 460 and FIG. 7B is a cross-sectional view along line D1-D2 in FIG. 7A.

The thin film transistor 460 includes over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Further, not shown in the drawing, the source or drain electrode layer 465b is also electrically connected to the wiring layer in an opening formed in the gate insulating layer 452.

A process for manufacturing the thin film transistor 460 over the substrate 450 is described below with reference to FIGS. 8A to 8E.

First, the insulating layer 457 which functions as a base film is formed over the substrate 450 having an insulating surface.

In this embodiment, a silicon oxide layer is formed as the insulating layer 457 by a sputtering method. The substrate 450 is transferred into a chamber, a sputtering gas containing high-purity oxygen in which hydrogen and moisture are removed is introduced into the chamber, and a silicon target or quartz (preferably quart) is used, so that the silicon oxide layer is deposited on the substrate 450 as the insulating layer 457. In this embodiment, oxygen or a mixed gas of oxygen and argon is used as the sputtering gas.

For example, a silicon oxide film is formed in this embodiment as follows: quartz (preferably quart) which has a purity of 6N is use as the target; the substrate temperature is 108° C.; the distance between the target and the substrate (T-S distance) is 60 mm; the pressure is 0.4 Pa; the high-frequency power is 1.5 kW; the atmosphere is oxygen and argon (flow rate ratio of oxygen to argon is 25 sccm:25 sccm=1:1); and an RF sputtering method is used. The thickness of the silicon oxide film is 100 nm in this embodiment. A silicon target may be used instead of the quartz (preferably quart) to form the silicon oxide film.

In that case, it is preferable to remove residual moisture in the chamber in the deposition of the insulating layer 457. This is in order to prevent the insulating layer 457 from containing hydrogen, a hydroxyl group, and/or moisture. In the chamber in which exhaustion is performed with the use of a cryopump, a hydrogen molecule, a compound including a hydrogen atom such as water ($H_2O$), or the like, for example, is exhausted. Accordingly, the concentration of impurities included in the insulating layer 457 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the insulating layer 457.

The insulating layer 457 may have a stacked-layer structure; for example, a stacked-layer structure in which a nitride insulating layer such as a silicon nitride layer, a silicon nitride oxide layer, an aluminum nitride layer, or an aluminum nitride oxide layer and the above-described oxide insulating layer are stacked in this order over the substrate 450 may be used.

For example, a silicon nitride layer is formed between the silicon oxide layer and the substrate 450 by introducing a sputtering gas containing high-purity nitrogen in which hydrogen and moisture are removed and using a silicon target. In that case also, it is preferable to remove residual moisture in the chamber in the formation of the silicon nitride layer as is the case of the deposition of the silicon oxide layer.

A conductive film is formed over the insulating layer 457. As a material of the conductive film, an element selected from Al, Cr, Cu, Ta, Ti, Mo, and W; an alloy containing any of these elements as a component; an alloy film containing any of these elements in combination; and the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used. In this embodiment, a titanium film with a thickness of 150 nm is formed as the conductive film by a sputtering method. Next, a resist mask is formed over the conductive film by a first photolithography step, etching is selectively thereon, so that the source and drain electrode layers 465a1 and 465a2 are formed, and then, the resist mask is removed (see FIG. 8A). The source and drain electrode layers 465a1 and 465a2, which are shown as being cut in the cross-sectional view, are one film having a torus-shaped portion as shown in FIG. 7A. It is preferable that an end portion of the each of the source and drain electrode layers 465a1 and 465a2 have a tapered shape because coverage with a gate insulating layer stacked thereover is improved.

Next, an oxide semiconductor film with a thickness greater than or equal to 2 nm and less than or equal to 200 nm, for example, greater than or equal to 5 nm and less than or equal to 30 nm is formed. Note that appropriate thickness of the oxide semiconductor film varies depending on a material thereof; therefore, the thickness may be determined as appropriate depending on the material. In this embodiment, the oxide semiconductor film is formed by a sputtering method with the use of an In—Ga—Zn—O-based oxide semiconductor target.

The oxide semiconductor film is formed over the substrate 450 as follows: the substrate is held in the chamber with pressure reduced, residual moisture in the chamber is removed, a sputtering gas from which hydrogen and moisture are removed is introduced, and a target is used. In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed using a cryopump, a hydrogen molecule, a compound including a hydrogen atom such as water ($H_2O$), a compound including a carbon atom, or the like is exhausted. Accordingly, the concentration of impurities included in the oxide semiconductor film formed in the chamber can be reduced. The substrate may be heated at the time of the film deposition of the oxide semiconductor film.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

As an example of the film deposition condition, the following condition is employed: the temperature of the substrate is room temperature; the distance between the substrate and the target is 110 mm; the pressure is 0.4 Pa; the direct current (DC) power supply is 0.5 kW; and the atmosphere is oxygen and argon (the flow rate ratio of oxygen to argon is 15 sccm:30 sccm).

Figure 8A:
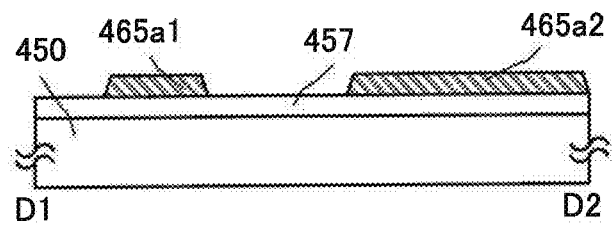
FIGS. 8A to 8E illustrate a method for manufacturing a thin film transistor.
Figure 8B:
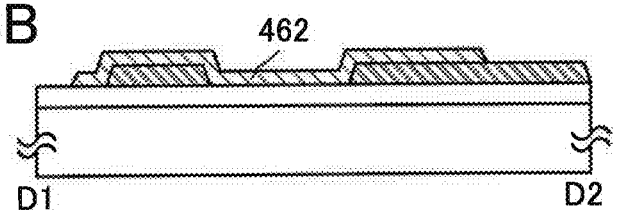
Figure 8C:
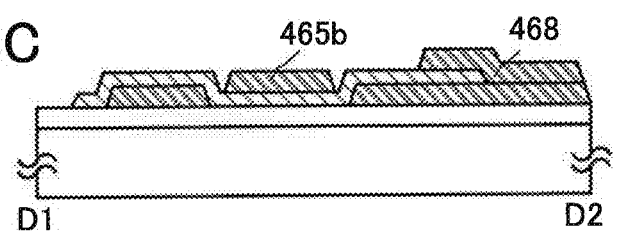

Next, the oxide semiconductor film is processed into an island-shaped oxide semiconductor layer 462 by a second photolithography step (see FIG. 8B). In this embodiment, the oxide semiconductor film is processed into the island-shaped oxide semiconductor layer 462 by a wet etching method using a solution obtained by mixing phosphoric acid, acetic acid, and nitric acid.

In this embodiment, a first heat treatment is performed on the oxide semiconductor layer 462. The temperature of the first heat treatment is higher than or equal to 400° C. and lower than or equal to 750° C., and higher than or equal to 400° C. and lower than the strain point of the substrate 450 when the strain point of the substrate 450 is lower than or equal to 750° C. In this embodiment, the substrate is put in an electric furnace which is a kind of heat treatment apparatus and heat treatment is performed on the oxide semiconductor layer at 450° C. for one hour in a nitrogen atmosphere, and then, the temperature is reduced to room temperature without exposure to the air and water or hydrogen is prevented from entering the oxide semiconductor layer; thus, an oxide semiconductor layer is obtained. The oxide semiconductor layer 462 can be dehydrated or dehydrogenated by the first heat treatment.

The heat treatment apparatus is not limited to an electric furnace and may be provided with a device that heats an object to be processed by thermal conduction or thermal radiation from a heater such as a resistance heater or the like. For example, an RTA (rapid thermal annealing) apparatus such as a GRTA (gas rapid thermal annealing) apparatus or an LRTA (lamp rapid thermal annealing) apparatus can be used. For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment for a short time.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, far preferably 7N (99.99999%) or more (that is, the concentration of impurities be 1 ppm or less, far preferably 0.1 ppm or less).

Further, depending on the condition of the first heat treatment or a material of the oxide semiconductor layer, the oxide semiconductor layer 462 might be crystallized to be a microcrystalline film or a polycrystalline film.

The first heat treatment of the oxide semiconductor layer can also be performed on the oxide semiconductor film before being processed into the island-like oxide semiconductor layer 462. In that case, the substrate is taken out from the heat apparatus after the first heat treatment, and then a photolithography step is performed thereon.

The example in which the heat treatment for dehydration and/or dehydrogenation on the oxide semiconductor layer is performed just after the formation of the oxide semiconductor layer 462 is described above. However, the heat treatment for dehydration and/or dehydrogenation may be performed after the source or drain electrode layer 465b is stacked on the oxide semiconductor layer or after the gate insulating layer 452 is formed over the source or drain electrode layer 465b as long as it is performed after the deposition of the oxide semiconductor layer.

Next, a conductive film is formed over the insulating layer 457 and the oxide semiconductor layer 462. After that, a resist mask is formed over the conductive film by a third photolithography step, the conductive film is selectively etched to form the source or drain electrode layer 465b and the wiring layer 468, and then, the resist mask is removed (see FIG. 8C). The source or drain electrode layer 465b and the wiring layer 468 may be each formed by a similar material and a similar step to the material and the step of each of the source or drain electrode layers 465a1 and 465a2.

In this embodiment, a 150-nm-thick titanium film is formed as each of the source or drain electrode layer 465b and the wiring layer 468 by a sputtering method. In this embodiment, since the source or drain electrode layers 465a1 and 465a2 and the source or drain electrode layer 465b are the titanium films which are the same as each other, etching selectivity between the source or drain electrode layer 465b and each of the source or drain electrode layers 465a1 and 465a2 cannot be provided. Therefore, in order to prevent the source or drain electrode layers 465a1 and 465a2 from being etched when the source or drain electrode layer 465b is etched, the wiring layer 468 is provided over the source or drain electrode layer 465a2 which is not covered with the oxide semiconductor layer 462. In the case where different materials which have high selectivity at the time of etching are used to form the source or drain electrode layers 465a1 and 465a2 and the source or drain electrode layer 465b, the wiring layer 468 by which the source or drain electrode layer 465a2 is protected at the time of etching is not necessarily provided The oxide semiconductor layer 462 may be partly etched off by the etching of the conductive film. Materials and the etching conditions are controlled as appropriate so as not to remove the oxide semiconductor layer 462 beyond necessity.

In this embodiment, since the Ti film is used as the conductive film and the In—Ga—Zn—O-based oxide semiconductor is used as the oxide semiconductor layer 462, an ammonium hydroxide/hydrogen peroxide mixture (a 31 wt % hydrogen peroxide solution:28 wt % ammonia water:water=5:2:2) is used as an etchant.

In the third photolithography step, in some cases, part of the oxide semiconductor layer 462 is etched, whereby an oxide semiconductor layer having a groove (a depression portion) may be formed. The resist mask used for forming the source or drain electrode layer 465b and the wiring layer 468 may be formed by an inkjet method. Formation of the resist mask by an inkjet method needs no photomask; thus, manufacturing cost can be reduced.

Next, the gate insulating layer 452 is formed over the insulating layer 457, the oxide semiconductor layer 462, the source or drain electrode layers 465a1 and 465a2, and the source or drain electrode layer 465b.

The gate insulating layer 452 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 452 from containing hydrogen as much as possible, it is preferable to form the gate insulating layer 452 by a sputtering method. In the case of forming a silicon oxide film by a sputtering method, a silicon target or a quartz target is used as a target, and oxygen or a mixed gas of oxygen and argon is used as a sputtering gas.

The gate insulating layer 452 may have a structure in which a silicon oxide layer and a silicon nitride layer are stacked in this order over the source or drain electrode layers 465a1 and 465a2 and the source or drain electrode layer 465b. In this embodiment, a 100-nm-thick silicon oxide film is formed as follows: the pressure is 0.4 Pa; the high-frequency power is 1.5 kW; the atmosphere is oxygen and argon (flow rate ratio of oxygen to argon is 25 sccm:25 sccm=1:1); and an RF sputtering method is used.

Figure 8D:
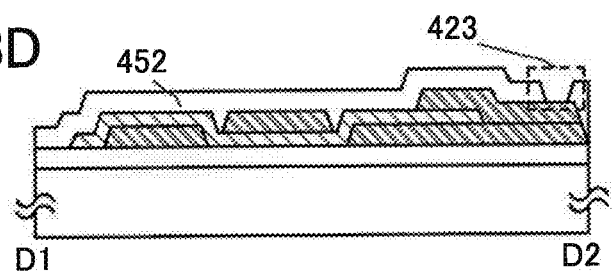

Next, a resist mask is formed by a fourth photolithography step, and etching is selectively performed to remove part of the gate insulating layer 452, so that an opening 423 reaching the wiring layer 438 is formed (see FIG. 8D). An opening reaching the source or drain electrode layer 465b may be formed when the opening 423 is formed, though not shown. In this embodiment, the opening reaching the source or drain electrode layer 465b is formed after stacking an interlayer insulating layer, and a wiring layer for electrical connection is formed in the opening.

Next, a conductive film is formed over the gate insulating layer 452 and the opening 423. After that, a fifth photolithography step is performed thereon, so that the gate electrode layer 461 (461a and 461b) and the wiring layer 464 are formed. Note that a resist mask may be formed by an inkjet method. Formation of the resist mask by an inkjet method needs no photomask; thus, manufacturing cost can be reduced.

The gate electrode layer 461 (461a and 461b) and the wiring layer 464 can be formed each to have a single-layer or stacked-layer structure using a metal material such as molybdenum, titanium, chromium, tantalum, tungsten, aluminum, copper, neodymium, or scandium, or an alloy material which contains any of these materials as its main component.

In this embodiment, a 150-nm-thick titanium film is formed as each of the gate electrode layer 461 (461a and 461b) and the wiring layer 464 by a sputtering method. Although the gate electrode layer 461 (461a and 461b) is shown as being divided in FIG. 8E, the gate electrode layer 461 (461a and 461b) is formed so as to overlap a torus-shaped void formed by the source or drain electrode layers 465a1 and 465a2 and the source or drain electrode layer 465b as shown in FIG. 7A.

Next, a second heat treatment (preferably at a temperature higher than or equal to 200° C. and lower than or equal to 400° C., for example, at a temperature higher than or equal to 250° C. and lower than or equal to 350° C.) is performed in an inert gas atmosphere or an oxygen gas atmosphere. In this embodiment, the second heat treatment is performed at 250° C. for one hour in a nitrogen atmosphere. The second heat treatment may be performed after a protective insulating layer or a planarization insulating layer is formed over the thin film transistor 460.

Furthermore, heat treatment may be performed at a temperature higher than or equal to 100° C. and lower than or equal to 200° C. for one hour to 30 hours both inclusive in an air atmosphere. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This heat treatment may be performed before the formation of the oxide insulating layer under a reduced pressure. Under the reduced pressure, the heat treatment time can be shortened.

Figure 8E:
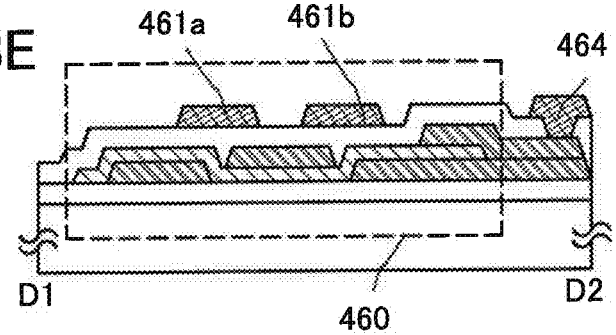

Through the above-described process, the thin film transistor 460 including the oxide semiconductor layer 462 in which the concentration of hydrogen, moisture, hydride, and hydroxide is reduced can be formed (see FIG. 8E). The thin film transistor 460 can be used as the thin film transistor used in each pixel of the pixel portion 1008 described in Embodiment 1.

A protective insulating layer or a planarization insulating layer for planarization may be provided over the thin film transistor 460. Although not shown, in this embodiment, an opening reaching the source or drain electrode layer 465*b* is formed in the gate insulating layer 452 and the protective insulating layer and/or the planarization insulating layer, and a wiring layer which is electrically connected to the source or drain electrode layer 465*b* is formed in the opening.

By removing residual moisture in the reaction atmosphere at the time of the film deposition of the oxide semiconductor film as described above, the concentration of hydrogen and hydride in the oxide semiconductor film can be reduced. Accordingly, the oxide semiconductor film can be stabilized.

In this manner, in a plurality of pixels included in a display portion of a liquid crystal display device including a thin film transistor using an oxide semiconductor layer, the off-state current can be suppressed. Accordingly, a period for holding voltage in a storage capacitor can be extended, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction. In this embodiment, the shape of a channel is circular and the source electrode layer and the drain electrode layer are formed using different layers, whereby the channel length can be decreased and the channel width can be increased. In this manner, a thin film transistor having a large channel width can be formed even in a relatively small area, which enables switching for large current. In addition, although the channel width is large, the off-state current is extremely small since the oxide semiconductor is highly purified.

Embodiment 3 can be implemented in appropriate combination with any of the structures described in the other embodiments.

Embodiment 4

Figure 9A:
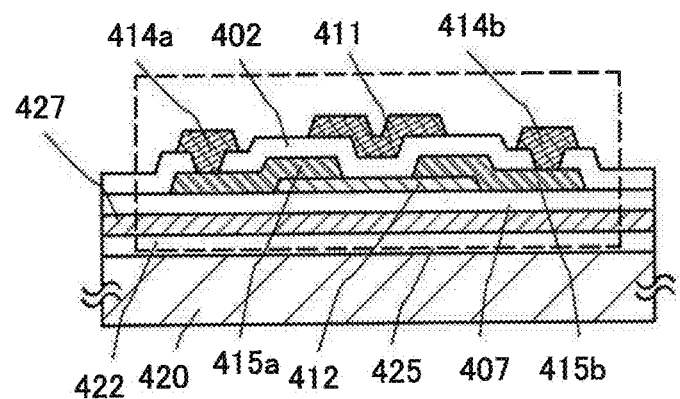
FIGS. 9A and 9B each illustrate a thin film transistor.
Figure 9B:
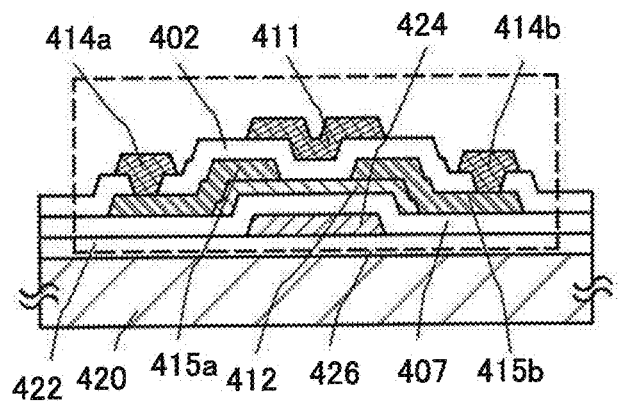

Thin film transistors in this embodiment are described using FIGS. 9A and 9B. In Embodiment 4, other examples of a thin film transistor which can be applied to a liquid crystal display device disclosed in this specification will be described. Note that Embodiment 2 can be applied to the same portions and the portions and steps having similar functions as/to Embodiment 2, and description thereof is not repeated. Further, a specific description for the same portions is omitted. Thin film transistors 425 and 426 described in this embodiment each can be used as a thin film transistor in each pixel of the pixel portion 1008 described in Embodiment 1.

FIGS. 9A and 9B illustrate examples of a cross-sectional structure of a thin film transistor. The thin film transistors 425 and 426 shown in FIGS. 9A and 9B each are a kind of thin film transistor having a structure in which an oxide semiconductor layer is interposed between a conductive layer and a gate electrode layer.

In FIGS. 9A and 9B, a silicon substrate 420 is used, and the thin film transistors 425 and 426 are provided over an insulating layer 422 provided over the silicon substrate 420, respectively.

In FIG. 9A, a conductive layer 427 is provided between the insulating layer 422 provided over the silicon substrate 420 and an insulating layer 407 so as to overlap at least an oxide semiconductor layer 412 entirely.

FIG. 9B is an example in which a conductive layer between the insulating layer 422 and the insulating layer 407 is processed by etching to be a conductive layer 424 and overlaps at least part including a channel region of the oxide semiconductor layer 412.

The conductive layers 427 and 424 each are formed by a metal material which is resistant to the temperature of a heat treatment performed later. An element selected from titanium (Ti), tantalum (Ta), tungsten (W), molybdenum (Mo), chromium (Cr), neodymium (Nd), and scandium (Sc), an alloy including any of the above elements as its component, an alloy film including a combination of any of these elements, a nitride including any of the above elements as its component, or the like can be used. A single layer structure or a stacked-layer structure may be used; for example, a single layer of a tungsten layer, a stacked-layer structure of a tungsten nitride layer and a tungsten layer, or the like can be used.

The potential of each of the conductive layers 427 and 424 may be equal to or different from the potential of the gate electrode layer 411 of each of the thin film transistors 425 and 426, respectively, and each of the conductive layers 427 and 424 may function as a second gate electrode layer. The potentials of the conductive layers 427 and 424 each may be a fixed potential such as GND or 0 V.

Electric characteristics of the thin film transistors 425 and 426 can be controlled by the conductive layers 427 and 424, respectively.

Embodiment 4 can be implemented in appropriate combination with any of the structures described in the other embodiments.

Embodiment 5

In Embodiment 5, an example of a thin film transistor which can be applied to a liquid crystal display device disclosed in this specification will be described.

A thin film transistor of this embodiment and an embodiment of a method for manufacturing the thin film transistor are described using FIGS. 10A to 10E.

FIGS. 10A to 10E illustrate an example of a cross-sectional structure of a thin film transistor. A thin film transistor 390 shown in FIGS. 10A to 10E is a kind of bottom-gate structure which is also referred to as an inverted staggered thin film transistor.

Although the thin film transistor 390 is described using a single-gate thin film transistor, a multi-gate thin film transistor including a plurality of channel formation regions can be formed as necessary.

Hereinafter, a process for manufacturing the thin film transistor 390 over a substrate 394 is described using FIGS. 10A to 10E.

First, a conductive film is formed over the substrate 394 having an insulating surface, and then, a first photolithography step is performed thereon, so that a gate electrode layer 391 is formed. It is preferable that an end portion of the gate electrode layer have a tapered shape because coverage with a gate insulating layer stacked thereover is improved. Note that a resist mask may be formed by an ink-jet method.

Formation of the resist mask by an inkjet method needs no photomask; thus, manufacturing cost can be reduced.

Although there is no particular limitation on a substrate which can be used as the substrate 394 having an insulating surface, it is necessary that the substrate 394 has at least heat resistance high enough to withstand heat treatment to be performed later.

For example, in the case where a glass substrate is used as the substrate 394, if the temperature of the heat treatment to be performed later is high, it is preferable to use a glass substrate whose strain point is 730° C. or higher. As the glass substrate, a glass material such as aluminosilicate glass, aluminoborosilicate glass, or barium borosilicate glass is used, for example. Note that by containing a larger amount of barium oxide (BaO) than boron oxide, a glass substrate is heat-resistant and of more practical use. Therefore, it is preferable that a glass substrate containing more BaO than $B_2O_3$ be used.

Note that a substrate formed of an insulator such as a ceramic substrate, a quartz glass substrate, or a sapphire substrate may be used instead of the glass substrate as the substrate 394. Alternatively, a crystallized glass substrate or the like may be used. Further alternatively, a plastic substrate or the like may be used as appropriate.

An insulating film which functions as a base film may be provided between the substrate 394 and the gate electrode layer 391. The base film has a function of preventing diffusion of an impurity element from the substrate 394, and can be formed with a single-layer structure or a stacked-layer structure using one or more of a silicon nitride film, a silicon oxide film, a silicon nitride oxide film, and a silicon oxynitride film.

The gate electrode layer 391 can be formed with a single-layer structure or a stacked-layer structure using a metal material such as molybdenum, titanium, chromium, tantalum, tungsten, aluminum, copper, neodymium, or scandium, or an alloy material containing any of these materials as a main component.

For example, as a two-layer structure of the gate electrode layer 391, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer. As a three-layer structure, a stack of a tungsten layer or a tungsten nitride layer, a layer of an alloy of aluminum and silicon or an alloy of aluminum and titanium, and a titanium nitride layer or a titanium layer is preferable. The gate electrode layer may also be formed using a light-transmitting conductive film. As an example of a material of the light-transmitting conductive film, a light-transmitting conductive oxide or the like can be given.

Next, a gate insulating layer 397 is formed over the gate electrode layer 391.

The gate insulating layer 397 can be formed with a single-layer structure or a stacked-layer structure using one or more of a silicon oxide layer, a silicon nitride layer, a silicon oxynitride layer, a silicon nitride oxide layer, and an aluminum oxide layer by a plasma CVD method, a sputtering method, or the like. In order to prevent the gate insulating layer 397 from containing hydrogen as much as possible, it is preferable to form the gate insulating layer 397 by a sputtering method. In the case of forming a silicon oxide film by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked in this order over the gate electrode layer 391. For example, a 100-nm-thick gate insulating layer is formed in such a manner that a silicon nitride layer ($SiN_y$ (y>0)) having a thickness of greater than or equal to 50 nm and less than or equal to 200 nm is formed by a sputtering method as a first gate insulating layer and then a silicon oxide layer ($SiO_x$ (x>0)) having a thickness of greater than or equal to 5 nm and less than or equal to 300 nm is stacked as a second gate insulating layer over the first gate insulating layer.

In order for the oxide semiconductor film not to contain hydrogen, a hydroxyl group, and moisture as much as possible in the gate insulating layer 397 and an oxide semiconductor film 393, it is preferable to preheat the substrate 394 provided with the gate electrode layer 391 or the substrate 394 provided with the gate electrode layer 391 and the gate insulating layer 397 in a preheating chamber of a sputtering apparatus before the film formation so that an impurity such as hydrogen or moisture adsorbed on the substrate 394 is eliminated, and perform exhaustion. The temperature of the preheating be higher than or equal to 100° C. and lower than or equal to 400° C., preferably higher than or equal to 150° C. and lower than or equal to 300° C. As an exhaustion unit provided in the preheating chamber, a cryopump is preferable. This preheating step is not necessarily performed. This preheating step may be performed in a similar manner on the substrate 394 with which a source electrode layer 395a and a drain electrode layer 395b shown in FIG. 10C are provided before an oxide insulating layer 396 is formed.

Figure 10A:
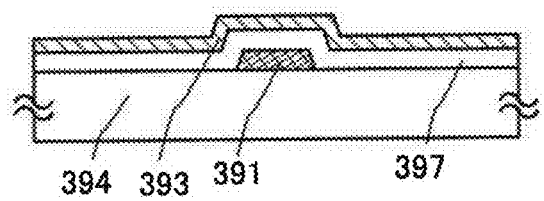
FIGS. 10A to 10E illustrate a method for manufacturing a thin film transistor.

Next, over the gate insulating layer 397, the oxide semiconductor film 393 is formed to a thickness greater than or equal to 2 nm and less than or equal to 200 nm, preferably greater than or equal to 5 nm and less than or equal to 30 nm by a sputtering method (see FIG. 10A).

Before the oxide semiconductor film 393 is formed by a sputtering method, it is preferable to perform reverse sputtering in which an argon gas is introduced and plasma is generated so that dust on a surface of the gate insulating layer 397 is removed. The reverse sputtering refers to a method in which, without application of a voltage to a target side, an RF power source is used for application of a voltage to a substrate side in an argon atmosphere to modify a surface. Instead of the argon atmosphere, a nitrogen atmosphere, a helium atmosphere, an oxygen atmosphere, or the like may be used.

The oxide semiconductor film 393 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 393 is formed by a sputtering method using an In—Ga—Zn—O-based oxide semiconductor target. Specifically, a target having a composition ratio of $In_2O_3$:$Ga_2O_3$:ZnO=1:1:1 [mol %] (that is, In:Ga:Zn=1:1:0.5 [atom %]) is used. Alternatively, a target having a composition ratio of In:Ga:Zn=1:1:1 [atom %] or In:Ga:Zn=1:1:2 [atom %] can be used. In this embodiment, the filling rate of the oxide semiconductor target is equal to or greater than 90% and equal to or less than 100%, preferably equal to or greater than 95% and equal to or less than 99.9%. With use of the oxide semiconductor target having high filling rate, the deposited oxide semiconductor film has high density. The atmosphere in the sputtering of the oxide semiconductor film 393 may be an atmosphere of a rare gas (typically argon), an oxygen atmosphere, or a mixed atmosphere of a rare gas (typically argon) and oxygen. The target may contain $SiO_2$ at 2 wt % or more and 10 wt % or less.

The oxide semiconductor film 393 is formed over the substrate 394 as follows: the substrate is held in the chamber with pressure reduced, and the substrate is heated to room temperature or a temperature lower than 400° C.; and residual moisture in the chamber is removed, a sputtering gas from which hydrogen and moisture are removed is introduced, and the above-described target is used. In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed using a cryopump, a hydrogen molecule, a compound including a hydrogen atom such as water ($H_2O$), a compound including a carbon atom, or the like is exhausted. Accordingly, the concentration of impurities included in the oxide semiconductor film formed in the chamber can be reduced. Moisture left in the chamber is removed by a cryopump in the sputtering film deposition, the substrate temperature at the time of film deposition of the oxide semiconductor film 393 can have a temperature equal to or higher than room temperature and lower than 400° C.

As an example of the film deposition condition, the following condition is employed: the distance between the substrate and the target is 100 mm; the pressure is 0.6 Pa; the direct current (DC) power supply is 0.5 kW; and the atmosphere is oxygen (the flow rate ratio of oxygen is 100%). It is preferable that a pulsed direct current (DC) power supply be used because powder substances (also referred to as particles or dust) generated in the film deposition can be reduced and the film thickness can be made uniform.

Examples of a sputtering method include an RF sputtering method in which a high-frequency power source is used as a sputtering power source, a DC sputtering method in which a DC power source is used, and a pulsed DC sputtering method in which a bias is applied in a pulsed manner. The RF sputtering method is mainly used in the case where an insulating film is formed, and the DC sputtering method is mainly used in the case where a metal film is formed.

A multi-target sputtering apparatus in which a plurality of targets which are formed of different materials from each other can be set may be used. With the multi-target sputtering apparatus, films of different materials can be stacked to be formed in the same chamber, or plural kinds of materials can be deposited by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge may be used.

Further, as the deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition may be used.

Figure 10B:
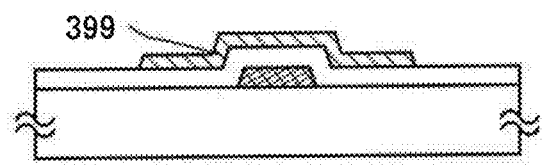
Figure 10C:
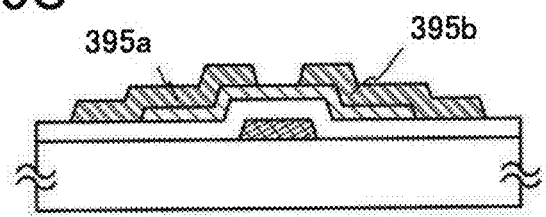

Next, the oxide semiconductor film is processed into an island-shaped oxide semiconductor layer 399 by a second photolithography step (see FIG. 10B). A resist mask for forming the island-shaped oxide semiconductor layer 399 may be formed using an ink jet method. Formation of the resist mask by an inkjet method needs no photomask; thus, manufacturing cost can be reduced.

In the case where a contact hole is formed in the gate insulating layer 397, a step thereof can be performed at the time of the formation of the oxide semiconductor layer 399.

For the etching of the oxide semiconductor film 393, either one or both of wet etching and dry etching may be employed.

As an etching gas for the dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel-plate RIE (reactive ion etching) method or an ICP (inductively coupled plasma) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a mixed solution of phosphoric acid, acetic acid, and nitric acid, an ammonium hydroxide/hydrogen peroxide mixture (a 31 wt % hydrogen peroxide solution:28 wt % ammonia water:water=5:2:2), or the like can be used. ITO07N (produced by KANTO CHEMICAL CO., INC.) may be used.

After the wet etching, the etchant is removed by cleaning together with the material which is etched off. Waste liquid of the etchant containing the removed material may be purified and the material contained in the waste liquid may be reused. The resources can be efficiently used and the cost can be reduced by collecting and reusing a material such as indium included in the oxide semiconductor from the waste liquid after the etching.

The etching conditions (such as an etchant, etching time, or temperature) are appropriately adjusted depending on a material so that the material can be etched into a desired shape.

Note that in that case, it is preferable to perform reverse sputtering before a conductive film is formed by the following step to remove a resist residue or the like from a surface of the oxide semiconductor layer 399 and the gate insulating layer 397.

Next, a conductive film is formed over the gate insulating layer 397 and the oxide semiconductor layer 399. The conductive film may be formed by a sputtering method or a vacuum evaporation method. As a material of the conductive film, an element selected from Al, Cr, Cu, Ta, Ti, Mo, and W; an alloy containing any of these elements as a component; an alloy film containing any of these elements in combination; and the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

Next, a resist mask is formed over the conductive film by a third photolithography step. After that, etching is selectively thereon, so that the source and drain electrode layers 395a and 395b are formed, and then, the resist mask is removed (see FIG. 10C).

Light exposure at the time of the formation of the resist mask in the third photolithography step may be performed using ultraviolet light, KrF laser light, or ArF laser light. The channel length L of a thin film transistor to be formed is determined by a pitch between a lower end of the source electrode layer and a lower end of the drain electrode layer, which are adjacent to each other over the oxide semiconductor layer 399. In the case where light exposure is performed for a channel length L of less than 25 nm, the light exposure at the time of the formation of the resist mask in the third photolithography step is performed using extreme ultraviolet light having an extremely short wavelength of several nanometers to several tens of nanometers. In the light exposure by extreme ultraviolet light, the resolution is high and the focus depth is large. Accordingly, the channel length L of the thin film transistor can be made to be greater than or equal to 10 nm and less than or equal to 1000 nm, the operation rate of a circuit can be increased, and low power consumption can be achieved by extremely small off-state current.

The oxide semiconductor layer 399 may be partly etched off by the etching of the conductive film. Materials and the etching conditions are controlled as appropriate so as not to remove the oxide semiconductor layer 399 at the time of etching of the conductive film.

In this embodiment, since the Ti film is used as the conductive film and the In—Ga—Zn—O-based oxide semiconductor is used as the oxide semiconductor layer 399, an ammonium hydroxide/hydrogen peroxide mixture (a mixture of ammonia, water, and a hydrogen peroxide solution) is used as an etchant.

In the third photolithography step, in some cases, part of the oxide semiconductor layer 399 is etched, whereby an oxide semiconductor layer having a groove (a depression portion) may be formed. The resist mask used for forming the source and drain electrode layers 395a and 395b may be formed by an inkjet method. Formation of the resist mask by an inkjet method needs no photomask; thus, manufacturing cost can be reduced.

In order to reduce the number of photomasks and steps in the photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of the manufacturing process can be realized.

After the removal of the resist mask, plasma treatment using a gas such as $N_2O$, $N_2$, or Ar may be performed to remove water or the like adsorbed on a surface of the oxide semiconductor layer 399 which is exposed. Plasma treatment may be performed using a mixed gas of oxygen and argon.

Figure 10D:
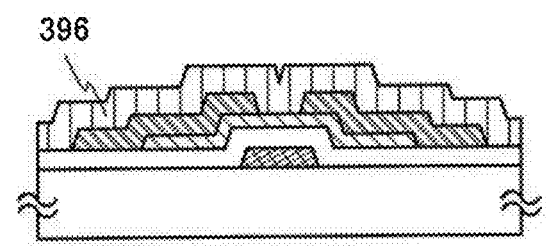

Next, the oxide insulating layer 396 is formed as an oxide insulating layer which functions as a protective insulating layer which is in contact with part of the oxide semiconductor layer (see FIG. 10D). In the case where the plasma treatment is performed, the oxide insulating layer 396 may be formed without exposure of the oxide semiconductor layer 399 to the air successively after the plasma treatment. In this embodiment, the oxide semiconductor layer 399 is in contact with the oxide insulating layer 396 in a region where the oxide semiconductor layer 399 overlaps neither the source electrode layer 395a nor the drain electrode layer 395b.

In this embodiment, as the oxide insulating layer 396, a silicon oxide layer including a defect is formed as follows: the substrate 394 over which the island-shaped oxide semiconductor layer 399, the source electrode layer 395a, and the drain electrode layer 395b are formed is heated at room temperature to a temperature lower than 100° C.; a sputtering gas containing high-purity oxygen from which hydrogen and moisture are removed is introduced; and a silicon semiconductor target is used.

For example, the silicon oxide film is formed in this embodiment as follows: a silicon target doped with boron (with a resistivity of 0.01 Ω·cm) and which has a purity of 6N is used; the distance between the target and the substrate (T-S distance) is 89 mm; the pressure is 0.4 Pa; the direct current (DC) power source is 6 kW; the atmosphere is oxygen (flow rate ratio of oxygen is 100%); and a pulsed DC sputtering method is used. The thickness of the silicon oxide film is 300 nm in this embodiment. Quartz (preferably quart) may be used instead of the silicon target to form the silicon oxide film.

In that case, it is preferable to remove residual moisture in the chamber in the deposition of the oxide insulating layer 396. This is in order to prevent the oxide semiconductor layer 399 and the oxide insulating layer 396 from containing hydrogen, a hydroxyl group, and/or moisture.

In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed using a cryopump, a hydrogen molecule, a compound including a hydrogen atom such as water ($H_2O$), or the like is exhausted. Accordingly, the concentration of impurities included in the oxide insulating layer 396 formed in the chamber can be reduced.

As the oxide insulating layer 396, instead of the silicon oxide layer, a silicon oxynitride layer, an aluminum oxide layer, an aluminum oxynitride layer, or the like can be used.

Further, heat treatment at 100° C. to 400° C. may be performed on the state where the oxide insulating layer 396 is in contact with the oxide semiconductor layer 399 after the formation of the oxide insulating layer 396. Since the oxide insulating layer 396 in this embodiment includes many defects, an impurity such as hydrogen, moisture, a hydroxyl group, or hydride included in the oxide semiconductor layer 399 is diffused into the oxide insulating layer 396 by this heat treatment, so that the impurity included in the oxide semiconductor layer 399 is further reduced.

Figure 10E:
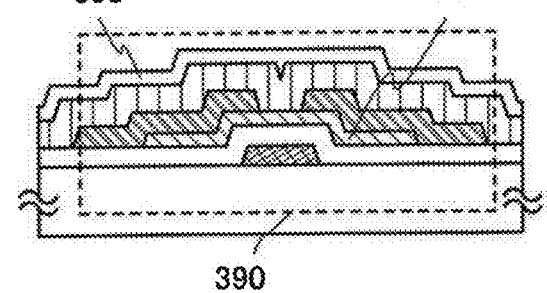
Figure 11A:
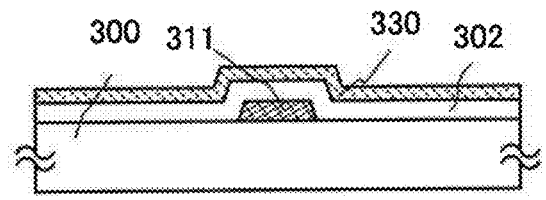
FIGS. 11A to 11E illustrate a method for manufacturing a thin film transistor.
Figure 11B:
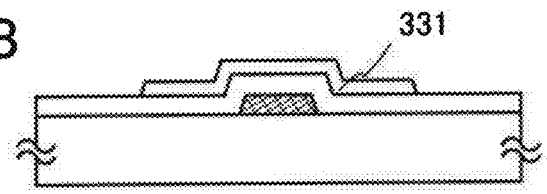
Figure 11C:
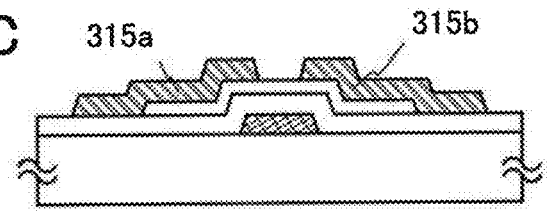
Figure 11D:
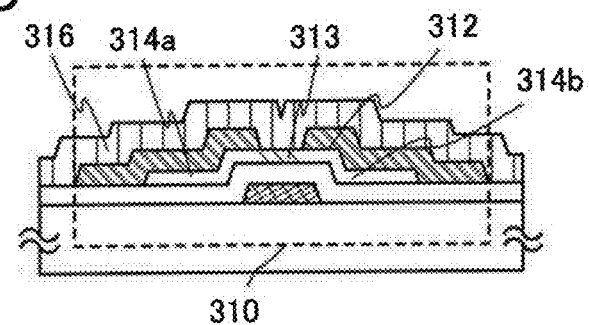
Figure 11E:
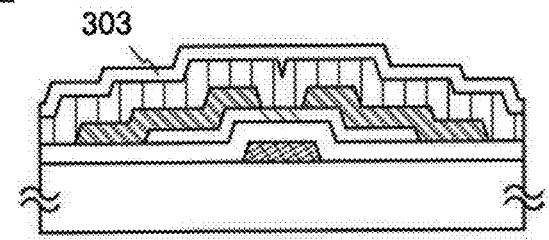
Figure 12A:
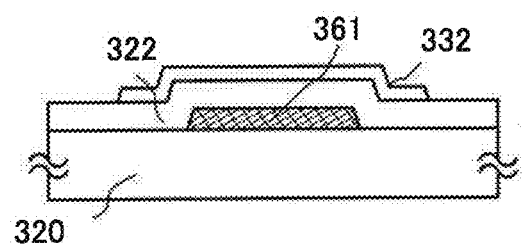
FIGS. 12A to 12D illustrate a method for manufacturing a thin film transistor.
Figure 12B:
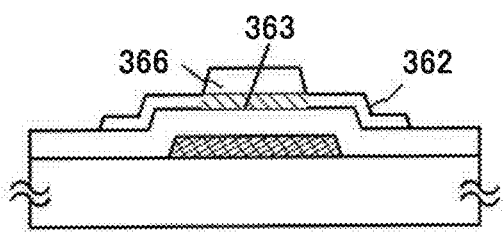
Figure 12C:
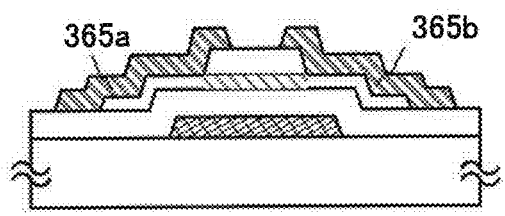
Figure 12D:
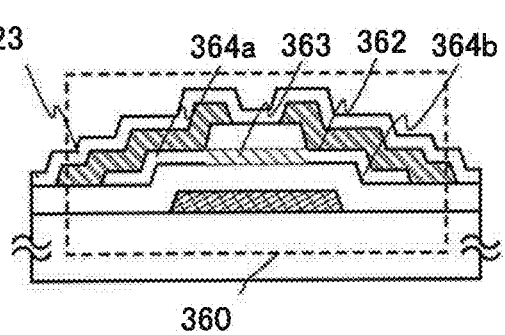

Through the above-described process, the thin film transistor 390 including an oxide semiconductor layer 392 in which the concentration of hydrogen, moisture, a hydroxyl group, and/or hydride is reduced can be formed (see FIG. 10E).

By removing residual moisture in the reaction atmosphere at the time of the film deposition of the oxide semiconductor film as described above, the concentration of hydrogen and hydride in the oxide semiconductor film can be reduced. Accordingly, the oxide semiconductor film can be stabilized.

A protective insulating layer may be provided over the oxide insulating layer. In this embodiment, a protective insulating layer 398 is formed over the oxide insulating layer 396. As the protective insulating layer 398, a silicon nitride film, a silicon nitride oxide film, an aluminum nitride film, or an aluminum nitride oxide film, or the like can be used. In this embodiment, the protective insulating layer 398 is formed using a silicon nitride film.

As the protective insulating layer 398, a silicon nitride film is formed by heating the substrate 394 over which layers up to and including the oxide insulating layer 396 are formed, to a temperature of 100° C. to 400° C., introducing a sputtering gas containing high-purity nitrogen from which hydrogen and moisture are removed, and using a target of silicon semiconductor. In that case also, it is preferable that residual moisture be removed from the treatment chamber in the formation of the protective insulating layer 398 as is the case of the oxide insulating layer 396.

In the case where the protective insulating layer 398 is formed, the substrate 394 is heated to a temperature of 100° C. to 400° C. at the time of the formation of the protective insulating layer 398, whereby hydrogen and/or moisture included in the oxide semiconductor layer can be diffused into the oxide insulating layer. In such a case, heat treatment after the formation of the oxide insulating layer 396 is not necessarily performed.

In the case where the silicon oxide layer is formed as the oxide insulating layer 396 and the silicon nitride layer is stacked as the protective insulating layer 398, the silicon oxide layer and the silicon nitride layer can be formed in the same chamber using a common silicon target. First, a sputtering gas containing oxygen is introduced and a silicon target placed inside the chamber is used, so that a silicon oxide layer is formed; and then, the sputtering gas is switched to a sputtering gas containing nitrogen and the same silicon target is used, so that a silicon nitride layer is formed. Since the silicon oxide layer and the silicon nitride layer can be formed in succession without exposure to the air, an impurity such as hydrogen or moisture can be prevented from being adsorbed on a surface of the silicon oxide layer. In that case, after silicon oxide layer is formed as the oxide insulating layer 396 and the silicon nitride layer is stacked as the protective insulating layer 398, heat treatment (at a temperature of 100° C. to 400° C.) for diffusing hydrogen or moisture included in the oxide semiconductor layer into the oxide insulating layer may be performed.

After the formation of the protective insulating layer, heat treatment may be performed at a temperature higher than or equal to 100° C. and lower than or equal to 200° C. in the air for 1 hour to 30 hours both inclusive. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. Further, this heat treatment may be performed before the formation of the oxide insulating film under a reduced pressure. Under the reduced pressure, the heat treatment time can be shortened. With this heat treatment, a normally-off thin film transistor (threshold voltage thereof is positive in the case of an re-channel transistor) can be obtained. Therefore, reliability of the liquid crystal display device can be improved.

Further, by removing residual moisture in the reaction atmosphere at the time of the formation of the oxide semiconductor layer, in which a channel formation region is to be formed, over the gate insulating layer, the concentration of hydrogen or hydride in the oxide semiconductor layer can be reduced.

The above-described process can be used for manufacturing a backplane (a substrate over which a thin film transistor is formed) of a liquid crystal display panel, an electroluminescent display panel, a display device using electronic ink, or the like. Since the above-described process is performed at a temperature lower than or equal to 400° C., the process can be applied to a manufacturing process using a glass substrate having a side longer than or equal to one meter and a thickness less than or equal to one millimeter. Further, since the whole process can be performed at a treatment temperature of 400° C. or lower, a display panel can be manufactured without consuming too much energy.

The off-state current can be reduced in the thin film transistor using an oxide semiconductor layer, manufactured as described above. Therefore, by using the thin film transistor in each of a plurality of pixels of a display portion of a liquid crystal display device, a period for holding voltage in a storage capacitor can be extended, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction.

Embodiment 5 can be implemented in appropriate combination with any of the structures described in the other embodiments.

Embodiment 6

A thin film transistor of this embodiment and an embodiment of a method for manufacturing the thin film transistor are described using FIGS. 11A to 11E.

In Embodiment 6, another example of a thin film transistor which can be applied to a liquid crystal display device disclosed in this specification will be described. A thin film transistor 310 described in this embodiment can be used as a thin film transistor in each pixel of the pixel portion 1008 described in Embodiment 1.

FIGS. 11A to 11E illustrate an example of a cross-sectional structure of a thin film transistor. The thin film transistor 310 shown in FIGS. 11A to 11E is a kind of bottom-gate structure which is also referred to as an inverted staggered thin film transistor.

Although the thin film transistor 310 is described using a single-gate thin film transistor, a multi-gate thin film transistor including a plurality of channel formation regions can be formed as necessary.

Hereinafter, a process for manufacturing the thin film transistor 310 over a substrate 300 is described using FIGS. 11A to 11E.

First, a conductive film is formed over the substrate 300 having an insulating surface, and then, a first photolithography step is performed thereon, so that a gate electrode layer 311 is formed. Note that a resist mask may be formed by an ink-jet method. Formation of the resist mask by an inkjet method needs no photomask; thus, manufacturing cost can be reduced.

Although there is no particular limitation on a substrate which can be used as the substrate 300 having an insulating surface, it is necessary that the substrate 300 has at least heat resistance high enough to withstand heat treatment to be performed later.

For example, in the case where a glass substrate is used as the substrate 300, if the temperature of the heat treatment to be performed later is high, it is preferable to use a glass substrate whose strain point is 730° C. or higher. As the glass substrate, a glass material such as aluminosilicate glass, aluminoborosilicate glass, or barium borosilicate glass is used, for example. Note that by containing a larger amount of barium oxide (BaO) than boron oxide, a glass substrate is heat-resistant and of more practical use. Therefore, it is preferable that a glass substrate containing more BaO than $B_2O_3$ be used.

Note that a substrate formed of an insulator such as a ceramic substrate, a quartz glass substrate, or a sapphire substrate may be used instead of the glass substrate as the substrate 300. Alternatively, a crystallized glass substrate or the like may be used.

An insulating film which functions as a base film may be provided between the substrate 300 and the gate electrode layer 311. The base film has a function of preventing diffusion of an impurity element from the substrate 300, and can be formed with a single-layer structure or a stacked-layer structure using one or more of a silicon nitride film, a silicon oxide film, a silicon nitride oxide film, and a silicon oxynitride film.

The gate electrode layer 311 can be formed with a single-layer structure or a stacked-layer structure using a metal material such as molybdenum, titanium, chromium, tantalum, tungsten, aluminum, copper, neodymium, or scandium, or an alloy material containing any of these materials as a main component.

For example, as a two-layer structure of the gate electrode layer 311, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Next, a gate insulating layer 302 is formed over the gate electrode layer 311.

The gate insulating layer 302 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed by a plasma CVD method using $SiH_4$, oxygen, and nitrogen as a deposition gas. In this embodiment, the thickness of the gate insulating layer 302 is greater than or equal to 100 nm and less than or equal to 500 nm. In the case of a stacked-layer structure, a first gate insulating layer with a thickness greater than or equal to 50 nm and less than or equal to 200 nm and a second gate insulating layer with a thickness greater than or equal to 5 nm and less than or equal to 300 nm are stacked on the first gate insulating layer.

In this embodiment, a silicon oxynitride layer having a thickness of 100 nm or less is formed by a plasma CVD method as the gate insulating layer 302.

Next, over the gate insulating layer 302, an oxide semiconductor film 330 is formed by a sputtering method to a thickness greater than or equal to 2 nm and less than or equal to 200 nm, preferably greater than or equal to 5 nm and less than or equal to 30 nm. Note that an appropriate thickness differs depending on an oxide semiconductor material, and the thickness may be set as appropriate depending on the material. A cross-sectional view in this step is FIG. 11A.

Before the oxide semiconductor film 330 is formed by a sputtering method, it is preferable to perform reverse sputtering in which an argon gas is introduced and plasma is generated so that dust on a surface of the gate insulating layer 302 is removed. Instead of the argon atmosphere, a nitrogen atmosphere, a helium atmosphere, an oxygen atmosphere, or the like may be used.

The oxide semiconductor film 330 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 330 is formed by a sputtering method using an In—Ga—Zn—O-based oxide semiconductor target. Specifically, a target having a composition ratio of $In_2O_3$:$Ga_2O_3$:ZnO=1:1:1 [mol %] (that is, In:Ga:Zn=1:1:0.5 [atom %]) is used. Alternatively, a target having a composition ratio of In:Ga:Zn=1:1:1 [atom %] or In:Ga:Zn=1:1:2 [atom %] can be used. In this embodiment, the filling rate of the oxide semiconductor target is equal to or greater than 90% and equal to or less than 100%, preferably equal to or greater than 95% and equal to or less than 99.9%. With use of the oxide semiconductor target having high filling rate, the deposited oxide semiconductor film has high density. The target may contain $SiO_2$ at 2 wt % or more and 10 wt % or less. The atmosphere in the sputtering of the oxide semiconductor film 330 may be an atmosphere of a rare gas (typically argon), an oxygen atmosphere, or a mixed atmosphere of a rare gas and oxygen.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film 330.

The sputtering is performed by holding the substrate in the chamber with pressure reduced at a substrate temperature higher than or equal to 100° C. and lower than or equal to 600° C., preferably higher than or equal to 200° C. and lower than or equal to 400° C. By heating the substrate in the film deposition, the concentration of impurities contained in the oxide semiconductor film can be decreased. Further, damage by the sputtering can be suppressed. Then, residual moisture in the chamber is removed, a sputtering gas from which hydrogen and moisture are removed is introduced, and the above-described target is used, so that the oxide semiconductor film 330 is formed over the substrate 300. In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed using a cryopump, a hydrogen molecule, a compound including a hydrogen atom such as water ($H_2O$), a compound including a carbon atom, or the like is exhausted. Accordingly, the concentration of impurities included in the oxide semiconductor film formed in the chamber can be reduced.

As an example of the film deposition condition, the following condition is employed: the distance between the substrate and the target is 100 mm; the pressure is 0.6 Pa; the direct current (DC) power supply is 0.5 kW; and the atmosphere is oxygen (the flow rate ratio of oxygen is 100%). It is preferable that a pulsed direct current (DC) power supply be used because powder substances (also referred to as particles or dust) generated in the film deposition can be reduced and the film thickness can be made uniform.

Next, the oxide semiconductor film 330 is processed into an island-shaped oxide semiconductor layer 331 by a second photolithography step. A resist mask for forming the island-shaped oxide semiconductor layer may be formed using an ink jet method. Formation of the resist mask by an inkjet method needs no photomask; thus, manufacturing cost can be reduced.

Next, a first heat treatment is performed on the oxide semiconductor layer 331. The oxide semiconductor layer 331 can be dehydrated or dehydrogenated by the first heat treatment. The temperature of the first heat treatment is higher than or equal to 400° C. and lower than or equal to 750° C., preferably higher than or equal to 400° C. and lower than the strain point of the substrate. In this embodiment, the substrate is put in an electric furnace which is a kind of heat treatment apparatus and heat treatment is performed on the oxide semiconductor layer at 450° C. for one hour in a nitrogen atmosphere, and then, the temperature is reduced to room temperature without exposure to the air and water or hydrogen is prevented from entering the oxide semiconductor layer; thus, the oxide semiconductor layer 331 is obtained (see FIG. 11B).

The heat treatment apparatus is not limited to an electric furnace and may be provided with a device that heats an object to be processed by thermal conduction or thermal radiation from a heater such as a resistance heater or the like. For example, an RTA (rapid thermal annaling) apparatus such as a GRTA (gas rapid thermal annealing) apparatus or an LRTA (lamp rapid thermal annealing) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with the object to be processed, by heat treatment, such as nitrogen or a rare gas such as argon is used.

For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment for a short time.

In the first heat treatment, it is preferable that water, hydrogen, or the like be not contained in nitrogen or a rare gas such as helium, neon, or argon. It is preferable that nitrogen or a rare gas such as helium, neon, or argon which is introduced into the heat treatment apparatus have a purity of 6N (99.9999%) or more, far preferably 7N (99.99999%) or more (that is, the concentration of impurities be 1 ppm or less, far preferably 0.1 ppm or less).

By the first heat treatment, hydrogen and/or the like contained in the oxide semiconductor layer 331 can be removed and oxygen loss is generated, so that the oxide semiconductor layer 331 becomes an n-type semiconductor (a semiconductor with resistance reduced). Further, depending on the condition of the first heat treatment or a material of the oxide semiconductor layer 331, the oxide semiconductor layer 331 might be crystallized to be a microcrystalline film or a polycrystalline film. For example, the oxide semiconductor layer may be crystallized to be a microcrystalline oxide semiconductor film in which the degree of crystallization is greater than or equal to 90% or greater than or equal to 80%. Further, depending on the condition of the first heat treatment or the material of the oxide semiconductor layer 331, the oxide semiconductor layer 331 may be an amorphous oxide semiconductor film which does not contain crystalline components. The oxide semiconductor layer 331 may become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

The first heat treatment of the oxide semiconductor layer can also be performed on the oxide semiconductor film 330 before being processed into the island-like oxide semiconductor layer 331. In that case, the substrate is taken out from the heat apparatus after the first heat treatment, and then a photolithography step is performed thereon.

The heat treatment for dehydration and/or dehydrogenation may be performed after a source electrode and a drain electrode are stacked on the oxide semiconductor layer or after a protective insulating film is formed over a source electrode and a drain electrode as long as it is performed after the deposition of the oxide semiconductor layer.

In the case where a contact hole is formed in the gate insulating layer 302, a step thereof can be performed before or after the heat treatment for dehydration and/or dehydrogenation is performed on the oxide semiconductor film 330 or the oxide semiconductor layer 331.

For the etching of the oxide semiconductor film, dry etching may be employed as well as wet etching.

The etching conditions (such as an etchant, etching time, or temperature) are appropriately adjusted depending on a material so that the material can be etched into a desired shape.

Next, a conductive film is formed over the gate insulating layer 302 and the oxide semiconductor layer 331. The conductive film may be formed by a sputtering method or a vacuum evaporation method. As a material of the conductive film, an element selected from Al, Cr, Cu, Ta, Ti, Mo, and W; an alloy containing any of these elements as a component; an alloy film containing any of these elements in combination; and the like can be given. Further, one or more materials selected from manganese, magnesium, zirconium, beryllium, and yttrium may be used. Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In the case where heat treatment is performed after the deposition of the conductive film, it is preferable that the conductive film have heat resistance high enough to withstand the heat treatment.

Next, a resist mask is formed over the conductive film by a third photolithography step. After that, etching is selectively thereon, so that a source and drain electrode layers 315a and 315b are formed, and then, the resist mask is removed (see FIG. 11C).

Light exposure at the time of the formation of the resist mask in the third photolithography step may be performed using ultraviolet light, KrF laser light, or ArF laser light. The channel length L of a thin film transistor to be formed is determined by a pitch between a lower end of the source electrode layer and a lower end of the drain electrode layer, which are adjacent to each other over the oxide semiconductor layer 331. In the case where light exposure is performed for a channel length L of less than 25 nm, the light exposure at the time of the formation of the resist mask in the third photolithography step is performed using extreme ultraviolet light having an extremely short wavelength of several nanometers to several tens of nanometers. In the light exposure by extreme ultraviolet light, the resolution is high and the focus depth is large. Accordingly, the channel length L of the thin film transistor can be made to be greater than or equal to 10 nm and less than or equal to 1000 nm, the operation rate of a circuit can be increased, and low power consumption can be achieved by extremely small off-state current.

Materials and the etching conditions are controlled as appropriate so as not to remove the oxide semiconductor layer 331 at the time of etching of the conductive film.

In this embodiment, since the Ti film is used as the conductive film and the In—Ga—Zn—O-based oxide semiconductor is used as the oxide semiconductor layer 331, an ammonium hydroxide/hydrogen peroxide mixture (a mixture of ammonia, water, and a hydrogen peroxide solution) is used as an etchant.

In the third photolithography step, in some cases, part of the oxide semiconductor layer 331 is etched, whereby an oxide semiconductor layer having a groove (a depression portion) may be formed. The resist mask used for forming the source and drain electrode layers 315a and 315b may be formed by an inkjet method. Formation of the resist mask by an inkjet method needs no photomask; thus, manufacturing cost can be reduced.

Further, an oxide conductive layer may be formed between the oxide semiconductor layer and the source and drain electrode layers. The oxide conductive layer and the metal layer for forming the source and drain electrode layers can be formed successively. The oxide conductive layer can function as a source and drain regions.

By providing the oxide conductive layer as the source region and the drain region between the oxide semiconductor layer and the source and drain electrode layers, the resistance of the source region and the drain region can be decreased and the transistor can be operated at high speed.

In order to reduce the number of photomasks and steps in the photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of the manufacturing process can be realized.

Next, plasma treatment using a gas such as $N_2O$, $N_2$, or Ar may be performed to remove water or the like adsorbed on a surface of the oxide semiconductor layer which is exposed. Plasma treatment may be performed using a mixed gas of oxygen and argon.

After the plasma treatment, an oxide insulating layer 316 which functions as a protective insulating film and is in contact with part of the oxide semiconductor layer is formed without exposure to the air.

The oxide insulating layer 316 can be formed to a thickness at least 1 nm by a method by which an impurity such as water or hydrogen does not enter the oxide insulating layer 316, such as a sputtering method as appropriate. When hydrogen is contained in the oxide insulating layer 316, entry of the hydrogen to the oxide semiconductor layer or extraction of oxygen in the oxide semiconductor layer by hydrogen may be caused, thereby making the backchannel of the oxide semiconductor layer n-type (making the resistance thereof low), so that a parasitic channel may be formed. Therefore, it is important that a formation method in which hydrogen is used as little as possible is employed such that the oxide insulating layer 316 contains hydrogen as little as possible.

In this embodiment, a 200-nm-thick silicon oxide film is deposited as the oxide insulating layer 316 by a sputtering method. The substrate temperature at the time of film deposition may be higher than or equal to room temperature and lower than or equal to 300° C. and in this embodiment, is 100° C. The silicon oxide film can be formed with a sputtering method in a rare gas (typically argon) atmosphere, an oxygen atmosphere, or a mixed atmosphere containing a rare gas and oxygen. As a target, a silicon oxide target or a silicon target may be used. For example, with the use of a silicon target, silicon oxide can be deposited by a sputtering method under an atmosphere of oxygen and nitrogen. As the oxide insulating layer 316 which is formed in contact with the oxide semiconductor layer whose resistance is reduced, an inorganic insulating film which does not include impurities such as moisture, a hydrogen ion, and $OH^-$ and blocks entry of these from the outside is used. Typically, a silicon oxide film, a silicon oxynitride film, an aluminum oxide film, an aluminum oxynitride film, or the like is used.

In that case, it is preferable to remove residual moisture in the chamber in the deposition of the oxide insulating layer 316. This is in order to prevent the oxide semiconductor layer 331 and the oxide insulating layer 316 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used.

In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 316 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 316.

Next, a second heat treatment (preferably at a temperature higher than or equal to 200° C. and lower than or equal to 400° C., for example, at a temperature higher than or equal to 250° C. and lower than or equal to 350° C.) is performed in an inert gas atmosphere or an oxygen gas atmosphere. For example, the second heat treatment is performed at 250° C. for one hour in a nitrogen atmosphere. With the second heat treatment, heat is applied on the state where part of the oxide semiconductor layer (the channel formation region) is in contact with the oxide insulating layer 316.

Through the above process, heat treatment for dehydration and/or dehydrogenation is performed on the deposited oxide semiconductor film to lower the resistance, and then, a part of the oxide semiconductor film is selectively made to include excessive oxygen. As a result, a channel formation region 313 overlapping the gate electrode layer 311 becomes i-type, a high-resistance source region 314a which overlaps the source electrode layer 315a and is formed using a low-resistance oxide semiconductor, and a high-resistance drain region 314b which overlaps the drain electrode layer 315b and is formed using a low-resistance oxide semiconductor are formed in a self-aligned manner. Through the above steps, the thin film transistor 310 is formed (see FIG. 11D).

Furthermore, heat treatment at a temperature higher than or equal to 100° C. and lower than or equal to 200° C. in the air for 1 hour to 30 hours both inclusive may be performed. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. Further, this heat treatment may be performed before the formation of the oxide insulating film under a reduced pressure. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved. Further, by using a silicon oxide layer containing many defects as the oxide insulating layer, impurities such as hydrogen, moisture, a hydroxyl group, or hydride contained in the oxide semiconductor layer are diffused into the oxide insulating layer by this heat treatment to further reduce the impurities contained in the oxide semiconductor layer.

The high-resistance drain region 314b (or the high-resistance source region 314a) is formed in a portion of the oxide semiconductor layer which overlaps the drain electrode layer 315b (or the source electrode layer 315a), so that the reliability of the thin film transistor can be increased. Specifically, with the formation of the high-resistance drain region 314b, the conductivity can be gradually varied from the drain electrode layer 315b to the high-resistance drain region 314b and the channel formation region 313 in the transistor. Therefore, in the case where the thin film transistor operates using the drain electrode layer 315b connected to a wiring for supplying a high power supply potential VDD, the high-resistance drain region serves as a buffer and a high electric field is not applied locally even if a high electric field is applied between the gate electrode layer 311 and the drain electrode layer 315b, so that the withstand voltage of the transistor can be improved.

The high-resistance source region and the high-resistance drain region may be formed at all the depths in the film thickness direction in the oxide semiconductor layer in the case where the oxide semiconductor layer is as thin as 15 nm or less; whereas in the case where the oxide semiconductor layer is as thick as a thickness greater than or equal to 30 nm and less than or equal to 50 nm, parts of the oxide semiconductor layer, that is, regions of the oxide semiconductor layer, which are in contact with the source and drain electrode layers and the vicinity thereof may be reduced in the resistance, so that the high-resistance source region and the high-resistance drain region are formed and a region of the oxide semiconductor layer, near the gate insulating layer can be made to be i-type.

A protective insulating layer may be formed over the oxide insulating layer 316. For example, a silicon nitride film is formed by an RF sputtering method. An RF sputtering method is preferable as a method for forming a protective insulating layer because it has high productivity. As the protective insulating layer, an inorganic insulating film which does not contain impurities such as moisture, a hydrogen ion, and OH$^-$ and blocks entry of these from the outside is used; a silicon nitride film, an aluminum nitride film, a silicon nitride oxide film, an aluminum nitride oxide film, or the like is used. In this embodiment, the protective insulating layer 303 is formed using a silicon nitride film as the protective insulating layer (see FIG. 11E).

In this embodiment, as the protective insulating layer 303, a silicon nitride film is formed by heating the substrate 300 over which layers up to and including the oxide insulating layer 316 are formed, to a temperature of 100° C. to 400° C., introducing a sputtering gas containing high-purity nitrogen from which hydrogen and moisture are removed, and using a target of silicon semiconductor. In that case also, it is preferable that residual moisture be removed from the treatment chamber in the formation of the protective insulating layer 303 as is the case of the oxide insulating layer 316.

A planarization insulating layer for planarization may be provided over the protective insulating layer 303.

The off-state current can be reduced in each of a plurality of pixels of a display portion of a liquid crystal display device using the thin film transistor using an oxide semiconductor layer as described above. Therefore, a period for holding voltage in a storage capacitor can be extended, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction.

Embodiment 6 can be implemented in appropriate combination with any of the structures described in the other embodiments.

Embodiment 7

A thin film transistor of this embodiment and an embodiment of a method for manufacturing the thin film transistor are described using FIGS. 12A to 12D.

In Embodiment 7, another example of a thin film transistor which can be applied to a liquid crystal display device disclosed in this specification will be described. A thin film transistor 360 described in this embodiment can be used as a thin film transistor in each pixel of the pixel portion 1008 described in Embodiment 1.

FIGS. 12A to 12D illustrate an example of a cross-sectional structure of a thin film transistor. The thin film transistor 360 shown in FIGS. 12A to 12D is a kind of bottom-gate structure called a channel-protective structure (also referred to as a channel-stop structure) and is also referred to as an inverted staggered thin film transistor.

Although the thin film transistor 360 is described using a single-gate thin film transistor, a multi-gate thin film transistor including a plurality of channel formation regions can be formed as necessary.

Hereinafter, a process for manufacturing the thin film transistor 360 over a substrate 320 is described using FIGS. 12A to 12D.

First, a conductive film is formed over the substrate 320 having an insulating surface, a first photolithography step is performed to form a resist mask, and the conductive film is selectively etched by using the resist mask, so that a gate electrode layer 361 is formed. After that, the resist mask is removed. Note that the resist mask may be formed by an ink-jet method. Formation of the resist mask by an inkjet method needs no photomask; thus, manufacturing cost can be reduced.

The gate electrode layer 361 can be formed with a single-layer structure or a stacked-layer structure using a metal material such as molybdenum, titanium, chromium, tantalum, tungsten, aluminum, copper, neodymium, or scandium, or an alloy material containing any of these materials as a main component.

Next, a gate insulating layer 322 is formed over the gate electrode layer 361.

In this embodiment, a silicon oxynitride layer having a thickness of 100 nm or less is formed by a plasma CVD method as the gate insulating layer 322.

Next, an oxide semiconductor film having a thickness greater than or equal to 2 nm and less than or equal to 200 nm is formed over the gate insulating layer 322, and is processed into an island-shaped oxide semiconductor layer 332 by a second photolithography step. In this embodiment, the oxide semiconductor film is formed by a sputtering method using an In—Ga—Zn—O-based oxide semiconductor target.

In that case, it is preferable to remove residual moisture in the chamber in the deposition of the oxide semiconductor film. This is in order to prevent the oxide semiconductor film from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cry opump, a hydrogen molecule, a compound including a hydrogen atom such as water ($H_2O$), or the like, for example, is exhausted. Accordingly, the concentration of impurities included in the oxide semiconductor film formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

Next, dehydration and/or dehydrogenation of the oxide semiconductor layer are/is performed. The temperature of the first heat treatment for dehydration and/or dehydrogenation is higher than or equal to 400° C. and lower than or equal to 750° C., preferably higher than or equal to 400° C. and lower than the stain point of the substrate. In this embodiment, the substrate is put in an electric furnace which is a kind of heat treatment apparatus and heat treatment is performed on the oxide semiconductor layer at 450° C. for one hour in a nitrogen atmosphere, and then, water or hydrogen is prevented from entering the oxide semiconductor layer, without exposure to the air; thus, an oxide semiconductor layer 332 is obtained (see FIG. 12A).

Next, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

Next, an oxide insulating layer is formed over the gate insulating layer 322 and the oxide semiconductor layer 332. After that, a resist mask is formed by a third photolithography step, and etching is performed selectively thereon, so that an oxide insulating layer 366 is formed. After that, the resist mask is removed.

In this embodiment, a 200-nm-thick silicon oxide film is deposited as the oxide insulating layer 366 by a sputtering method. The substrate temperature at the time of film deposition may be higher than or equal to room temperature and lower than or equal to 300° C. and in this embodiment, is 100° C. The silicon oxide film can be formed with a sputtering method in a rare gas (typically argon) atmosphere, an oxygen atmosphere, or a mixed atmosphere containing a rare gas and oxygen. As a target, a silicon oxide target or a silicon target may be used. For example, with the use of a silicon target, silicon oxide can be deposited by a sputtering method under an atmosphere of oxygen and nitrogen. As the oxide insulating layer 366 which is formed in contact with the oxide semiconductor layer, an inorganic insulating film which does not include impurities such as moisture, a hydrogen ion, and OH⁻ and blocks entry of these from the outside is used. Typically, a silicon oxide film, a silicon oxynitride film, an aluminum oxide film, an aluminum oxynitride film, or the like is used.

In that case, it is preferable to remove residual moisture in the chamber in the deposition of the oxide insulating layer 366. This is in order to prevent the oxide semiconductor layer 332 and the oxide insulating layer 366 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide insulating layer 366 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 366.

Next, a second heat treatment (preferably at a temperature higher than or equal to 200° C. and lower than or equal to 400° C., for example, at a temperature higher than or equal to 250° C. and lower than or equal to 350° C.) is performed in an inert gas atmosphere or an oxygen gas atmosphere. For example, the second heat treatment is performed at 250° C. for one hour in a nitrogen atmosphere. With the second heat treatment, heat is applied on the state where part of the oxide semiconductor layer (the channel formation region) is in contact with the oxide insulating layer 366.

In this embodiment, the oxide semiconductor layer 332 which is provided with the oxide insulating layer 366 and is partly exposed is further subjected to heat treatment in a nitrogen atmosphere or an inert gas atmosphere or under a reduced pressure. By the heat treatment in a nitrogen atmosphere or an inert gas atmosphere or under a reduced pressure, the resistance of the exposed region of the oxide semiconductor layer 332, which is not covered by the oxide insulating layer 366 can be reduced. For example, heat treatment is performed at 250° C. in a nitrogen atmosphere for one hour.

With the heat treatment on the oxide semiconductor layer 332 provided with the oxide insulating layer 366 in a nitrogen atmosphere, the resistance of the exposed region of the oxide semiconductor layer 332 is reduced, so that an oxide semiconductor layer 362 including regions with different resistances (indicated as a shaded region and a white region in FIG. 12B) is formed.

Next, a conductive film is formed over the gate insulating layer 322, the oxide semiconductor layer 362, and the oxide insulating layer 366. After that, a resist mask is formed by a fourth photolithography step, and selective etching is performed thereon, so that a source electrode layer 365a and a drain electrode layer 365b are formed. After that, the resist mask is removed (see FIG. 12C).

The source electrode layer 365a and the drain electrode layer 365b each are formed by an element selected from Al, Cr, Cu, Ta, Ti, Mo, and W, an alloy including any of the above elements as its component, an alloy film including a combination of any of these elements, or the like can be used. A single layer structure or a stacked-layer structure including two or more layer may be used as the conductive film.

Through the above process, a part of the oxide semiconductor film is selectively made to include excessive oxygen. As a result, a channel formation region 363 overlapping the gate electrode layer 361 becomes i-type, and a high-resistance source region 364a which overlaps the source electrode layer 365a and a high-resistance drain region 364b which overlaps the drain electrode layer 365b are formed in a self-aligned manner. Through the above steps, the thin film transistor 360 is formed.

Furthermore, heat treatment at a temperature higher than or equal to 100° C. and lower than or equal to 200° C. in the air for 1 hour to 30 hours both inclusive may be performed. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. Further, this heat treatment may be performed before the formation of the oxide insulating film under a reduced pressure. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved.

The high-resistance drain region 364b (or the high-resistance source region 364a) is formed in a portion of the oxide semiconductor layer which overlaps the drain electrode layer 365b (or the source electrode layer 365a), so that the reliability of the thin film transistor can be increased. Specifically, with the formation of the high-resistance drain region 364b, the conductivity can be gradually varied from the drain electrode layer 365b to the high-resistance drain region 364b and the channel formation region 363 in the transistor. Therefore, in the case where the thin film transistor operates using the drain electrode layer 365b connected to a wiring for supplying a high power supply potential VDD, the high-resistance drain region serves as a buffer and a high electric field is not applied locally even if a high electric field is applied between the gate electrode layer 361 and the drain electrode layer 365b, so that the withstand voltage of the transistor can be improved.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 12D).

An oxide insulating layer may be formed over the source electrode layer 365a, the drain electrode layer 365b, and the oxide insulating layer 366, and the protective insulating layer 323 may be stacked over the oxide insulating layer.

The off-state current can be reduced in each of a plurality of pixels of a display portion of a liquid crystal display device using the thin film transistor using an oxide semiconductor layer as described above. Therefore, a period for holding voltage in a storage capacitor can be extended, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction.

Embodiment 7 can be implemented in appropriate combination with any of the structures described in the other embodiments.

Embodiment 8

In Embodiment 8, another example of a thin film transistor which can be applied to a liquid crystal display device disclosed in this specification will be described. A thin film transistor 350 described in this embodiment can be used as a thin film transistor in each pixel of the pixel portion 1008 described in Embodiment 1.

A thin film transistor of this embodiment and an embodiment of a method for manufacturing the thin film transistor are described using FIGS. 13A to 13D.

Although the thin film transistor 350 is described using a single-gate thin film transistor, a multi-gate thin film transistor including a plurality of channel formation regions can be formed as necessary.

Hereinafter, a process for manufacturing the thin film transistor 350 over a substrate 340 is described using FIGS. 13A to 13D.

First, a conductive film is formed over the substrate 340 having an insulating surface, and a first photolithography step is performed, so that a gate electrode layer 351 is formed. In this embodiment, a 150-nm-thick tungsten film is formed by a sputtering method as the gate electrode layer 351.

Next, a gate insulating layer 342 is formed over the gate electrode layer 351. In this embodiment, a silicon oxynitride layer having a thickness of 100 nm or less is formed by a plasma CVD method as the gate insulating layer 342.

Next, a conductive film is formed over the gate insulating layer 342, and a resist mask is formed over the conductive film by a second photolithography step, and selective etching is performed thereon, so that a source electrode layer 355a and a drain electrode layer 355b are formed. After that, the resist mask is removed (see FIG. 13A).

Figure 13A:
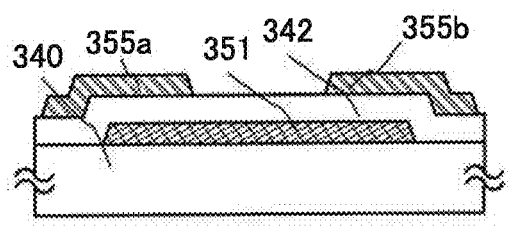
FIGS. 13A to 13D illustrate a method for manufacturing a thin film transistor.
Figure 13B:
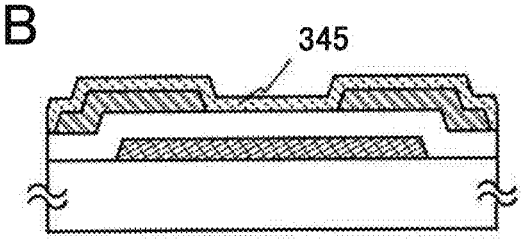
Figure 13C:
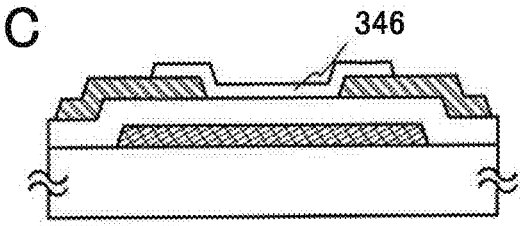
Figure 13D:
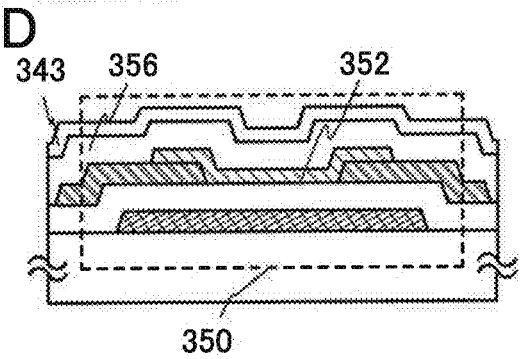

Next, an oxide semiconductor film 345 is formed (see FIG. 13B). In this embodiment, the oxide semiconductor film 345 is formed by a sputtering method using an In—Ga—Zn—O-based oxide semiconductor target. The oxide semiconductor film 345 is processed into an island-shaped oxide semiconductor layer by a third photolithography step.

In that case, it is preferable to remove residual moisture in the chamber in the deposition of the oxide semiconductor film 345. This is in order to prevent the oxide semiconductor film 345 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cry opump, a hydrogen molecule, a compound including a hydrogen atom such as water ($H_2O$), or the like, for example, is exhausted. Accordingly, the concentration of impurities included in the oxide semiconductor film 345 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film 345.

Next, dehydration and/or dehydrogenation of the oxide semiconductor layer are/is performed. The temperature of the first heat treatment for dehydration and/or dehydrogenation is higher than or equal to 400° C. and lower than or equal to 750° C., preferably higher than or equal to 400° C. and lower than the stain point of the substrate. In this embodiment, the substrate is put in an electric furnace which is a kind of heat treatment apparatus and heat treatment is performed on the oxide semiconductor layer at 450° C. for one hour in a nitrogen atmosphere, and then, water or hydrogen is prevented from entering the oxide semiconductor layer, without exposure to the air; thus, an oxide semiconductor layer 346 is obtained (see FIG. 13C).

For example, as the first heat treatment, GRTA may be performed as follows: the substrate is transferred into an inert gas heated to a high temperature of 650° C. to 700° C., heated for several minutes, and transferred and taken out of the inert gas heated to the high temperature. GRTA enables a high-temperature heat treatment for a short time.

Next, an oxide insulating layer 356 serving as a protective insulating film which is in contact with the oxide semiconductor layer 346 is formed.

The oxide insulating layer 356 can be formed to a thickness at least 1 nm by a method by which an impurity such as water or hydrogen does not enter the oxide insulating layer 356, such as a sputtering method as appropriate. When hydrogen is contained in the oxide insulating layer 356, entry of the hydrogen to the oxide semiconductor layer or extraction of oxygen in the oxide semiconductor layer by hydrogen may be caused, thereby making the backchannel of the oxide semiconductor layer n-type (making the resistance thereof low), so that a parasitic channel may be formed. Therefore, it is important that a formation method in which hydrogen is used as little as possible is employed such that the oxide insulating layer 356 contains hydrogen as little as possible.

In this embodiment, a 200-nm-thick silicon oxide film is deposited as the oxide insulating layer 356 by a sputtering method. The substrate temperature at the time of film deposition may be higher than or equal to room temperature and lower than or equal to 300° C. and in this embodiment, is 100° C. The silicon oxide film can be formed with a sputtering method in a rare gas (typically argon) atmosphere, an oxygen atmosphere, or a mixed atmosphere containing a rare gas and oxygen. As a target, a silicon oxide target or a silicon target may be used. For example, with the use of a silicon target, silicon oxide can be deposited by a sputtering method under an atmosphere of oxygen and nitrogen. As the oxide insulating layer 356 which is formed in contact with the oxide semiconductor layer, an inorganic insulating film which does not include impurities such as moisture, a hydrogen ion, and OH⁻ and blocks entry of these from the outside is used. Typically, a silicon oxide film, a silicon oxynitride film, an aluminum oxide film, an aluminum oxynitride film, or the like is used.

In that case, it is preferable to remove residual moisture in the chamber in the deposition of the oxide insulating layer 356. This is in order to prevent the oxide semiconductor layer 346 and the oxide insulating layer 356 from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cry opump, a hydrogen molecule, a compound including a hydrogen atom such as water ($H_2O$), or the like, for example, is exhausted. Accordingly, the concentration of impurities included in the oxide insulating layer 356 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 356.

Next, a second heat treatment (preferably at a temperature higher than or equal to 200° C. and lower than or equal to 400° C., for example, at a temperature higher than or equal to 250° C. and lower than or equal to 350° C.) is performed in an inert gas atmosphere or an oxygen gas atmosphere. For example, the second heat treatment is performed at 250° C. for one hour in a nitrogen atmosphere. With the second heat treatment, heat is applied on the state where part of the oxide semiconductor layer (the channel formation region) is in contact with the oxide insulating layer 356.

Through the above process, the oxide semiconductor film is selectively made to include excessive oxygen. As a result, an i-type oxide semiconductor layer 352 is formed. Through the above steps, the thin film transistor 350 is formed.

Furthermore, heat treatment at a temperature higher than or equal to 100° C. and lower than or equal to 200° C. in the air for 1 hour to 30 hours both inclusive may be performed. In this embodiment, heat treatment is performed at 150° C.

for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. Further, this heat treatment may be performed before the formation of the oxide insulating film under a reduced pressure. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved.

A protective insulating layer may be formed over the oxide insulating layer 356. For example, a silicon nitride film is formed by an RF sputtering method. In this embodiment, a protective insulating layer 343 is formed using a silicon nitride film as the protective insulating layer (see FIG. 13D).

A planarization insulating layer for planarization may be provided over the protective insulating layer 343.

The off-state current can be reduced in the thin film transistor using an oxide semiconductor layer, manufactured as described above. Therefore, by using the thin film transistor in each of a plurality of pixels of a display portion of a liquid crystal display device, a period for holding voltage in a storage capacitor can be extended, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction.

Embodiment 8 can be implemented in appropriate combination with any of the structures described in the other embodiments.

Embodiment 9

Figure 14:
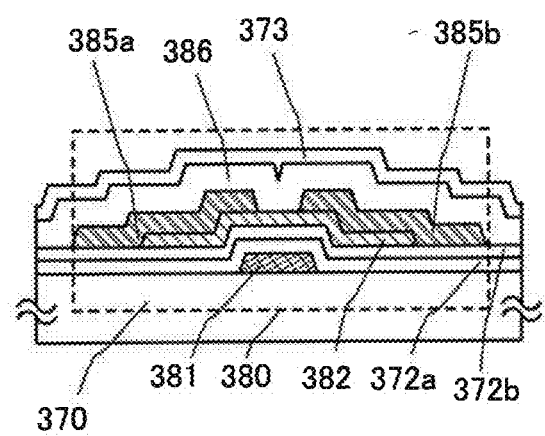
FIG. 14 illustrates a thin film transistor.

In Embodiment 9, an example which is different from Embodiment 6 in the manufacturing process of a thin film transistor will be described using FIG. 14. Since FIG. 14 is the same as FIGS. 11A to 11E except for part of the steps, the same reference numerals are used for the same portions, and detailed description of the same portions is not repeated.

In Embodiment 9, another example of a thin film transistor which can be applied to a liquid crystal display device disclosed in this specification will be described. A thin film transistor 380 described in this embodiment can be used as a thin film transistor in each pixel of the pixel portion 1008 described in Embodiment 1.

In accordance with Embodiment 6, a gate electrode layer 381 is formed over a substrate 370, and a first gate insulating layer 372a and a second gate insulating layer 372b are stacked. In this embodiment, a gate insulating layer has a two-layer structure, in which a nitride insulating layer is used as the first gate insulating layer 372a and an oxide insulating layer is used as the second gate insulating layer 372b.

As the oxide insulating layer, a silicon oxide layer, a silicon oxynitride layer, an aluminum oxide layer, an aluminum oxynitride layer, or the like can be used. As the nitride insulating layer, a silicon nitride layer, a silicon nitride oxide layer, an aluminum nitride layer, an aluminum nitride oxide layer, or the like can be used.

In this embodiment, the gate insulating layer has a structure in which a silicon nitride layer and a silicon oxide layer are stacked over the gate electrode layer 381. For example, a 150-nm-thick gate insulating layer is formed in such a manner that a silicon nitride layer ($SiN_y$ (y>0)) having a thickness of greater than or equal to 50 nm and less than or equal to 200 nm (50 nm in this embodiment) is formed by a sputtering method as the first gate insulating layer 372a and then a silicon oxide layer ($SiO_x$ (x>0)) having a thickness of greater than or equal to 5 nm and less than or equal to 300 nm (100 nm in this embodiment) is stacked as the second gate insulating layer 372b over the first gate insulating layer 372a.

Next, an oxide semiconductor film is formed and is processed into an island-shaped oxide semiconductor layer by a photolithography step. In this embodiment, the oxide semiconductor film is formed by a sputtering method using an In—Ga—Zn—O-based oxide semiconductor target.

In that case, it is preferable to remove residual moisture in the chamber in the deposition of the oxide semiconductor film. This is in order to prevent the oxide semiconductor film from containing hydrogen, a hydroxyl group, or moisture.

In order to remove residual moisture from the chamber, an adsorption-type vacuum pump is preferably used. For example, a cryopump, an ion pump, or a titanium sublimation pump is preferably used. As an exhaustion unit, a turbo molecular pump to which a cold trap is added may be used. In the chamber in which exhaustion is performed with the use of a cryopump, a hydrogen molecule, a compound including a hydrogen atom such as water ($H_2O$), or the like, for example, is exhausted. Accordingly, the concentration of impurities included in the oxide semiconductor film formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide semiconductor film.

Next, dehydration and/or dehydrogenation of the oxide semiconductor layer are/is performed. The temperature of the first heat treatment for dehydration and/or dehydrogenation is higher than or equal to 400° C. and lower than or equal to 750° C., preferably higher than or equal to 425° C. The heat treatment time is one hour or shorter at a temperature of higher than or equal to 425° C. and is longer than one hour at a temperature of lower than 425° C. In this embodiment, the substrate is put in an electric furnace which is a kind of heat treatment apparatus and heat treatment is performed on the oxide semiconductor layer in a nitrogen atmosphere, and then, water or hydrogen is prevented from entering the oxide semiconductor layer, without exposure to the air; thus, an oxide semiconductor layer is obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas or the $N_2O$ gas do not contain water, hydrogen, or the like. Alternatively, the purity of an oxygen gas or an $N_2O$ gas which is introduced into the heat treatment apparatus is preferably 6N (99.9999%) or higher, far preferably 7N (99.99999%) or higher (that is, the impurity concentration of the oxygen gas or the $N_2O$ gas is 1 ppm or lower, preferably 0.1 ppm or lower).

The heat treatment apparatus is not limited to an electric furnace. For example, an RTA (rapid thermal annaling) apparatus such as a GRTA (gas rapid thermal annealing) apparatus or an LRTA (lamp rapid thermal annealing) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The LRTA apparatus may be provided with not only a lamp but also a device that heats an object to be processed by thermal conduction or thermal radiation from a heater such as a resistance heater or the like. The GRTA is a method for heat treatment using a high-temperature gas. As the gas, an inert gas which does not react with the object to be processed, by heat treatment, such as nitrogen or a rare gas such as argon is used. The heat treatment may be performed at 600° C. to 750° C. for several minutes by an RTA method.

After the first heat treatment for dehydration and/or dehydrogenation, heat treatment may be performed at a temperature higher than or equal to 200° C. and lower than or equal to 400° C., preferably higher than or equal to 200° C. and lower than or equal to 300° C., in an oxygen gas atmosphere or a $N_2O$ gas atmosphere.

The first heat treatment of the oxide semiconductor layer can also be performed on the oxide semiconductor film before being processed into the island-like oxide semiconductor layer. In that case, the substrate is taken out from the heat apparatus after the first heat treatment, and then a photolithography step is performed thereon.

The entire oxide semiconductor film is made to contain an excess amount of oxygen through the above steps, whereby the oxide semiconductor film has higher resistance, that is, becomes i-type. Accordingly, an oxide semiconductor layer 382 whose entire region is i-type is formed.

Next, a resist mask is formed by a photolithography step over the oxide semiconductor layer 382, and is selectively etched to form a source electrode layer 385*a* and a drain electrode layer 385*b*, and then, an oxide insulating layer 386 is formed by a sputtering method.

In that case, it is preferable to remove residual moisture in the chamber in the deposition of the oxide insulating layer 386. This is in order to prevent the oxide semiconductor layer 382 and the oxide insulating layer 386 from containing hydrogen, a hydroxyl group, and/or moisture.

In order to remove the residual moisture in the chamber, it is preferable to use an adsorption-type vacuum pump. For example, a cryopump, an ion pump, or a titanium sublimation pump is preferably used. As an exhaustion unit, a turbo molecular pump to which a cold trap is added may be used. In the chamber in which exhaustion is performed using a cryopump, a hydrogen molecule, a compound including a hydrogen atom such as water ($H_2O$), or the like is exhausted. Accordingly, the concentration of impurities included in the oxide insulating layer 386 formed in the chamber can be reduced.

It is preferable that a high-purity gas in which an impurity such as hydrogen, water, a hydroxyl group, or hydride is removed to 1 ppm or less, preferably 10 ppb or less be used as the sputtering gas for the deposition of the oxide insulating layer 386.

Through the above steps, the thin film transistor 380 can be manufactured.

Next, heat treatment (preferably at a temperature higher than or equal to 150° C. and lower than 350° C.) may be performed in an inert gas atmosphere or a nitrogen gas atmosphere in order to suppress variation of electrical characteristics of the thin film transistor. For example, heat treatment is performed at 250° C. for one hour in a nitrogen atmosphere.

Furthermore, heat treatment at a temperature higher than or equal to 100° C. and lower than or equal to 200° C. in the air for 1 hour to 30 hours both inclusive may be performed. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. Further, this heat treatment may be performed before the formation of the oxide insulating film under a reduced pressure. Under the reduced pressure, the heat treatment time can be shortened. With this heat treatment, hydrogen is introduced from the oxide semiconductor layer to the oxide insulating layer; thus, a normally-off thin film transistor can be obtained. Therefore, reliability of the liquid crystal display device can be improved.

A protective insulating layer 373 is formed over the oxide insulating layer 386. In this embodiment, a 100-nm-thick silicon nitride film is formed as the protective insulating layer 373 by a sputtering method.

The protective insulating layer 373 and the first gate insulating layer 372*a*, which are nitride insulating layers, do not contain impurities such as moisture, hydrogen, hydride, or hydroxide and blocks them from entering from the outside.

Therefore, in the manufacturing process after the formation of the protective insulating layer 373, entry of impurities such as moisture from the outside can be prevented. Further, even after a device is completed as a semiconductor device such as a liquid crystal display device, entry of impurities such as moisture from the outside can be prevented in the long term; therefore, long-term reliability of the device can be improved.

The insulating layers provided between the protective insulating layer 373 which is a nitride insulating layer and the first gate insulating layer 372*a* may be removed to make the protective insulating layer 373 in contact with the first gate insulating layer 372*a*.

Accordingly, impurities such as moisture, hydrogen, hydride, or hydroxide in the oxide semiconductor layer can be reduced and entry thereof is prevented, so that the concentration of impurities in the oxide semiconductor layer can be kept to be low.

A planarization insulating layer for planarization may be provided over the protective insulating layer 373.

The off-state current can be reduced in each of a plurality of pixels of a display portion of a liquid crystal display device using the thin film transistor using an oxide semiconductor layer as described above. Therefore, a period for holding voltage in a storage capacitor can be extended, and the power consumption when a still image or the like is displayed in the liquid crystal display device can be decreased. Further, by stopping supplying a control signal in the case where a still image is displayed, power consumption can be further decreased. In addition, a still image and a moving image can be switched without malfunction.

Embodiment 9 can be implemented in appropriate combination with any of the structures described in the other embodiments.

Embodiment 10

In Embodiment 10, another example of a thin film transistor which can be applied to a liquid crystal display device disclosed in this specification will be described. A thin film transistor described in this embodiment can be used as the thin film transistor in any of Embodiments 2 to 8, which can be used as the thin film transistor in Embodiment 1.

In Embodiment 10, an example of using a conductive material having a light-transmitting property as any of a gate electrode layer, a source electrode layer, and a drain electrode layer will be described. Note that the above embodiment can be applied to the same portions and the portions and steps having similar functions as/to the above embodiment, and description thereof is not repeated. Further, a specific description for the same portions is omitted.

As a material of any of a gate electrode layer, a source electrode layer, and a drain electrode layer, a conductive material that transmits visible light can be used. For example, any of the following metal oxides can be used: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof is set in the range of greater than or equal to 50 nm and less than or equal to 300 nm as appropriate. As a deposition method of the metal oxide used for any of the gate electrode layer, the source electrode layer, and the drain electrode layer, a sputtering method, a vacuum evaporation method (an electron beam evaporation method or the like), an arc discharge ion plating method, or a spray method is used. In the case where a sputtering method is employed, it is preferable that deposition be performed using a target containing $SiO_2$ at 2 wt % to 10 wt % both inclusive and $SiO_x$ (x>0) which inhibits crystallization be contained in the light-transmitting conductive film so as to prevent crystallization at the time of the heat treatment in a later step.

Note that the unit of the percentage of components in the light-transmitting conductive film is atomic percent, and the percentage of components is evaluated by analysis using an electron probe X-ray microanalyzer (EPMA).

In a pixel provided with a thin film transistor, when a pixel electrode layer, another electrode layer (such as a capacitor electrode layer), or a wiring layer (such as a capacitor wiring layer) is formed using a conductive film that transmits visible light, a display device having high aperture ratio can be realized. Needless to say, it is preferable that a gate insulating layer, an oxide insulating layer, a protective insulating layer, and a planarization insulating layer in the pixel be also each formed using a film that transmits visible light.

In this specification, a film that transmits visible light means a film having such a thickness as to have transmittance of visible light of 75% to 100%. In the case where the film has conductivity, the film is also referred to as a transparent conductive film. Further, a conductive film which is semi-transmissive with respect to visible light may be used as metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light of 50% to 75%.

When a thin film transistor has a light-transmitting property, the aperture ratio can be increased. For small liquid crystal display panels of 10 inches or smaller in particular, a high aperture ratio can be achieved even when the size of pixels is decreased in order to realize higher resolution of display images by increasing the number of gate wirings, for example. Further, by using a film having a light-transmitting property for components of a thin film transistor, a high aperture ratio can be achieved even when one pixel is divided into a plurality of sub-pixels in order to realize a wide viewing angle. That is, a high aperture ratio can be maintained even when a group of high-density thin film transistors is provided, so that a sufficient area of a display region can be secured. For example, in the case where one pixel includes two to four sub-pixels, an aperture ratio can be improved because the thin film transistor has a light-transmitting property. Further, a storage capacitor may be formed using the same material by the same step as the component in the thin film transistor so that the storage capacitor can have a light-transmitting property, whereby the aperture ratio can be further improved.

Embodiment 10 can be implemented in appropriate combination with any of the structures described in the other embodiments.

Embodiment 11

The appearance and the cross section of a liquid crystal display panel, which is an embodiment of a liquid crystal display device, are described with reference to FIGS. 15A to 15C. FIGS. 15A and 15C are each a top view of a panel in which thin film transistors 4010 and 4011 and a liquid crystal element 4013, which are formed over a first substrate 4001, are sealed between the first substrate 4001 and a second substrate 4006 with a sealant 4005. FIG. 15B corresponds to a cross-sectional view of FIG. 15A or 15C along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that a connection method of a driver circuit which is separately formed is not particularly limited; a COG method, a wire bonding method, a TAB method, or the like can be used. FIG. 15A illustrates an example of mounting the signal line driver circuit 4003 by a COG method, and FIG. 15C illustrates an example of mounting the signal line driver circuit 4003 by a TAB method.

Further, the pixel portion 4002 and the scan line driver circuit 4004 provided over the first substrate 4001 each include a plurality of thin film transistors. FIG. 15B illustrates the thin film transistor 4010 included in the pixel portion 4002 and the thin film transistor 4011 included in the scan line driver circuit 4004. Over the thin film transistors 4010 and 4011, insulating layers 4041, 4042, 4020, and 4021 are provided.

Any one of the thin film transistors described in Embodiments 2 to 9 can be used as each of the thin film transistors 4010 and 4011 as appropriate, and can be formed using a similar process and a similar material. In the oxide semiconductor layer of each of the thin film transistors 4010 and 4011, hydrogen or water is reduced. Thus, the thin film transistors 4010 and 4011 have high reliability. In this embodiment, the thin film transistors 4010 and 4011 are n-channel thin film transistors.

A conductive layer 4040 is provided over part of the insulating layer 4021, which overlaps a channel formation region of the oxide semiconductor layer in the thin film transistor 4011 for the drive circuit. The conductive layer 4040 is provided at the position overlapping the channel formation region of the oxide semiconductor layer, whereby the amount of change in the threshold voltage of the thin film transistor 4011 by a BT test can be reduced. A potential of the conductive layer 4040 may be the same as or different from that of a gate electrode layer of the thin film transistor 4011. The conductive layer 4040 can also function as a second gate electrode layer. In addition, the potential of the conductive layer 4040 may be GND or 0 V, or the conductive layer 4040 may be in a floating state.

A pixel electrode layer 4030 included in the liquid crystal element 4013 is electrically connected to a source electrode layer or a drain electrode layer of the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap each other corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

As each of the first substrate 4001 and the second substrate 4006, a light-transmitting substrate can be used; glass, ceramic, or plastic can be used. As plastic, a fiberglass-reinforced plastic (FRP) plate, a polyvinyl fluoride (PVF) film, a polyester film, or an acrylic resin film can be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of substrates. The conductive particles are included in the sealant 4005.

As the liquid crystal, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like is used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at greater than or equal to 5 wt % is used for the liquid crystal layer 4008 in order to widen the temperature range. The liquid crystal composition which includes a liquid crystal exhibiting a blue phase and a chiral agent has a short response time of less than or equal to 1 msec, has optical isotropy, which makes the alignment process unneeded, and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved. A thin film transistor including an oxide semiconductor layer particularly has a possibility that electrical characteristics of the thin film transistor may significantly change and deviate from the designed range by the influence of static electricity. Therefore, it is more effective to use a blue phase liquid crystal material for a liquid crystal display device having a thin film transistor including an oxide semiconductor layer.

The specific resistance of the liquid crystal material in this embodiment is $1\times10^{12}$ Ω·cm or more, preferably $1\times10^{13}$ Ω·cm or more, far preferably $1\times10^{14}$ Ω·cm or more. The resistance in the case where a liquid crystal cell using the liquid crystal material is $1\times10^{11}$ Ω·cm or more, in which an impurity from the alignment film or the sealant may enter, and is preferably over $1\times10^{12}$ Ω·cm. The value of the specific resistance in this specification is measured at 20° C.

As the specific resistance of the liquid crystal material increases, the amount of charge which leaks through the liquid crystal material can be decreased, so that a decrease over time of a voltage for holding the operation state of the liquid crystal element can be suppressed. As a result, the holding period can be extended, the frequency of signal writing can be decreased, and low power consumption of the display device can be achieved.

This embodiment of the present invention can also be applied to either a semi-transmissive (transflective) or reflective liquid crystal display device as well as a transmissive liquid crystal display device. The display device of this embodiment is not limited to a liquid crystal display device, and may be an EL display device using a light-emitting element such as an electroluminescent element (also called an EL element) as a display element.

An example of the liquid crystal display device is illustrated in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked-layer structure of the polarizing plate and the coloring layer is not limited to that described in this embodiment and may be set as appropriate depending on materials of the polarizing plate and the coloring layer or conditions of the manufacturing process. Further, a light blocking film serving as a black matrix may be provided in a region other than a display portion.

Over the thin film transistors 4011 and 4010, the insulating layer 4041 is formed in contact with the oxide semiconductor layers. The insulating layer 4041 may be formed using a similar material by a similar method to the oxide insulating layer 416 described in Embodiment 2. In this embodiment, as the insulating layer 4041, a silicon oxide layer is formed by a sputtering method, using Embodiment 2. Further, the protective insulating layer 4042 is formed on and in contact with the insulating layer 4041. The protective insulating layer 4042 may be formed in a similar manner to the protective insulating layer 403 described in Embodiment 2; for example, a silicon nitride film can be used. In addition, in order to reduce the surface roughness of the thin film transistors, the protective insulating layer 4042 is covered with the insulating layer 4021 functioning as a planarization insulating film.

The insulating layer 4021 is formed as the planarization insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. The insulating layer 4021 may be formed by stacking a plurality of insulating films formed using these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater. The baking step of the insulating layer 4021 also serves as annealing of the semiconductor layer, whereby a liquid crystal display device can be manufactured efficiently.

The pixel electrode layer 4030 and the counter electrode layer 4031 can be formed using a light transmitting conductive material, such as indium tin oxide (ITO), indium zinc oxide (IZO) in which zinc oxide (ZnO) is mixed in indium oxide, a conductive material in which silicon oxide ($SiO_2$) is mixed in indium oxide, organoindium, organotin, indium oxide containing tungsten oxide, indium zinc oxide containing tungsten oxide, indium oxide containing titanium oxide, or indium tin oxide containing titanium oxide. Alternatively, in the case where a light transmitting property is not needed or a reflective property is needed for the pixel electrode layer 4030 or the counter electrode layer 4031 in a reflective liquid crystal display device, the pixel electrode layer 4030 or the counter electrode layer 4031 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, and a nitride thereof.

A conductive composition containing a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a transmittance of 70% or more at a wavelength of 550 nm. Further, the resistivity of the conductive high molecule contained in the conductive composition is preferably 0.1 Ω·cm or less.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Furthermore, a variety of signals and potentials are supplied to the signal line driver circuit 4003 which is formed separately, the scan line driver circuit 4004, or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as the source and drain electrode layers of the thin film transistors 4010 and 4011.

The connection terminal electrode 4015 is electrically connected to a terminal included in the FPC 4018 via an anisotropic conductive film 4019.

FIGS. 15A to 15C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

A black matrix (a light blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

Further, since the thin film transistor is easily damaged due to static electricity or the like, a protective circuit is preferably provided over the same substrate as the pixel portion or the driver circuit portion. The protective circuit is preferably formed with a non-linear element including an oxide semiconductor layer. For example, a protective circuit is provided between the pixel portion, and a scan line input terminal and a signal line input terminal. In this embodiment, a plurality of protective circuits is provided so that the pixel transistor and the like are not damaged when surge voltage due to static electricity or the like is applied to the scan line, the signal line, or a capacitor bus line. Accordingly, the protective circuit is configured to release charges to a common wiring when surge voltage is applied to the protective circuit. The protective circuit includes non-linear elements which are arranged in parallel between the common wiring and the scan line, the signal line, or the capacitor bus line. Each of the non-linear elements includes a two-terminal element such as a diode or a three-terminal element such as a transistor. For example, the non-linear element can be formed through the same steps as the thin film transistor of the pixel portion. For example, characteristics similar to those of a diode can be achieved by connecting a gate terminal to a drain terminal.

Further, for a liquid crystal display module, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

There is no particular limitation on the liquid crystal display device disclosed in this specification; a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. There are some examples of a vertical alignment mode; for example, a multi-domain vertical alignment (MVA) mode, a patterned vertical alignment (PVA) mode, an ASV mode, or the like can be employed.

Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Furthermore, it is possible to use a method called domain multiplication or multi-domain design, in which a pixel is divided into some regions (subpixels) and molecules are aligned in different directions in their respective regions.

Embodiment 11 can be implemented in appropriate combination with any of the structures described in the other embodiments.

Embodiment 12

In Embodiment 12, examples of electronic apparatuses including any of the liquid crystal display devices of the embodiments described above will be described.

Figure 16A:
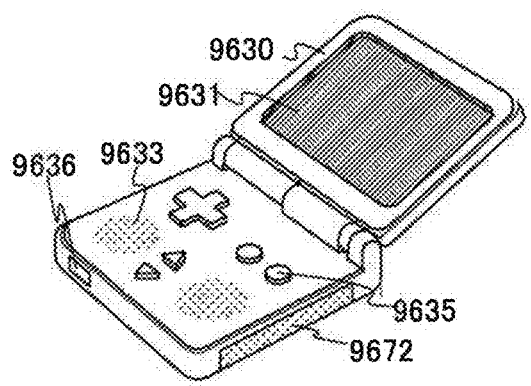
FIGS. 16A to 16C each illustrate an electronic apparatus.

FIG. 16A illustrates a portable game machine, which can include a housing 9630, a display portion 9631, a speaker 9633, operation keys 9635, a connection terminal 9636, a recording medium reading portion 9672, and the like. The portable game machine illustrated in FIG. 16A can have a function of reading a program or data stored in a recording medium to display it on the display portion, a function of sharing information with another portable game machine by wireless communication, and the like. The portable game machine illustrated in FIG. 16A can have various functions besides those given above.

Figure 16B:
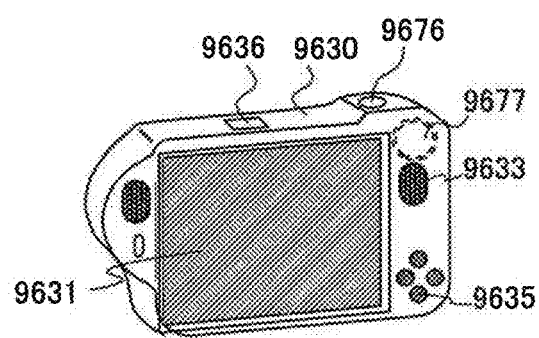

FIG. 16B illustrates a digital camera, which can include a housing 9630, a display portion 9631, a speaker 9633, operation keys 9635, a connection terminal 9636, a shutter button 9676, an image receiving portion 9677, and the like. The digital camera having a television reception function in FIG. 16B can have a function of photographing a still image and/or a moving image, a function of automatically or manually correcting the photographed image, a function of obtaining various kinds of information from an antenna, a function of storing the photographed image or the information obtained from the antenna, and a function of displaying the photographed image or the information obtained from the antenna on the display portion. The digital camera having the television reception function in FIG. 16B can have various functions besides those given above.

Figure 16C:
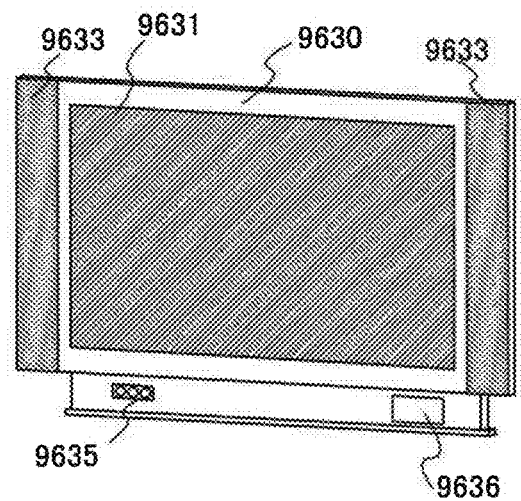

FIG. 16C illustrates a television set, which can include a housing 9630, a display portion 9631, a speaker 9633, operation keys 9635, a connection terminal 9636, and the like. The television set in FIG. 16C can have a function of processing and converting an electric wave for television into an image signal, a function of processing and converting the image signal into a signal suitable for display, a function of converting a frame frequency of the image signal, and the like. The television set in FIG. 16C can have various functions besides those given above.

Figure 17A:
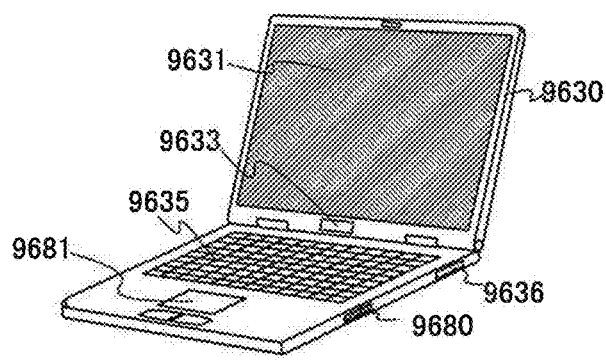
FIGS. 17A to 17C each illustrate an electronic apparatus.

FIG. 17A illustrates a computer, which can include a housing 9630, a display portion 9631, a speaker 9633, operation keys 9635, a connection terminal 9636, a pointing device 9681, an external connection port 9680, and the like. The computer in FIG. 17A can have a function of displaying a variety of information (e.g., a still image, a moving image, and a text image) on the display portion, a function of controlling processing by a variety of software (programs), a communication function such as wireless communication or wired communication, a function of being connected to various computer networks with the communication function, a function of transmitting or receiving a variety of data with the communication function, and the like. The computer illustrated in FIG. 17A can have various functions besides those given above.

Figure 17B:
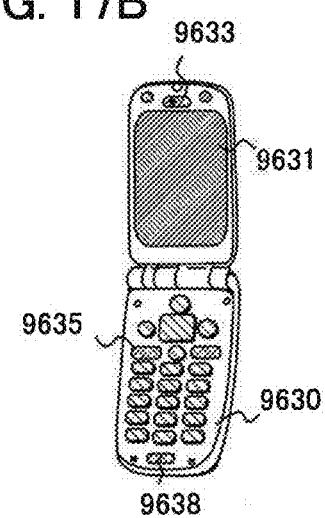

FIG. 17B illustrates a mobile phone, which can include a housing 9630, a display portion 9631, a speaker 9633, operation keys 9635, a microphone 9638, and the like. The mobile phone in FIG. 17B can have a function of displaying a variety of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. The mobile phone in FIG. 17B can have various functions besides those given above.

Figure 17C:
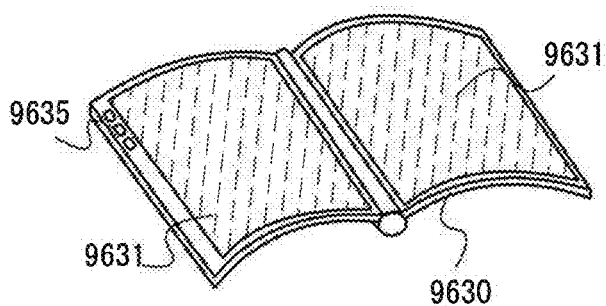

FIG. 17C illustrates electronic paper (also referred to as an e-book), which can include a housing 9630, a display portion 9631, operation key 9635, and the like. The electronic paper in FIG. 17C can have a function of displaying a variety of information (e.g., a still image, a moving image, and a text image) on the display portion, a function of displaying a calendar, a date, the time, and the like on the display portion, a function of operating or editing the information displayed on the display portion, a function of controlling processing by various kinds of software (programs), and the like. The electronic paper in FIG. 17C can have various functions besides those given above.

In each of the electronic apparatuses described in this embodiment, in each of a plurality of pixels of a display portion of a liquid crystal display device, the off-state current can be decreased. Accordingly, a period for holding voltage in a storage capacitor can be increased, and the electronic apparatuses in which the power consumption when a still image or the like is displayed in the liquid crystal display device can be decreased can be manufactured. Further, by stopping supplying a control signal in the case where a still image is displayed, power consumption can be further decreased. In addition, a still image and a moving image can be switched without malfunction.

Embodiment 12 can be implemented in appropriate combination with any of the structures described in the other embodiments.

Embodiment 13

In Embodiment 13, a principle of operation of a bottom-gate transistor including an oxide semiconductor will be described.

FIG. 19 is a cross-sectional view of an inverted-staggered insulated-gate transistor including an oxide semiconductor. An oxide semiconductor layer (OS) is provided over a gate electrode (G1) with a first gate insulating film (GI1) interposed therebetween, and a source electrode (S) and a drain electrode (D) are provided thereover. Further, a second gate insulating film (GI2) is provided over the source electrode (S) and the drain electrode (D), and a second gate electrode (G2) is provided thereover. G2 is maintained to ground potential.

Figure 20A:
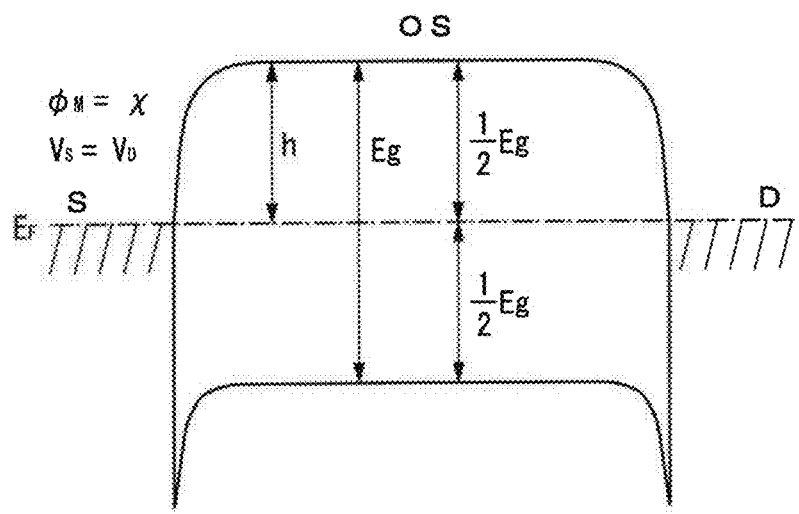
FIGS. 20A and 20B are diagrams for describing Embodiment 13.
Figure 20B:
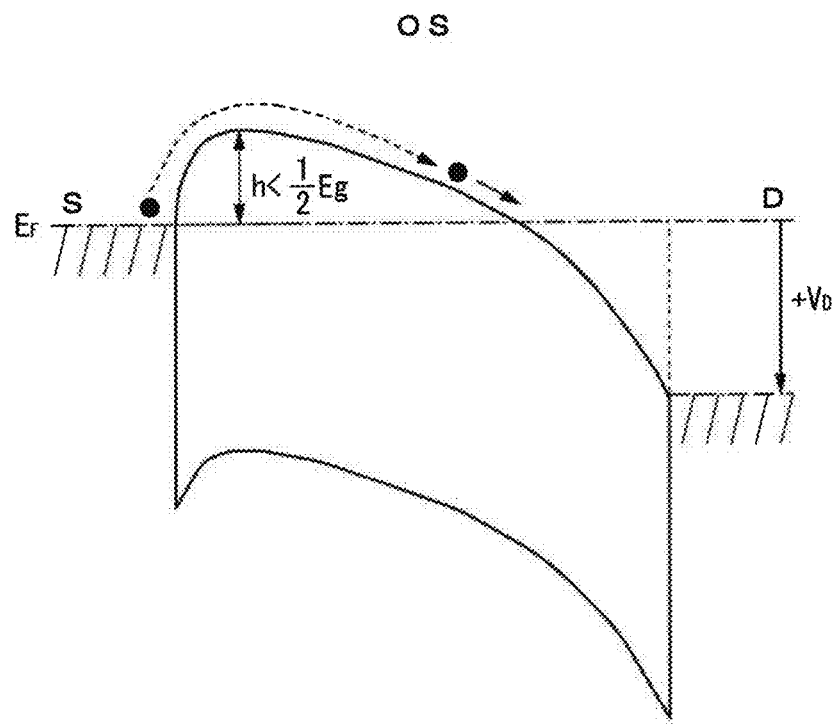

Hereinafter, description is made using energy band diagrams. The energy band diagrams described here are so simplified as much as possible for understanding that they are not strict. FIGS. 20A and 20B are energy band diagrams (schematic diagrams) along an A-A' section illustrated in FIG. 19. FIG. 20A illustrates the case where the potential of a voltage applied to the source is equal to the potential of a voltage applied to the drain (VD=0 V), and FIG. 20B illustrates the case where a positive potential with respect to the source is applied to the drain (VD>0).

Figure 21A:
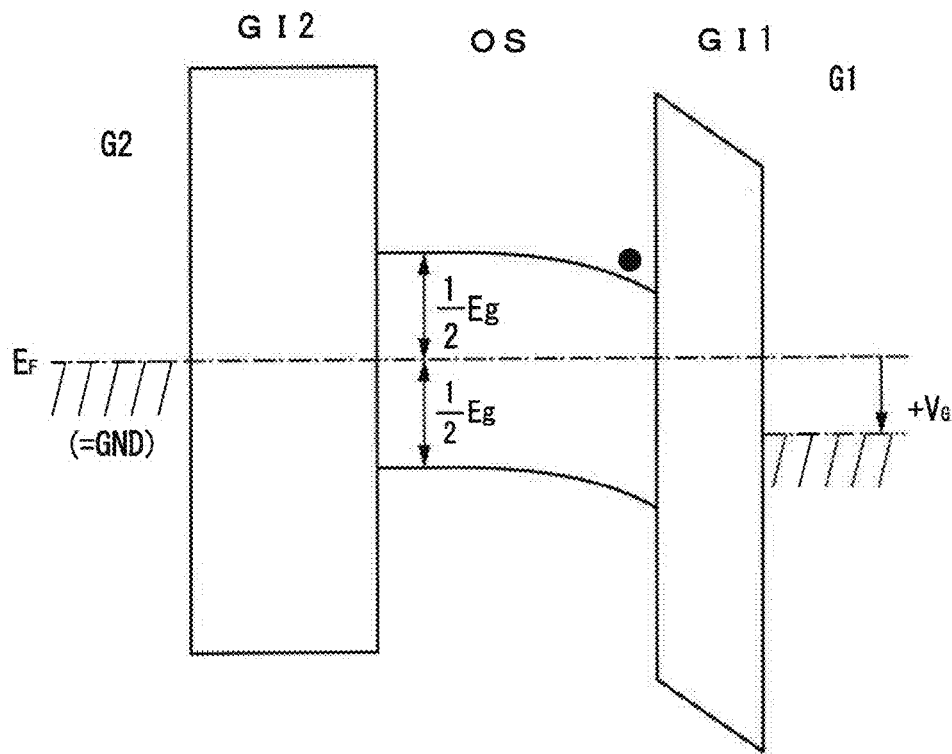
FIGS. 21A and 21B are diagrams for describing Embodiment 13.
Figure 21B:
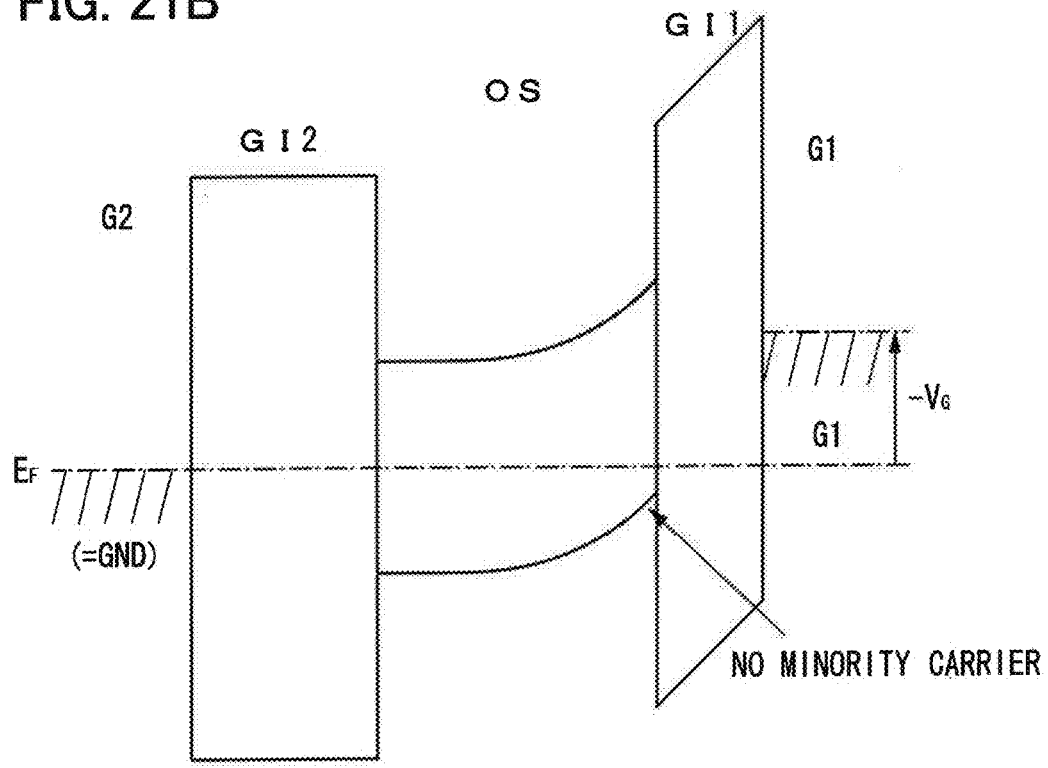

FIGS. 21A and 21B are energy band diagrams (schematic diagrams) along a B-B' section illustrated in FIG. 19. FIG. 21A illustrates an on state in which a positive potential (+VG) is applied to the gate (G1) and carriers (electrons) flow between the source and the drain. FIG. 21B illustrates an off state in which a negative potential (−VG) is applied to the gate (G1) and minority carriers do not flow.

Figure 22:
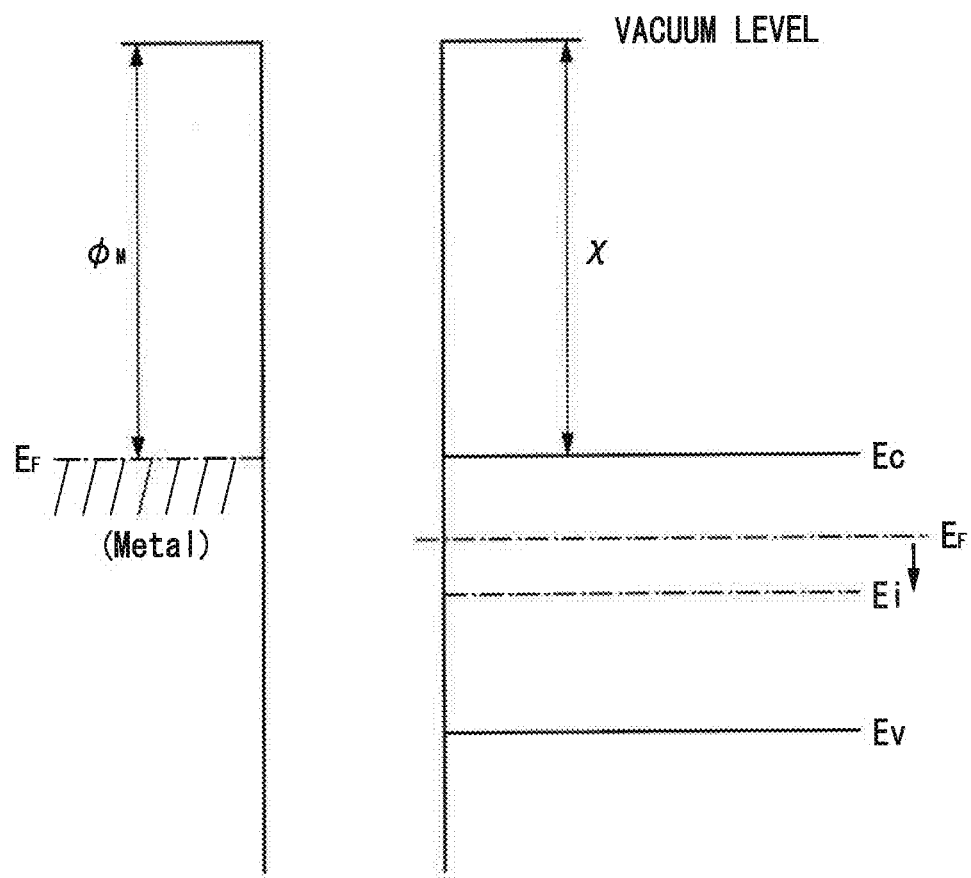
FIG. 22 is a diagram for describing Embodiment 13.

FIG. 22 illustrates the relationships between the vacuum level and the work function of a metal ($\phi M$) and between the vacuum level and the electron affinity ($\chi$) of an oxide semiconductor.

Since metal is degenerated, the conduction band and the Fermi level correspond to each other. On the other hand, a conventional oxide semiconductor is typically an n-type semiconductor, in which case the Fermi level (Ef) is away from the intrinsic Fermi level (Ei) located in the middle of a band gap and is located closer to the conduction band. Note that it is known that hydrogen is a donor in an oxide semiconductor and is one factor causing an oxide semiconductor to be an n-type semiconductor.

On the other hand, an oxide semiconductor of the present invention is an intrinsic (i-type) or a substantially intrinsic oxide semiconductor which is obtained by removing hydrogen that is an n-type impurity from an oxide semiconductor and purifying the oxide semiconductor such that an impurity other than a main component of the oxide semiconductor is prevented from being contained therein as much as possible. In other words, a feature is that a purified i-type (intrinsic) semiconductor, or a semiconductor close thereto, is obtained not by adding an impurity but by removing an impurity such as hydrogen or water as much as possible. This enables the Fermi level (Ef) to be at the same level as the intrinsic Fermi level (Ei).

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 20A is obtained.

In FIG. 20B, a black circle (●) represents an electron, and when a positive potential is applied to the gate and the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier, in FIG. 20A where no voltage is applied, i.e., ½ of the band gap (Eg).

The electron injected into the oxide semiconductor at this time flows in the oxide semiconductor as illustrated in FIG. 21A. In addition, in FIG. 21B, when a negative potential (reverse bias) is applied to the gate electrode (G1), the value of current is extremely close to zero because holes that are minority carriers are substantially zero.

For example, even when an insulated-gate transistor as described above has a channel width W of $1\times10^4$ μm and a channel length of 3 μm, the off-state current is $10^{-13}$ A or less and the subthreshold swing (S value) can be 0.1 V/dec (the thickness of the gate insulating film: 100 nm).

Note that the intrinsic carrier concentration of a silicon semiconductor is $1.45\times10^{10}/cm^3$ (300 K) and carriers exist even at room temperature. This means that thermally excited carriers exist even at room temperature. A silicon wafer to which an impurity such as phosphorus or boron is added is practically used. In addition, even in a so-called intrinsic silicon wafer, impurities that cannot be controlled exist. Therefore, carriers exist in practice in a silicon semiconductor at $1\times10^{14}/cm^3$ or more, which contributes to a conduction between the source and the drain. Furthermore, the band gap of a silicon semiconductor is 1.12 eV, and thus the off-state current of a transistor including a silicon semiconductor significantly changes depending on temperature.

Therefore, not by simply using an oxide semiconductor having a wide band gap for a transistor but by purifying the oxide semiconductor such that an impurity other than a main component can be prevented from being contained therein as much as possible so that the carrier concentration becomes less than $1\times10^{14}/cm^3$, preferably $1\times10^{12}/cm^3$ or less, carriers to be thermally excited at a practical operation temperature can be eliminated, and the transistor can be operated only with carriers that are injected from the source side. This makes it possible to decrease the off-state current to $1\times10^{-13}$ A or less and to obtain a transistor whose off-state current hardly changes with a change in temperature and which is capable of extremely stable operation.

A technical idea of the present invention is that an impurity is not added to an oxide semiconductor and on the contrary the oxide semiconductor itself is purified by removing an impurity such as water or hydrogen which undesirably exists therein. In other words, a feature of an embodiment of the present invention is that an oxide semiconductor itself is purified by removing water or hydrogen which forms a donor level and further by sufficiently supplying oxygen to eliminate oxygen defects.

In an oxide semiconductor, even just after the deposition, hydrogen is observed on the order of $10^{20}/cm^3$ by secondary ion mass spectrometry (SIMS). One technical idea of the present invention is to purify an oxide semiconductor and obtain an electrically i-type (intrinsic) semiconductor by intentionally removing an impurity such as water or hydrogen which forms a donor level and further by adding oxygen (one of components of the oxide semiconductor), which decreases at the same time as removing water or hydrogen, to the oxide semiconductor.

As a result, it is preferable that the amount of hydrogen be as small as possible, and it is also preferable that the number of carriers in the oxide semiconductor be as small as possible. The oxide semiconductor is a purified i-type (intrinsic) semiconductor from which carriers have been eliminated and to which a meaning as a path of carriers as a semiconductor is given, rather than intentionally including carriers as a semiconductor, when used for an insulated-gate transistor.

As a result, by completely eliminating carriers from an oxide semiconductor or significantly reducing carries therein, the off-state current of an insulated-gate transistor can be decreased, which is a technical idea of an embodiment of the present invention. In other words, as a criterion, the hydrogen concentration is $1\times10^{16}/cm^3$ or less and the carrier concentration is less than $1\times10^{14}/cm^3$, preferably $1\times10^{12}/cm^3$ or less. According to a technical idea of the present invention, the ideal hydrogen concentration and carrier concentration are zero or close to zero.

In addition, as a result, the oxide semiconductor functions as a path, and the oxide semiconductor itself is an i-type (intrinsic) semiconductor which is purified so as to include no carriers or extremely few carriers, and carriers are supplied by an electrode on the source side. The degree of supply is determined by the barrier height that is obtained from the electron affinity $\chi$ of the oxide semiconductor, the Fermi level, which ideally corresponds to the intrinsic Fermi level, and the work function of the source or drain electrode.

Therefore, it is preferable that off-state current be as small as possible, and a feature of an embodiment of the present invention is that in characteristics of an insulated-gate transistor to which a drain voltage of 1 V to 10 V is applied, the off-state current per micrometer of channel width is 100 aA/μm or less, preferably 10 aA/μm or less, far preferably 1 aA/μm or less.

Embodiment 14

In Embodiment 14, measured values of the off-state current using a test element group (also referred to as a TEG) will be described below.

Figure 23:
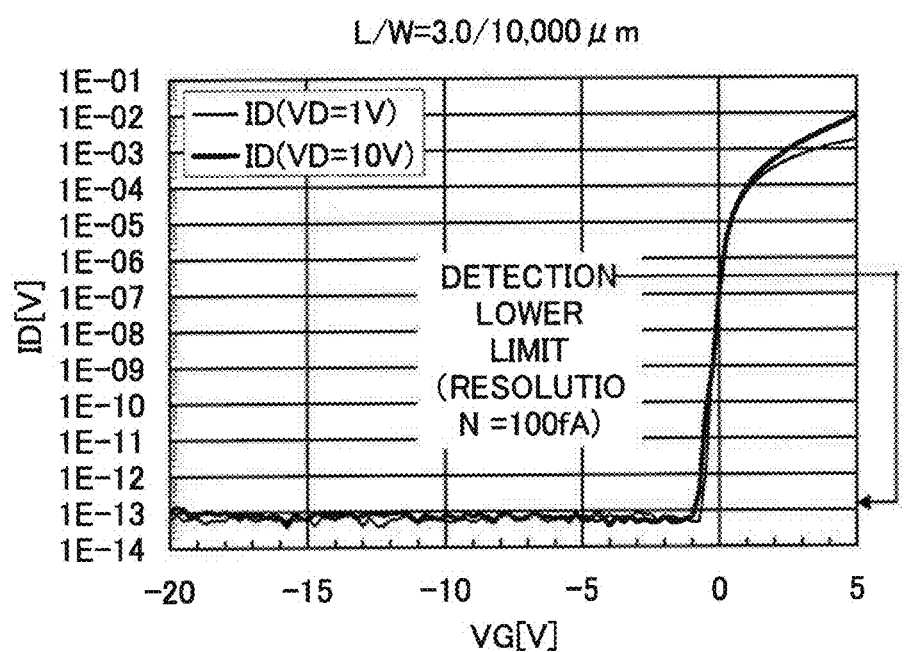
FIG. 23 is a graph for describing Embodiment 14.
Figure 24A:
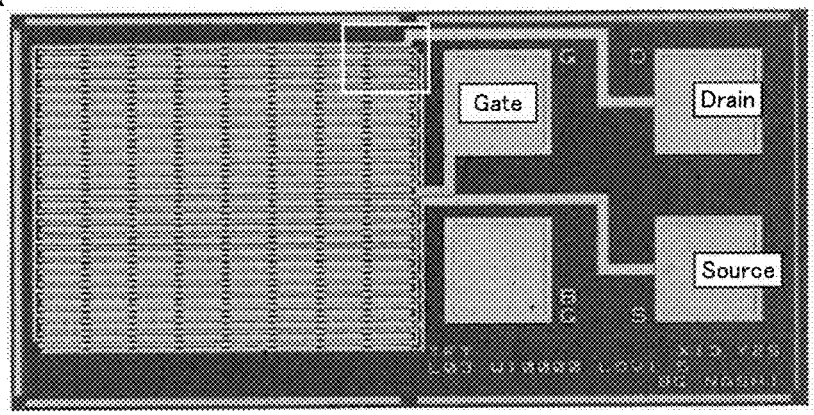
FIGS. 24A and 24B are photographs for describing Embodiment 14.
Figure 24B:
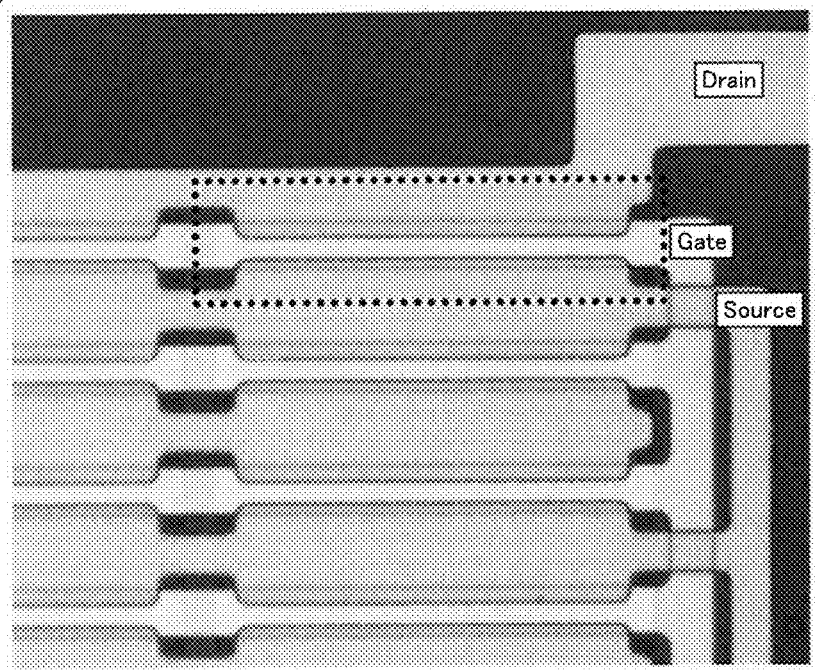

FIG. 23 shows initial characteristics of a thin film transistor with L/W=3 μm/10000 μm in which 200 thin film transistors each with L/W=3 μm/50 μm are connected in parallel. In addition, a top view thereof is FIG. 24A and a partially enlarged top view thereof is FIG. 24B. The region enclosed by a dotted line in FIG. 24B is a thin film transistor of one stage with L/W=3 μm/50 μm and Lov=1.5 μm. In order to measure initial characteristics of the thin film transistor, the changing characteristics of the source-drain current (hereinafter referred to as a drain current or Id), i.e., Vg–Id characteristics, were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 23 shows Vg in the range of from −20 V to +5 V.

As shown in FIG. 23, the thin film transistor having a channel width W of 10000 μm has an off-state current of $1\times10^{-13}$ A or less at Vd of 1 V and 10 V, which is less than or equal to the resolution (100 fA) of a measurement device (a semiconductor parameter analyzer, Agilent 4156C manufactured by Agilent Technologies Inc.).

A method for manufacturing the thin film transistor used for the measurement is described.

First, a silicon nitride layer was formed as a base layer over a glass substrate by a CVD method, and a silicon oxynitride layer was formed over the silicon nitride layer. A tungsten layer was formed as a gate electrode layer over the silicon oxynitride layer by a sputtering method. In this embodiment, the tungsten layer was selectively etched into the gate electrode layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based oxide semiconductor target (at a molar ratio of $In_2O_3$:$Ga_2O_3$:ZnO=1:1:2). Here, the oxide semiconductor layer was selectively etched into an island-shaped oxide semiconductor layer.

Then, first heat treatment was performed on the oxide semiconductor layer in a nitrogen atmosphere in a clean oven at 450° C. for 1 hour.

Then, a titanium layer (having a thickness of 150 nm) was formed as a source electrode layer and a drain electrode layer over the oxide semiconductor layer by a sputtering method. Here, the source electrode layer and the drain electrode layer were selectively etched such that 200 thin film transistors each having a channel length L of 3 μm and a channel width W of 50 μm were connected in parallel to obtain a thin film transistor with L/W=3 μm/10000 μm.

Next, a silicon oxide layer having a thickness of 300 nm was formed as a protective insulating layer in contact with the oxide semiconductor layer by a reactive sputtering method. Here, the silicon oxide layer which is a protective layer was selectively etched to form opening portions over the gate electrode layer, the source electrode layer, and the drain electrode layer. After that, second heat treatment was performed in a nitrogen atmosphere at 250° C. for 1 hour.

Then, heat treatment was performed at 150° C. for 10 hours before the measurement of Vg–Id characteristics.

Through the above process, a bottom-gate thin film transistor was manufactured.

The reason why the thin film transistor has an off-state current of about $1\times10^{-13}$ A as shown in FIG. 23 is that the concentration of hydrogen in the oxide semiconductor layer could be sufficiently reduced in the above manufacturing process. The concentration of hydrogen in the oxide semiconductor layer is $1\times10^{16}$/cm$^3$ or less. Note that the concentration of hydrogen in the oxide semiconductor layer was measured by secondary ion mass spectrometry (SIMS).

Although the example of using an In—Ga—Zn—O-based oxide semiconductor is described, this embodiment is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. As an oxide semiconductor material, an In—Al—Zn—O-based oxide semiconductor mixed with AlO$_x$ of 2.5 wt % to 10 wt % or an In—Zn—O-based oxide semiconductor mixed with SiO$_x$ of 2.5 wt % to 10 wt % can be used.

The carrier concentration of the oxide semiconductor layer which is measured by a carrier measurement device is less than $1\times10^{14}$/cm$^3$, preferably $1\times10^{12}$/cm$^3$ or less. In other words, the carrier concentration of the oxide semiconductor layer can be made as close to zero as possible.

The thin film transistor can also have a channel length L of greater than or equal to 10 nm and less than or equal to 1000 nm, which enables an increase in circuit operation speed, and the off-state current is extremely small, which enables a further reduction in power consumption.

In addition, in circuit design, the oxide semiconductor layer can be regarded as an insulator when the thin film transistor is in an off state.

After that, the temperature characteristics of off-state current of the thin film transistor manufactured in this embodiment were evaluated. Temperature characteristics are important in considering the environmental resistance, maintenance of performance, or the like of an end product in which the thin film transistor is used. It is to be understood that a smaller amount of change is more preferable, which increases the degree of freedom for product designing.

For the temperature characteristics, the Vg–Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 25A:
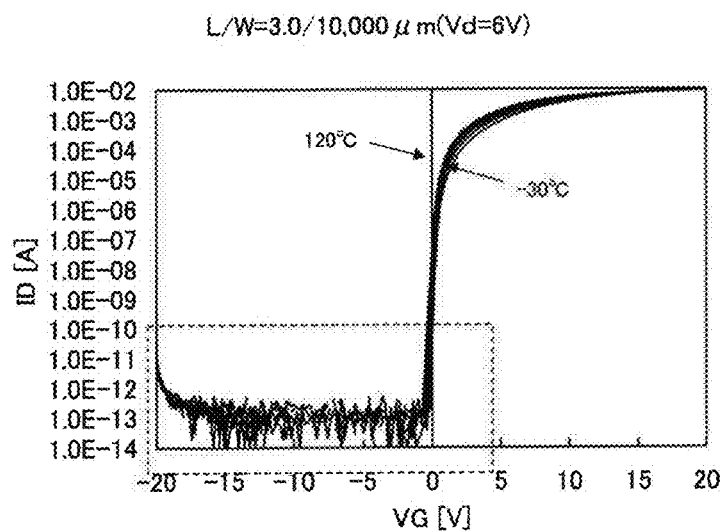
FIGS. 25A and 25B are graphs for describing Embodiment 14.
Figure 25B:
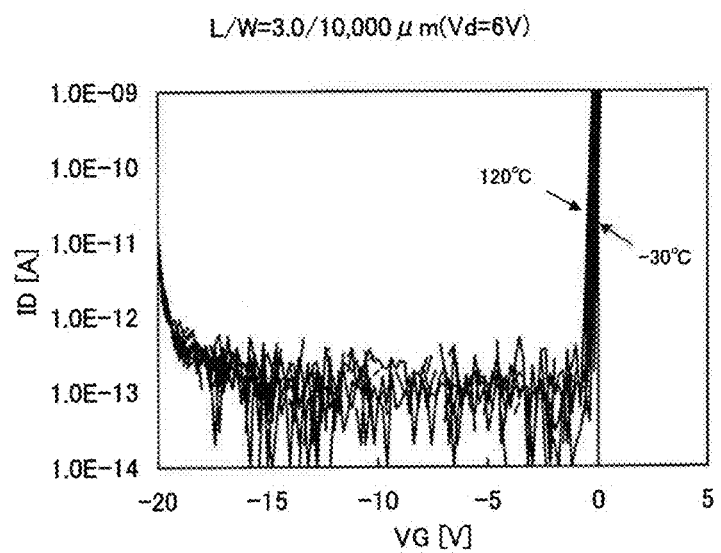

FIG. 25A shows Vg–Id characteristics measured at the above temperatures and superimposed on one another, and FIG. 25B shows an enlarged view of a range of off-state current enclosed by a dotted line in FIG. 25A. The rightmost curve indicated by an arrow in the diagram is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 25B, the off-state currents are less than or equal to $1 \times 10^{-12}$ A, which is near the resolution of the measurement device, at all temperatures except in the vicinity of a gate voltage of −20 V, and the temperature dependence thereof is not observed. In other words, even at a high temperature of 120° C., the off-state current is kept less than or equal to $1 \times 10^{-12}$ A, and given that the channel width W is 10000 μm, it can be seen that the off-state current is significantly small.

A thin film transistor including a purified oxide semiconductor (purified OS) as described above shows almost no dependence of off-state current on temperature. It can be said that an oxide semiconductor does not show temperature dependence when purified because the conductivity type becomes extremely close to an intrinsic type and the Fermi level is located in the middle of the forbidden band, as illustrated in the band diagram of FIG. 19. This also results from the fact that the oxide semiconductor has an energy gap of 3 eV or more and includes very few thermally excited carriers. In addition, the source region and the drain region are in a degenerated state, which is also a factor for showing no temperature dependence. The thin film transistor is mainly operated with carriers which are injected from the degenerated source region to the oxide semiconductor, and the above characteristics (independence of off-state current on temperature) can be explained by independence of carrier concentration on temperature.

In the case where a display device is manufactured using such a thin film transistor the off-state current of which is extremely small, the leakage current is reduced, so that a period for holding display data can be extended.

Example 1

In Example 1, the results of evaluation of image signal holding characteristics of the liquid crystal display device, which is described in the above embodiment, shown in FIG. 1, and actually manufactured, at the time of displaying a still image will be described.

Figure 27:
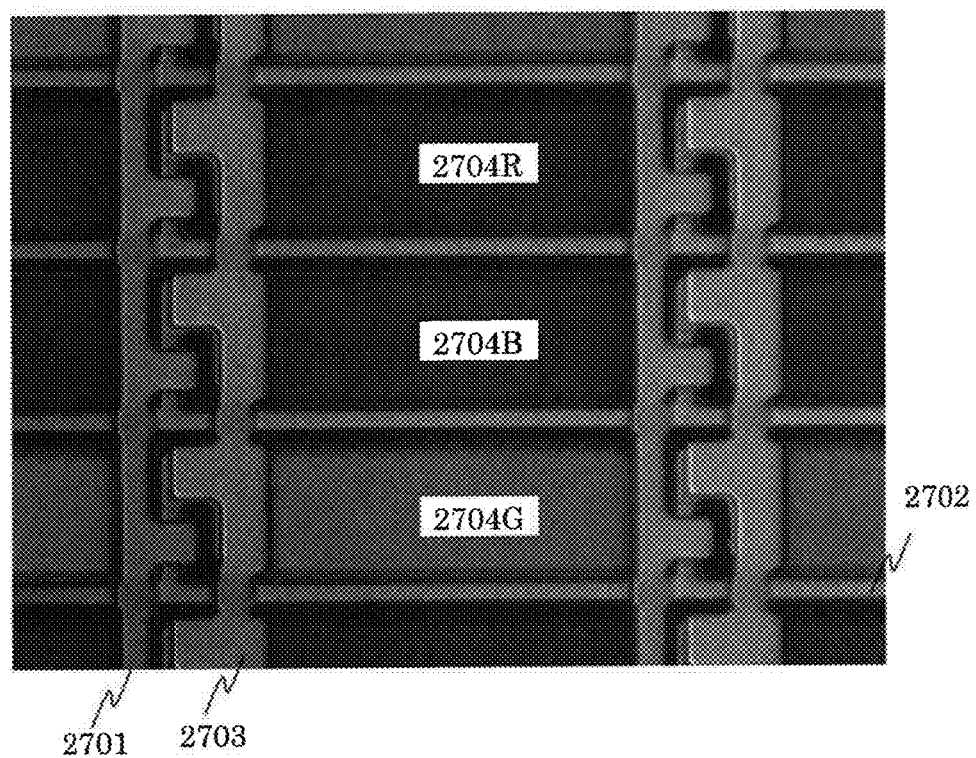
FIG. 27 is a photograph for describing Example 1.

First, regarding an upper-side layout diagram of a plurality of pixels included in a pixel portion, a photograph of elements such as thin film transistors formed over a substrate, which is taken from the rear side, is shown in FIG. 27.

From the photograph of the pixels shown in FIG. 27, it can be seen that rectangular pixels are provided and gate lines 2701 and signal lines 2702 are provided at right angles to each other. It can also be seen that capacitor lines 2703 are provided in a position parallel with the gate lines 2701. In a region where the gate line 2701 and the capacitor line 2703, and the signal line 2702 overlap each other, an insulating film is provided in order to reduce parasitic capacitance, and can be observed as a bump in FIG. 27. The liquid crystal display device described in this example is a reflective liquid crystal display device, and a red (R) color filter 2704R, a green (G) color filter 2704G, and a blue (B) color filter 2704B are observed. In FIG. 27, in a region controlled by the gate line 2701, an In—Ga—Zn—O-based non-single-crystal film which is an oxide semiconductor is provided as a light-transmitting semiconductor layer, and a thin film transistor is formed.

Figure 28:
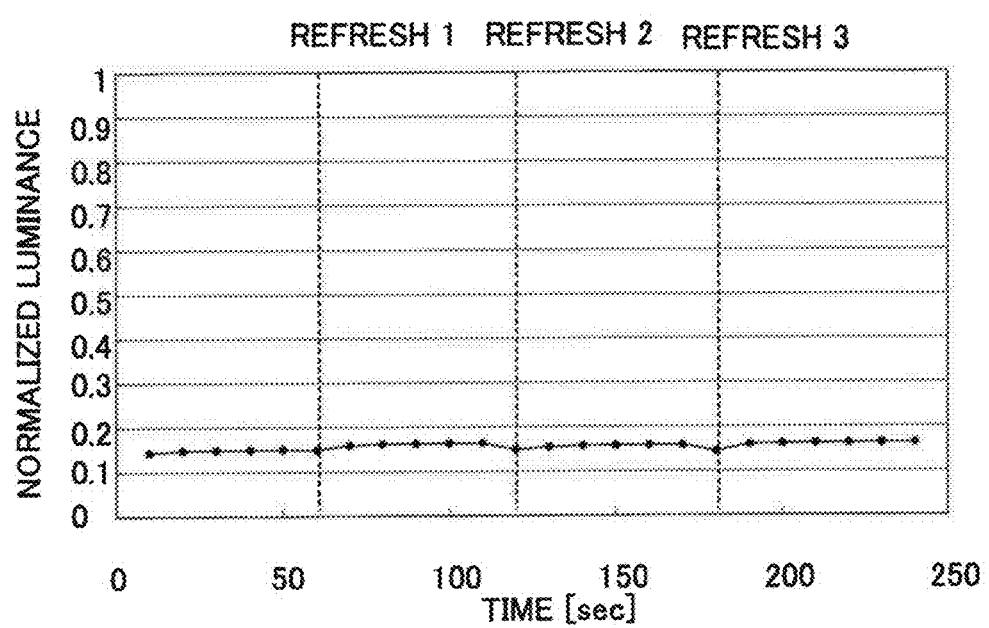
FIG. 28 is a graph for describing Example 1.

FIG. 28 shows a graph of changes in luminance over time, of each pixel shown in FIG. 27 at the time of displaying a still image according to the above embodiment.

It can be seen from FIG. 28 that in the case of the upper-side layout of the pixel of FIG. 27, the image signal holding period is about 1 minute long. Therefore, at the time of displaying a still image, a constant luminance may be maintained by performing the operation to regularly supply the same image signal (in the diagram, "refresh"). As a result, the length of time to apply a voltage to a transistor included in a driver circuit portion can be drastically shortened. Furthermore, deterioration of a driver circuit over time can be drastically slowed down, which produces advantageous effects such as an improvement in reliability of a liquid crystal display device.

Example 2

In Example 2, the results of evaluation of image signal holding characteristics of the liquid crystal display device, which is described in the above embodiment, shown in FIG. 1, and actually manufactured to have a structure which is different from Example 1, at the time of displaying a still image will be described.

Figure 29:
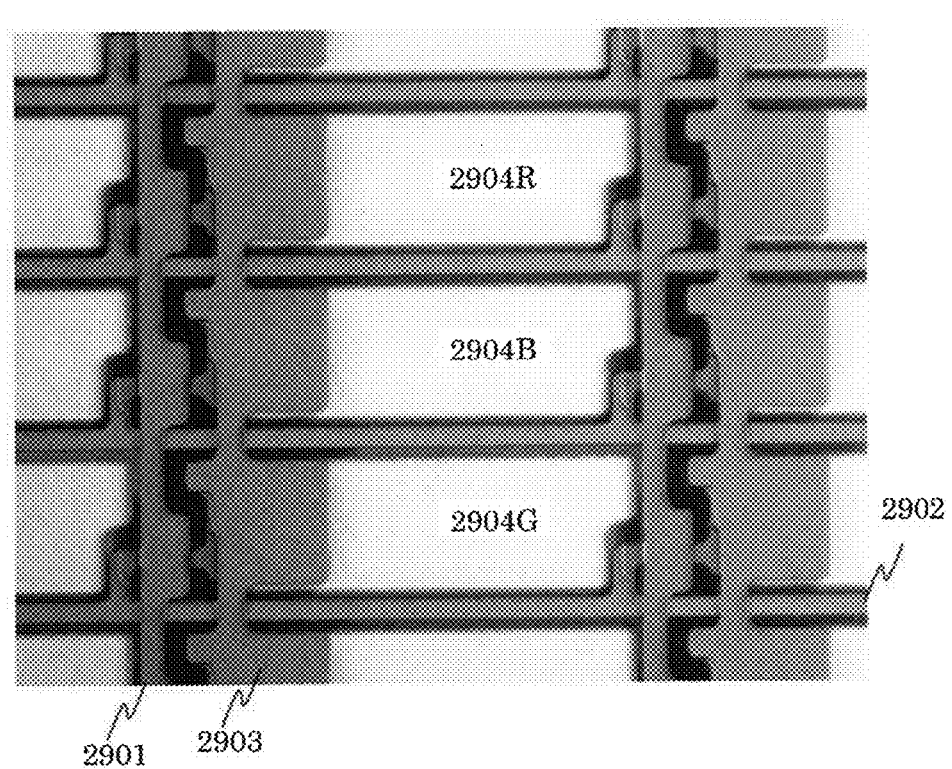
FIG. 29 is a photograph for describing Example 2.

First, regarding an upper-side layout diagram of a plurality of pixels included in a pixel portion, a photograph of elements such as thin film transistors formed over a substrate, which is taken from the rear side, is shown in FIG. 29.

From the photograph of the pixels shown in FIG. 29, it can be seen that rectangular pixels are provided and gate lines 2901 and signal lines 2902 are provided at right angles to each other. It can also be seen that capacitor lines 2903 are provided in a position parallel with the gate lines 2901. In a region where the gate line 2901 and the capacitor line 2903, and the signal line 2902 overlap each other, an insulating film is provided in order to reduce parasitic capacitance, and can be observed as a bump in FIG. 29. The liquid crystal display device described in this example is a reflective liquid crystal display device, and a reflective electrode 2904R overlapping a red (R) color filter, a reflective electrode 2904G overlapping a green (G) color filter, and a reflective electrode 2904B overlapping a blue (B) color filter are observed. In FIG. 29, in a region controlled by the gate line 2901, an In—Ga—Zn—O-based non-single-crystal film which is an oxide semiconductor is provided as a light-transmitting semiconductor layer, and a thin film transistor is formed.

Figure 30:
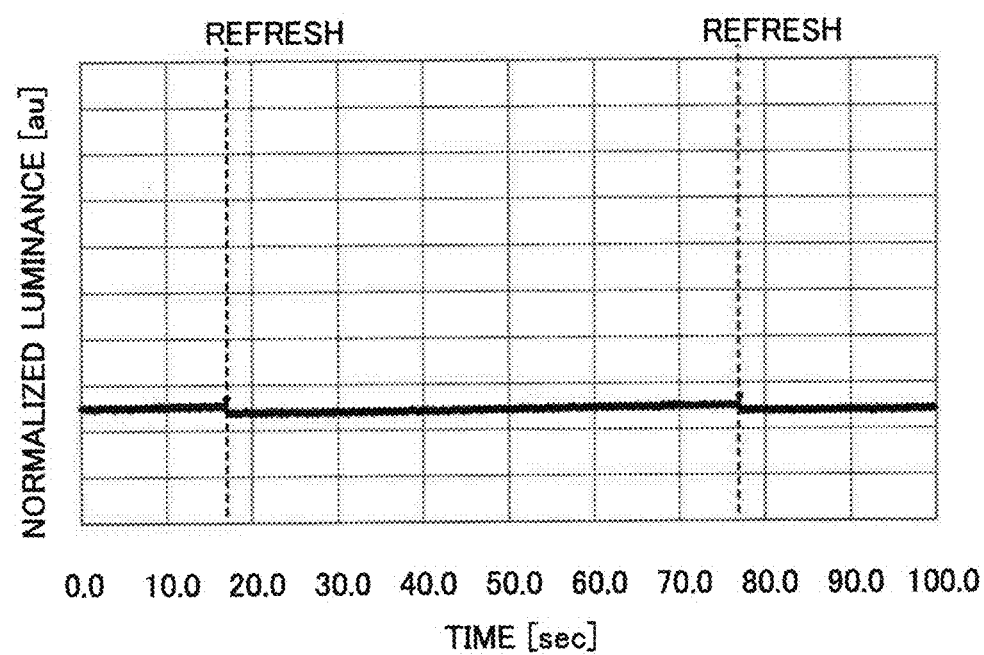
FIG. 30 is a graph for describing Example 2.

FIG. 30 shows a graph of changes in luminance over time, of each pixel shown in FIG. 29 at the time of displaying a still image according to the above embodiment.

It can be seen from FIG. 30 that in the case of the upper-side layout of the pixel of FIG. 29, the image signal holding period is about 1 minute long. Therefore, at the time of displaying a still image, a constant luminance may be maintained by performing the operation to regularly supply the same image signal (in the diagram, "refresh"). As a result, the length of time to apply a voltage to a transistor included in a driver circuit portion can be drastically shortened. Furthermore, deterioration of a driver circuit over time can be drastically slowed down, which produces advantageous effects such as an improvement in reliability of a liquid crystal display device.

Example 3

In Example 3, the results of evaluation of image signal holding characteristics of the liquid crystal display device, which is described in the above embodiment, shown in FIG. 1, and actually manufactured to have a structure which is different from Examples 1 and 2, at the time of displaying a still image will be described.

Figure 31:
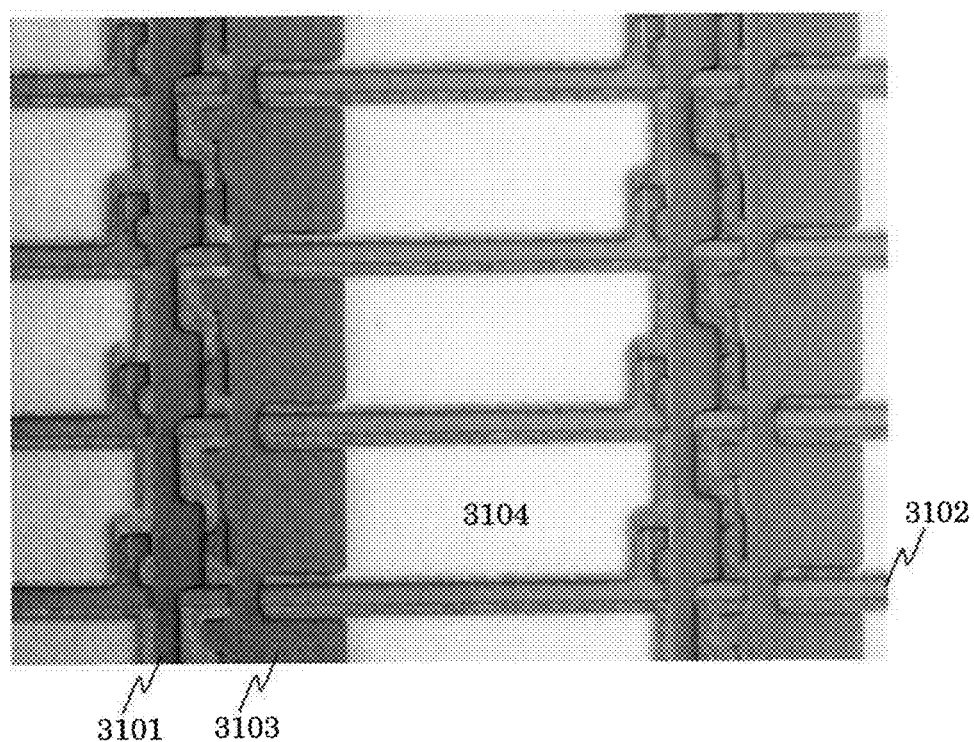
FIG. 31 is a photograph for describing Example 3.

First, regarding an upper-side layout diagram of a plurality of pixels included in a pixel portion, a photograph of elements such as thin film transistors formed over a substrate, which is taken from the rear side, is shown in FIG. 31.

From the photograph of the pixels shown in FIG. 31, it can be seen that rectangular pixels are provided and gate lines 3101 and signal lines 3102 are provided at right angles to each other. It can also be seen that capacitor lines 3103 are provided in a position parallel with the gate lines 3101. In a region where the gate line 3101 and the capacitor line 3103, and the signal line 3102 overlap each other, an insulating film is provided in order to reduce parasitic capacitance, and can be observed as a bump in FIG. 31. The liquid crystal display device described in this example is a liquid crystal display device using a polymer dispersed liquid crystal, and a reflective electrode 3104 is observed. In FIG. 31, in a region controlled by the gate line 3101, an In—Ga—Zn—O-based non-single-crystal film which is an oxide semiconductor is provided as a light-transmitting semiconductor layer, and a thin film transistor is formed.

Figure 32:
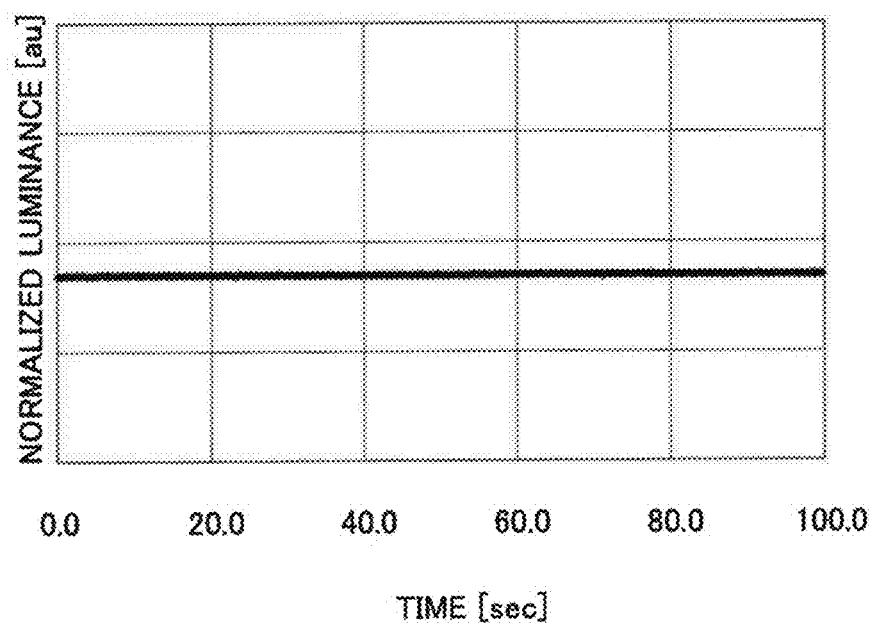
FIG. 32 is a graph for describing Example 3.

FIG. 32 shows a graph of changes in luminance over time, of each pixel shown in FIG. 31 at the time of displaying a still image according to the above embodiment.

It can be seen from FIG. 32 that in the case of the upper-side layout of the pixel of FIG. 31, the image signal holding period can be longer than that of any of Examples 1 and 2 since the polymer dispersed liquid crystal has a property of holding an image signal. Therefore, at the time of displaying a still image, the interval of operation of supplying the same image signal can be extended. As a result, the length of time to apply a voltage to a transistor included in a driver circuit portion can be drastically shortened. Furthermore, deterioration of a driver circuit over time can be drastically slowed down, which produces advantageous effects such as an improvement in reliability of a liquid crystal display device.

Example 4

In Example 4, the results of evaluation of image signal holding characteristics of the liquid crystal display device, which is described in the above embodiment, shown in FIG. 1, and actually manufactured to have a structure which is different from Examples 1 to 3, at the time of displaying a still image will be described. Particularly in this example, an example which is different from the upper-side layout diagram of a plurality of pixels described in any of Examples 1 to 3 will be described. A photograph of elements such as thin film transistors formed over a substrate, which is taken from the rear side, is shown in FIG. 33.

Figure 33:
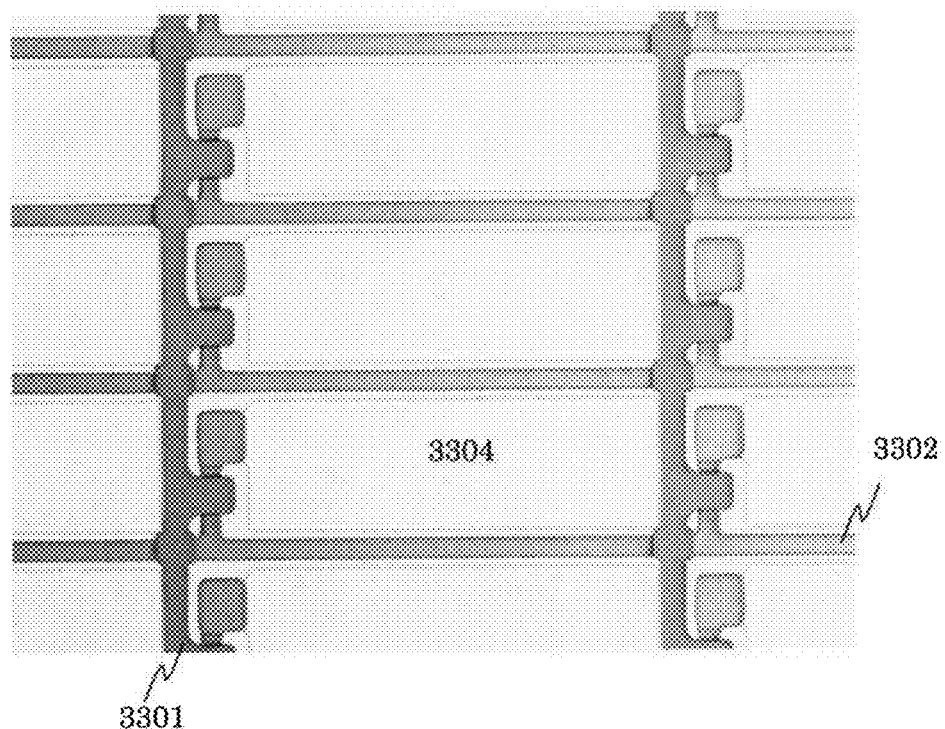
FIG. 33 is a photograph for describing Example 4.

From the photograph of the pixels shown in FIG. 33, it can be seen that rectangular pixels are provided and gate lines 3301 and signal lines 3302 are provided at right angles to each other. Unlike the photograph of the pixels described any of Examples 1 to 3, an upper-side layout diagram in which a capacitor line is omitted I is described. The liquid crystal display device described in this example is a transmissive liquid crystal display device, and a pixel electrode 3304 is observed. In FIG. 33, in a region controlled by the gate line 3301, an In—Ga—Zn—O-based non-single-crystal film which is an oxide semiconductor is provided as a light-transmitting semiconductor layer, and a thin film transistor is formed.

Example 5

In Example 5, an example of operation method of the liquid crystal display device shown in FIG. 1 and described in the above embodiment will be described. The procedure of supplying, or stopping the supply of, a potential to each wiring of the driver circuit portion during the operations to display a still image and a moving image, or the operation to rewrite a voltage to be applied to a liquid crystal element (hereinafter also referred to as refresh operation), in the driver circuit manufactured using a plurality of n-channel transistors, which is given as an example in FIGS. 2A to 2C and FIG. 3, will be described with reference to FIG. 34. Note that FIG. 34 illustrates changes in potentials, before and after a period T1, of a wiring for supplying a high power supply potential (VDD), a wiring for supplying a low power supply potential (VSS), a wiring for supplying a start pulse (SP), and wirings for supplying first to fourth clock signals (CK1 to CK4) to a shift register.

The liquid crystal display device of this embodiment can display a still image without constantly operating the driver circuit portion. Therefore, as illustrated in FIG. 34, there are a period in which control signals such as the high power supply potential (VDD), the first to fourth clock signals (CK1 to CK4), and the start pulse are supplied to a shift register and a period in which control signals are not supplied. Note that the period T1 illustrated in FIG. 34 corresponds to the period in which control signals are supplied, in other words, a period in which a moving image is displayed and a period in which refresh operation is performed. The period T2 illustrated in FIG. 34 corresponds to the period in which control signals are not supplied, in other words, a period in which a still image is displayed.

Figure 34:
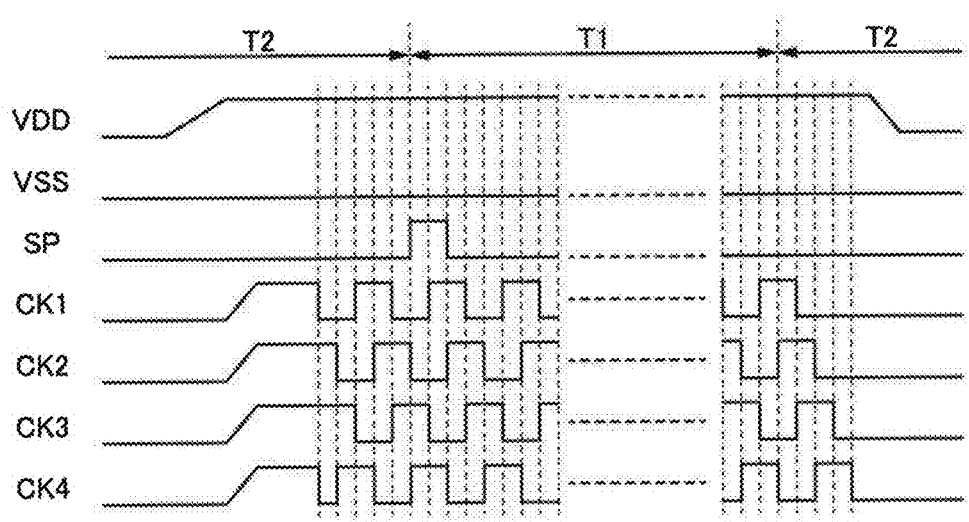
FIG. 34 is a diagram for describing Example 5.

In FIG. 34, a period in which the high power supply potential (VDD) is supplied is provided not only in the period T1 but also in part of the period T2. In addition, in FIG. 34, a period in which the first to fourth clock signals (CK1 to CK4) are supplied is provided between the start of the supply of the high power supply potential (VDD) and the stop of the supply of the high power potential (VDD).

Moreover, as illustrated in FIG. 34, the first to fourth clock signals (CK1 to CK4) may be set so as to start to oscillate at a constant frequency after being set to a high potential once before the period T1 begins and stop oscillating after being set to a low potential after the period T1 ends.

As described above, in the liquid crystal display device of this example, the supply of control signals such as the high power supply potential (VDD), the first to fourth clock signals (CK1 to CK4), and the start pulse to the shift register is stopped in the period T2. Then, in the period in which the supply of control signals is stopped, whether each transistor is turned on or turned off is controlled and the output of a pulse signal from the shift register is also stopped. Therefore, power consumption of the shift register and power consumption of the pixel portion which is driven by the shift register can be reduced.

The aforementioned refresh operation needs to be performed regularly because there is a possibility that the quality of a displayed still image may deteriorate. In the liquid crystal display device of this example, the aforementioned transistor including an oxide semiconductor is employed as a switching element for controlling a voltage to be applied to a liquid crystal element of each pixel. Accordingly, off-state current can be drastically decreased, and a change in voltage to be applied to the liquid crystal element of each pixel can be reduced. In other words, even when the period in which the operation of the shift register is stopped is long due to display of a still image, the deterioration of image quality can be suppressed. For example, even when the period is 3 minutes long, the quality of a displayed still image can be maintained. For example, if a liquid crystal display device in which rewrite is performed 60 times per second and a liquid crystal display device in which refresh operation is performed once in 3 minutes are compared with each other, power consumption can be reduced to about $1/10000$.

Note that the stop of the supply of the high power supply potential (VDD) is to set a potential equal to the low power supply potential (VSS) as illustrated in FIG. 34. In addition, the stop of the supply of the high power supply potential (VDD) may be to set the potential of a wiring, to which the high power supply potential is supplied, in a floating state.

Note that when the potential of the wiring to which the high power supply potential (VDD) is supplied is increased, which means that the potential is increased from the low power supply potential (VSS) to the high power supply potential (VDD) before the period Ti, it is preferable that the potential of the wiring is controlled so as to change gradually. If the gradient of the change in potential of the wiring is steep, there is a possibility that the change in potential may become noise and an fault pulse may be output from the shift register. In the case where the shift register is included in a gate line driver circuit, the fault pulse serves as a signal for turning on a transistor. Thus, there is a possibility that a voltage to be applied to a liquid crystal element may be changed by the fault pulse and the quality of a still image may be changed. Therefore, it is preferable to control the change in potential of the wiring as described above. In view of the above content, FIG. 34 illustrates an example in which a rise in signal to the high power supply potential (VDD) is more gradual than a fall. In particular, in the liquid crystal display device of this embodiment, when a still image is displayed in the pixel portion, the stop of the supply, and the resupply, of the high power supply potential (VDD) to the shift register are performed as appropriate. In other words, in the case where a change in potential of the wiring for supplying the high power supply potential (VDD) adversely affects the pixel portion as noise, the noise directly leads to deterioration of a display image. Therefore, it is important to control the liquid crystal display device of this embodiment so as to prevent a change in potential (particularly, an increase in potential) of the wiring from entering the pixel portion as noise.

This application is based on Japanese Patent Application serial no. 2009-238916, 2009-273913, and 2009-278999 filed with Japan Patent Office on Oct. 16, 2009, Dec. 1, 2009, and Dec. 8, 2009, respectively, the entire contents of which are hereby incorporated by reference.

EXPLANATION OF REFERENCE

1000: liquid crystal display device; 1001: display panel; 1002: signal generation circuit; 1003: memory circuit; 1004: comparison portion; 1005: selection circuit; 1006: display control circuit; 1007: driver circuit portion; 1008: pixel portion; 1010: frame memory; 1009A: gate line driver circuit; 1009B: signal line driver circuit

What is claimed is:

1. A liquid crystal display device comprising:
a pixel portion comprising a transistor and a liquid crystal element; and
a driver circuit portion electrically connected to the pixel portion,
wherein a channel formation region of the transistor comprises an oxide semiconductor layer,
wherein an off-state current per micrometer of a channel width of the transistor is $1 \times 10^{-16}$ A/μm or lower at a drain voltage of 6V and a gate voltage of −5V or −10V, and
wherein supply of a control signal to the driver circuit portion is stopped when a still image is displayed on the pixel portion.

2. The liquid crystal display device according to claim 1, wherein the oxide semiconductor layer comprises indium, gallium, and zinc.

3. The liquid crystal display device according to claim 1, wherein the oxide semiconductor layer comprises a crystal.

4. The liquid crystal display device according to claim 1, wherein the oxide semiconductor layer has a hydrogen concentration of $1 \times 10^{16}/cm^3$ or less which is detected by secondary ion mass spectrometry.

5. The liquid crystal display device according to claim 1, wherein the oxide semiconductor layer has a carrier density which is less than $1 \times 10^{14}/cm^3$.

6. The liquid crystal display device according to claim 1, wherein an off-state resistivity of the transistor is $1 \times 10^9$ Ωm or more.

7. The liquid crystal display device according to claim 1, wherein the control signal is a high power supply potential, a low power supply potential, a clock signal, a start pulse signal, or a reset signal.

8. An electronic apparatus comprising the liquid crystal display device according to claim 1.

* * * * *